(12) United States Patent
Kikuchi

(10) Patent No.: US 9,496,311 B2
(45) Date of Patent: Nov. 15, 2016

(54) SOLID-STATE IMAGING DEVICE, METHOD OF MANUFACTURING THE SAME, AND ELECTRONIC APPARATUS

(71) Applicant: Sony Corporation, Tokyo (JP)

(72) Inventor: Yoshiaki Kikuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/524,540

(22) Filed: Oct. 27, 2014

(65) Prior Publication Data

US 2015/0123179 A1    May 7, 2015

(30) Foreign Application Priority Data

Nov. 1, 2013 (JP) ................... 2013-228355

(51) Int. Cl.
*H01L 21/00* (2006.01)
*H01L 27/146* (2006.01)
*H01L 29/423* (2006.01)

(52) U.S. Cl.
CPC ..... *H01L 27/14687* (2013.01); *H01L 27/1464* (2013.01); *H01L 27/14603* (2013.01); *H01L 27/14609* (2013.01); *H01L 27/14612* (2013.01); *H01L 27/14614* (2013.01); *H01L 27/14616* (2013.01); *H01L 27/14623* (2013.01); *H01L 27/14638* (2013.01); *H01L 27/14641* (2013.01); *H01L 27/14689* (2013.01); *H01L 29/42392* (2013.01)

(58) Field of Classification Search
None
See application file for complete search history.

(56) References Cited

U.S. PATENT DOCUMENTS

2009/0190016 A1* 7/2009 Iida .............................. 348/308
2010/0213539 A1* 8/2010 Masuoka et al. ............. 257/329
2012/0241895 A1* 9/2012 Kurogi .......................... 257/437

FOREIGN PATENT DOCUMENTS

JP    2006-024787 A    1/2006

OTHER PUBLICATIONS

Takato et al., "Impact of Surrounding Gate Transistor (SGT) for Ultra-High-Density LSI's", Mar. 1991, Transactions on Electron Devices, vol. 38, No. 3, pp. 573-578.*
S. Venugopalan, Y. S. Chauhan, D. D. Lu, M. A. Karim, A. M. Niknejad and C. Hu, "Modeling intrinsic and extrinsic asymmetry of 3D cylindrical gate/gate-all-around FETs for circuit simulations," Non-Volatile Memory Technology Symposium (NVMTS), 2011 11th Annual, Shanghai, 2011, pp. 1-4.*

* cited by examiner

*Primary Examiner* — Reema Patel
(74) *Attorney, Agent, or Firm* — Sheridan Ross P.C.

(57) ABSTRACT

A solid-state imaging device includes two-dimensionally arranged pixels, and each pixel includes a photoelectric conversion element configured to generate charges according to a light amount of incident light and accumulate the charges therein; and at least one of an amplification transistor configured to amplify a voltage corresponding to the charges accumulated in the photoelectric conversion element, a readout transistor configured to read a signal of the voltage amplified by the amplification transistor, and a reset transistor configured to reset the charges accumulated in the photoelectric conversion element, a channel region of each transistor being formed in a direction perpendicular to a substrate.

19 Claims, 71 Drawing Sheets

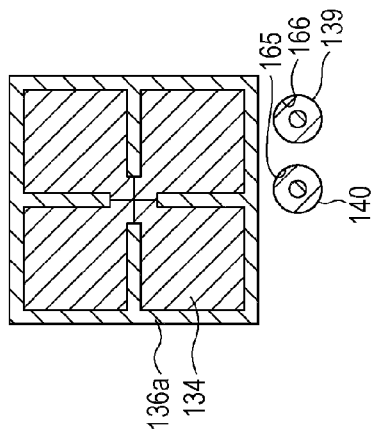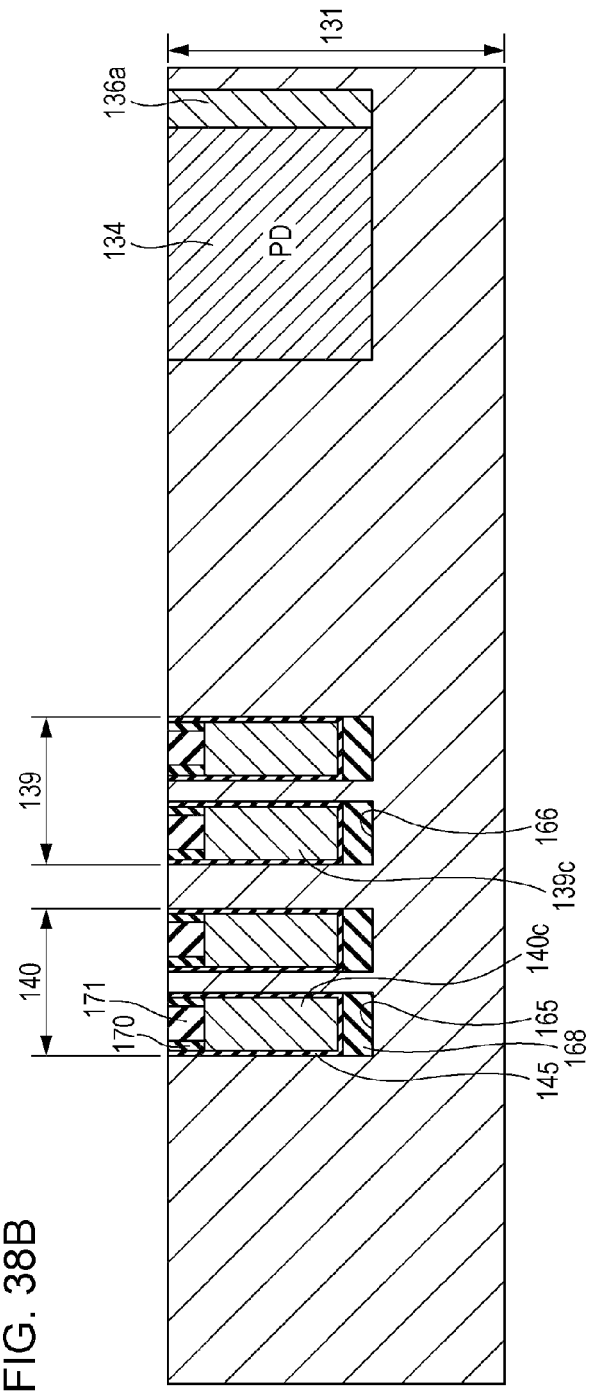
FIG. 38A
FIG. 38B

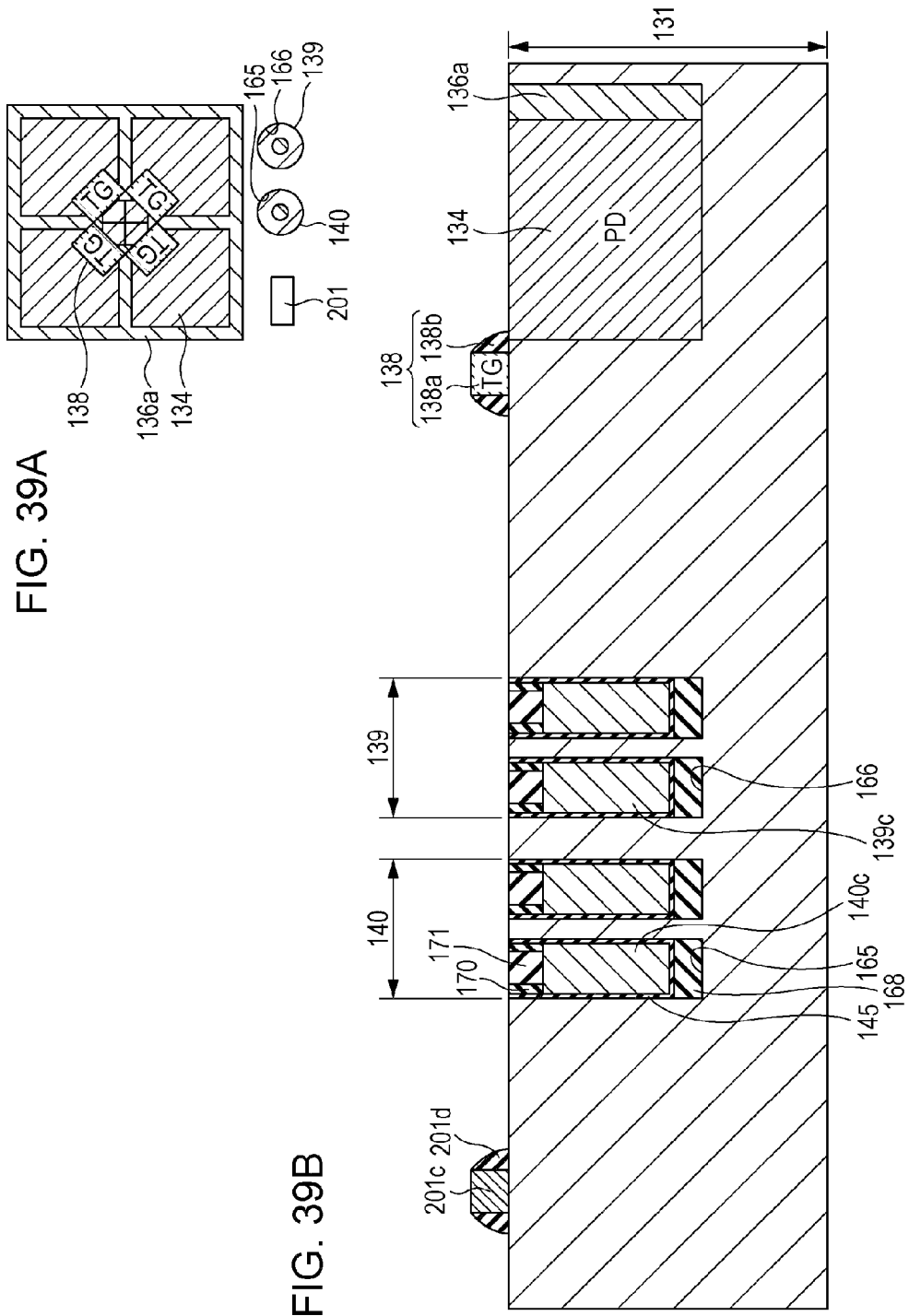

SOLID-STATE IMAGING DEVICE, METHOD OF MANUFACTURING THE SAME, AND ELECTRONIC APPARATUS

CROSS REFERENCE TO RELATED APPLICATIONS

This application claims the benefit of Japanese Priority Patent Application JP 2013-228355 filed on Nov. 1, 2013, the entire contents of which are incorporated herein by reference.

BACKGROUND

The present disclosure relates to a solid-state imaging device, a method of manufacturing the same, and an electronic apparatus, and more particularly, to a solid-state imaging device, a method of manufacturing the same, and an electronic apparatus capable of reducing noise by increasing an area of a channel region in at least one of an amplification transistor, a readout transistor, and a reset transistor of a pixel.

In recent years, with the miniaturization of a solid-state imaging device, a random telegraph signal (RTS) noise in an amplification transistor has formed a blinking point and has deteriorated pixel characteristics.

A method of applying a fully depleted metal-oxide-semiconductor field-effect transistor (MOSFET) with no impurities in a channel region to an amplification transistor has been proposed as an example of a method of reducing an RTS noise of an amplification transistor (for example, see Japanese Unexamined Patent Application Publication No. 2006-24787).

However, in the method described in Japanese Unexamined Patent Application Publication No. 2006-24787, a manufacturing cost increases since a silicon on insulator (SOI) substrate is used. Further, it is necessary to perform control of film thickness which is difficult.

SUMMARY

Therefore, it is desired to reduce noise by increasing an area of a channel region in a transistor of a pixel, such as an amplification transistor, a readout transistor, and a reset transistor.

It is desirable to reduce a noise by increasing an area of a channel region in at least one of an amplification transistor, a readout transistor, and a reset transistor of a pixel.

According to a first embodiment of the present disclosure, there is provided a solid-state imaging device including two-dimensionally arranged pixels, each pixel including: a photoelectric conversion element configured to generate charge according to a light amount of incident light and accumulate the charges therein; and at least one of an amplification transistor configured to amplify a voltage corresponding to the charges accumulated in the photoelectric conversion element, a readout transistor configured to read a signal of the voltage amplified by the amplification transistor, and a reset transistor configured to reset the charges accumulated in the photoelectric conversion element, a channel region of each transistor being formed in a direction perpendicular to a substrate.

In the first embodiment of the present disclosure, the two-dimensionally arranged pixels each including a photoelectric conversion element configured to generate charges according to a light amount of incident light and accumulate the charges therein; and at least one of an amplification transistor configured to amplify a voltage corresponding to the charges accumulated in the photoelectric conversion element, a readout transistor configured to read a signal of the voltage amplified by the amplification transistor, and a reset transistor configured to reset the charges accumulated in the photoelectric conversion element, a channel region of each transistor being formed in a direction perpendicular to a substrate are included.

According to a second embodiment of the present disclosure, there is provided a method of manufacturing a solid-state imaging device, the method including forming two-dimensionally arranged pixels, each pixel including: a photoelectric conversion element configured to generate charges according to a light amount of incident light and accumulate the charges therein; and at least one of an amplification transistor configured to amplify a voltage corresponding to the charges accumulated in the photoelectric conversion element, a readout transistor configured to read a signal of the voltage amplified by the amplification transistor, and a reset transistor configured to reset the charges accumulated in the photoelectric conversion element, a channel region of each transistor being formed in a direction perpendicular to a substrate.

In the second embodiment of the present disclosure, the two-dimensionally arranged pixels each including a photoelectric conversion element configured to generate charges according to a light amount of incident light and accumulate the charges therein; and at least one of an amplification transistor configured to amplify a voltage corresponding to the charges accumulated in the photoelectric conversion element, a readout transistor configured to read a signal of the voltage amplified by the amplification transistor, and a reset transistor configured to reset the charges accumulated in the photoelectric conversion element, a channel region of each transistor being formed in a direction perpendicular to a substrate are formed.

According to a third embodiment of the present disclosure, there is provided an electronic apparatus including two-dimensionally arranged pixels, each pixel includes: a photoelectric conversion element configured to generate charges according to a light amount of incident light and accumulate the charges therein; and at least one of an amplification transistor configured to amplify a voltage corresponding to the charges accumulated in the photoelectric conversion element, a readout transistor configured to read a signal of the voltage amplified by the amplification transistor, and a reset transistor configured to reset the charges accumulated in the photoelectric conversion element, a channel region of each transistor being formed in a direction perpendicular to a substrate.

In the third embodiment of the present disclosure, the two-dimensionally arranged pixels each including a photoelectric conversion element configured to generate charges according to a light amount of incident light and accumulate the charges therein; and at least one of an amplification transistor configured to amplify a voltage corresponding to the charges accumulated in the photoelectric conversion element, a readout transistor configured to read a signal of the voltage amplified by the amplification transistor, and a reset transistor configured to reset the charges accumulated in the photoelectric conversion element, a channel region of each transistor being formed in a direction perpendicular to a substrate are included.

According to the first to third embodiments of the present disclosure, it is possible to reduce a noise in the transistors of the pixel. According to the first to third embodiments of the present disclosure, it is also possible to reduce noise by increasing the area of the channel region in at least one of the amplification transistor, the readout transistor, and the reset transistor of the pixel.

Further, the effects described herein are not necessarily limited and may be any effects described in the present disclosure.

BRIEF DESCRIPTION OF THE DRAWINGS

FIGS. 38A and 38B are diagrams illustrating a method of manufacturing the pixel of FIG. 28;

FIGS. 39A and 39B are diagrams illustrating a method of manufacturing the pixel of FIG. 28;

DETAILED DESCRIPTION OF EMBODIMENTS

First Embodiment

Figure 1:
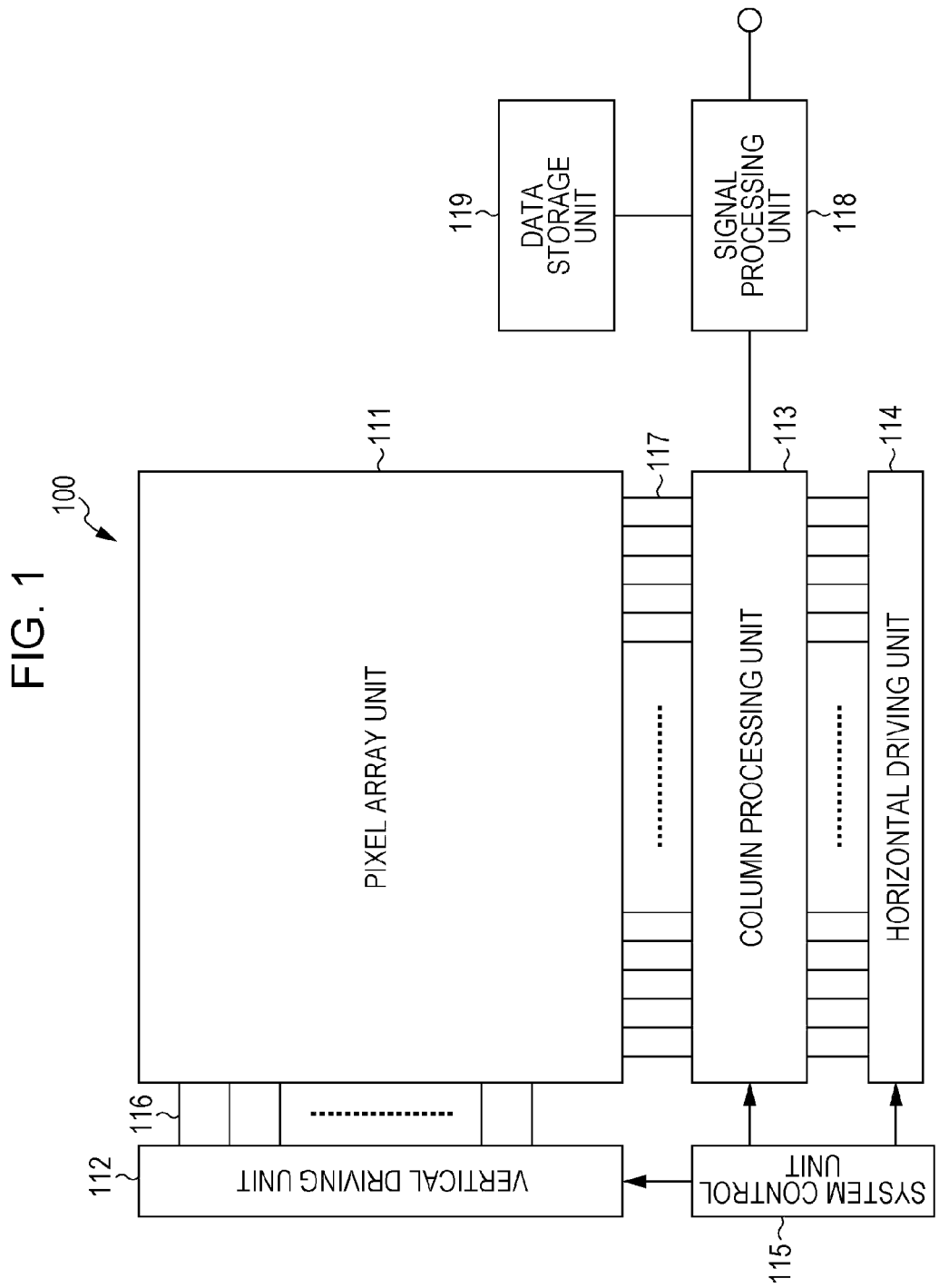
FIG. 1 is a block diagram illustrating an example of a configuration of a CMOS image sensor according to a first embodiment as a solid-state imaging device to which the present disclosure is applied.

Example of Configuration of Solid-State Imaging Device According to First Embodiment FIG. 1 is a block diagram illustrating an example of a configuration of a complementary metal-oxide semiconductor (CMOS) image sensor according to a first embodiment as a solid-state imaging device to which the present disclosure is applied.

The CMOS image sensor 100 includes a pixel array unit 111, a vertical driving unit 112, a column processing unit 113, a horizontal driving unit 114, a system control unit 115, a pixel driving line 116, a vertical signal line 117, a signal processing unit 118, and a data storage unit 119.

The pixel array unit 111, the vertical driving unit 112, the column processing unit 113, the horizontal driving unit 114, the system control unit 115, the pixel driving line 116, the vertical signal line 117, the signal processing unit 118, and the data storage unit 119 are formed in a silicon substrate (chip) (not illustrated).

Further, the CMOS image sensor 100 may not include the signal processing unit 118 and the data storage unit 119. The signal processing unit 118 and data storage unit 119, for example, may be provided as an external signal processing unit such as a digital signal processor (DSP) on a substrate different from the substrate for the CMOS image sensor 100.

The CMOS image sensor 100 captures an image of a subject and outputs a pixel signal of each pixel of the image.

Specifically, pixels each including a photoelectric conversion element that generates an amount of charges according to a light amount of incident light and accumulates the charges therein are arranged two-dimensionally in a matrix form in the pixel array unit 111.

Further, in the pixel array unit 111, the pixel driving line 116 is formed in a horizontal direction (row direction) of FIG. 1 in each row for pixels in the matrix form, and the vertical signal line 117 is formed in a vertical direction (column direction) of FIG. 1 in each column. One end of the pixel driving line 116 is connected to an output terminal (not illustrated) corresponding to each row of the vertical driving unit 112.

The vertical driving unit 112 is a pixel driving unit that includes, for example, a shift register or an address decoder and drives each pixel of the pixel array unit 111, for example, in units of rows. While illustration of a specific configuration of this vertical driving unit 112 is omitted, the vertical driving unit 112 has a configuration in which two scanning systems of a readout scanning system and a sweep scanning system are included.

The readout scanning system sequentially selects the respective rows to sequentially read pixel signals from the respective pixels in units of rows, and outputs, for example, a selection pulse from the output terminal connected to the pixel driving line 116 of the selected row.

The sweep scanning system outputs a control pulse from the output terminal connected to the pixel driving line 116 of each row a time of shutter speed earlier than the scanning of the readout scanning system, in order to sweep (reset) unnecessary charges from the photoelectric conversion element. Due to scanning by this sweep scanning system, a so-called electronic shutter operation is performed sequentially in each row. Here, the electronic shutter operation refers to an operation of discarding the charges of the photoelectric conversion element, and newly starting exposure (starting accumulation of charges).

The pixel signal output from each pixel of the row selected by the readout scanning system of the vertical driving unit 112 is supplied to the column processing unit 113 through each of the vertical signal lines 117.

The column processing unit 113 includes a signal processing circuit for each column of the pixel array unit 111. Each signal processing circuit of the column processing unit 113 performs a noise removal process such as a correlated double sampling (CDS) process and signal processing such as an A/D conversion process on the pixel signal output through the vertical signal line 117 from each pixel of the selected row. A fixed pattern noise specific to the pixel, such as a reset noise or a threshold variation of an amplification transistor, is removed through the CDS process. The column processing unit 113 temporarily holds the pixel signal after the signal processing.

The horizontal driving unit 114 includes, for example, a shift register or an address decoder, and sequentially selects the signal processing circuits of the column processing unit 113. The pixel signals subjected to signal processing by the respective signal processing circuits of the column processing unit 113 are sequentially output to the signal processing unit 118 through selection scanning by this horizontal driving unit 114.

The system control unit 115 includes, for example, a timing generator that generates various timing signals, and controls the vertical driving unit 112, the column processing unit 113, and the horizontal driving unit 114 based on the various timing signals generated by the timing generator.

The signal processing unit 118 has at least an addition processing function. The signal processing unit 118 performs various signal processing such as an addition process on the pixel signal output from the column processing unit 113. In this case, the signal processing unit 118 stores a result during signal processing in the data storage unit 119, as necessary, and refers to the result at a necessary timing. The signal processing unit 118 outputs the pixel signal after the signal processing.

Example of Configuration of Pixel

Figure 2:
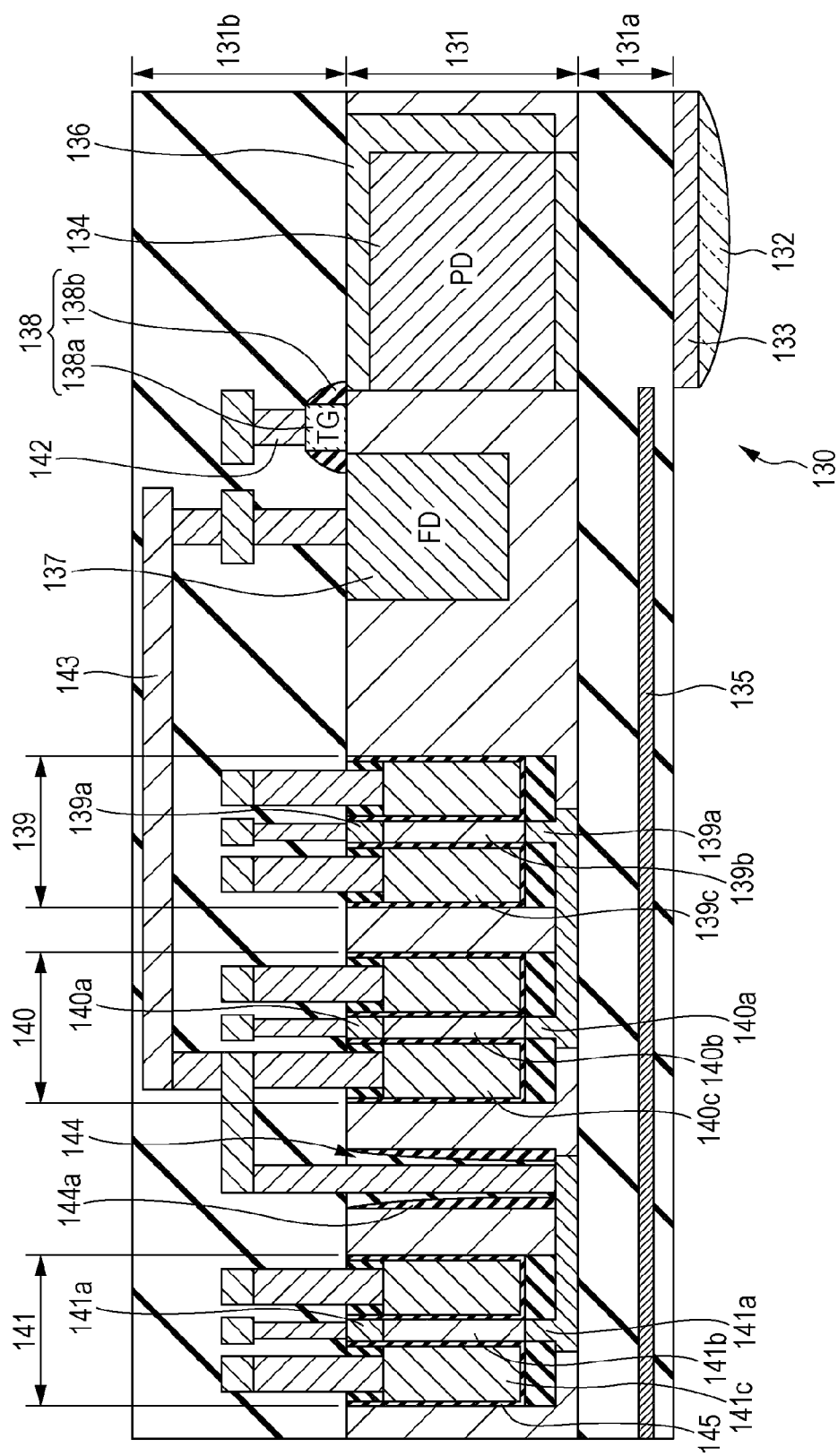
FIG. 2 is a cross-sectional view illustrating an example of a configuration of pixels arranged two-dimensionally in a pixel array unit of FIG. 1.

FIG. 2 is a cross-sectional view illustrating an example of a configuration of pixels arranged two-dimensionally in the pixel array unit 111 of FIG. 1.

The pixel 130 is formed in a silicon substrate 131, as illustrated in FIG. 2. A back surface of the silicon substrate 131 is covered with a $SiO_2$ film 131a, and a surface thereof is covered with a $SiO_2$ film 131b. The CMOS image sensor 100 is an image sensor of a backside illumination type, and an on-chip lens 132 and a color filter 133 are provided sequentially from an outer side on a back surface of the $SiO_2$ film 131a.

The on-chip lens 132 condenses light incident from the back surface of the silicon substrate 131. The condensed light is color-separated through the color filter 133 and is incident on a photodiode 134 within the silicon substrate 131.

A light shielding film 135 is formed in a region that does not correspond to the on-chip lens 132 and the color filter 133 within the $SiO_2$ film 131a. Accordingly, light that does not pass through the on-chip lens 132 and the color filter 133 can be prevented from being incident on the photodiode 134 or the like.

The photodiode (PD) 134 is a photoelectric conversion element which generates an amount of charges according to an amount of the light incident through the color filter 133, and accumulates the charges therein. Hole accumulation diodes (HADs) 136 are formed on the back surface side and the surface side of the photodiode 134 and on the right side of FIG. 2. Thus, it is possible to prevent generation of a dark current.

A charge-voltage conversion unit (FD) 137 is formed on the left side of the photodiode 134 in FIG. 2. A transfer transistor (TG) 138 is formed on the surface of the silicon substrate 131 between the photodiode 134 and the charge-voltage conversion unit 137. The transfer transistor 138 includes a gate electrode 138a and a sidewall 138b. The gate electrode 138a is connected to the pixel driving line 116 of FIG. 1 via a contact plug 142.

When a predetermined pulse is input to the gate electrode 138a via the pixel driving line 116, the transfer transistor 138 transfers the charges accumulated in the photodiode 134 to the charge-voltage conversion unit 137. The charge-voltage conversion unit 137 converts the charges transferred from the photodiode 134 into a voltage.

A readout transistor (SEL) 139, an amplification transistor 140, and a reset transistor 141 are formed in an order of proximity to the charge-voltage conversion unit 137 on the left side of the charge-voltage conversion unit 137 in FIG. 2. The readout transistor 139, the amplification transistor 140 and the reset transistor 141 are fully-depleted vertical MOSFETs.

Specifically, two source and drain regions 139a of the readout transistor 139 are formed on the surface side and the back surface side of the silicon substrate 131. Therefore, a channel region 139b interposed between the two source and drain regions 139a is formed in a direction perpendicular to the silicon substrate 131. A gate electrode 139c is formed to cover the channel region 139b.

Source and drain regions 140a, a channel region 140b and a gate electrode 140c of the amplification transistor 140, and source and drain regions 141a, a channel region 141b and a gate electrode 141c of the reset transistor 141 are formed similarly.

The gate electrode 140c of the amplification transistor 140 is connected to the charge-voltage conversion unit 137 via the contact plug 142 and a wiring 143. A power supply is connected to the source and drain region 140a on the surface side via the contact plug 142. The source and drain region 140a on the back surface side is connected to the source and drain region 139a on the back surface side of the readout transistor 139. The amplification transistor 140 amplifies a signal of the voltage input from the charge-voltage conversion unit 137 to the gate electrode 140c, and inputs the resultant signal as a pixel signal to the source and drain region 139a.

The gate electrode 139c of the readout transistor 139 is connected to the pixel driving line 116 via the contact plug 142. Further, the source and drain region 139a on the surface side is connected to the vertical signal line 117 of FIG. 1 via the contact plug 142. When the selection pulse is input to the gate electrode 139c via the pixel driving line 116 and the contact plug 142, the readout transistor 139 outputs the pixel signal which is input to the source and drain region 139a on the back surface side, to the vertical signal line 117 via the source and drain region 139a on the surface side.

The reset transistor 141 is connected to the charge-voltage conversion unit 137 via the contact plug 142 and the wiring 143.

Specifically, a connection portion 144 is provided between the amplification transistor 140 and the reset transistor 141. Also, the charge-voltage conversion unit 137 is connected to the source and drain region 141a on the back surface side of the reset transistor 141 via the contact plug 142 inserted into the connection portion 144. A SiN film 144a is formed on a sidewall of the connection portion 144. Accordingly, it is possible to prevent conduction between the contact plug 142 and the connection portion 144.

The gate electrode 141c of the reset transistor 141 is connected to the pixel driving line 116 via the contact plug 142. Further, the source and drain region 141a on the surface side is connected to a power supply via the contact plug 142. When the control pulse is input to the gate electrode 141c via the pixel driving line 116 and the contact plug 142, the reset transistor 141 resets the charges of the photodiode 134 via the charge-voltage conversion unit 137.

A gate insulating film 145 is formed on a sidewall of the gate electrodes 139c to 141c.

As described above, in the CMOS image sensor 100, each pixel 130 includes the amplification transistor 140 which is a vertical MOSFET, in which the channel region 140b is formed in the direction perpendicular to the silicon substrate 131. Therefore, it is possible to increase an area of the channel region 140b of the amplification transistor 140 without increasing a footprint. As a result, it is possible to reduce an RTS noise in the amplification transistor 140. Accordingly, it is possible to improve image quality characteristics.

Further, the amplification transistor 140 can be a fully-depleted MOSFET since a length in a horizontal direction of the channel region 140b can be shortened due to the amplification transistor 140 being a vertical MOSFET. Therefore, it is possible to reduce impurities of the channel region 140b and to further reduce the RST noise. It is also possible to reduce junction capacitance. It is also possible to reduce a size of the gate electrode 140c since a short channel effect is suppressed. As a result, it is possible to reduce a power supply voltage. The same effects as those of the amplification transistor 140 are provided even in the readout transistor 139 and the reset transistor 141.

Further, while the photodiode 134, the charge-voltage conversion unit 137, the transfer transistor 138, the readout transistor 139, and the amplification transistor 140, the reset transistor 141, and the connection portion 144 are illustrated on the same cross-section for convenience of description in the present specification, in practice, these do not exist on the same cross-section.

Method of Manufacturing Pixel

FIGS. 3 to 27 are diagrams illustrating a method of manufacturing the pixel 130 of FIG. 2.

Figure 3:
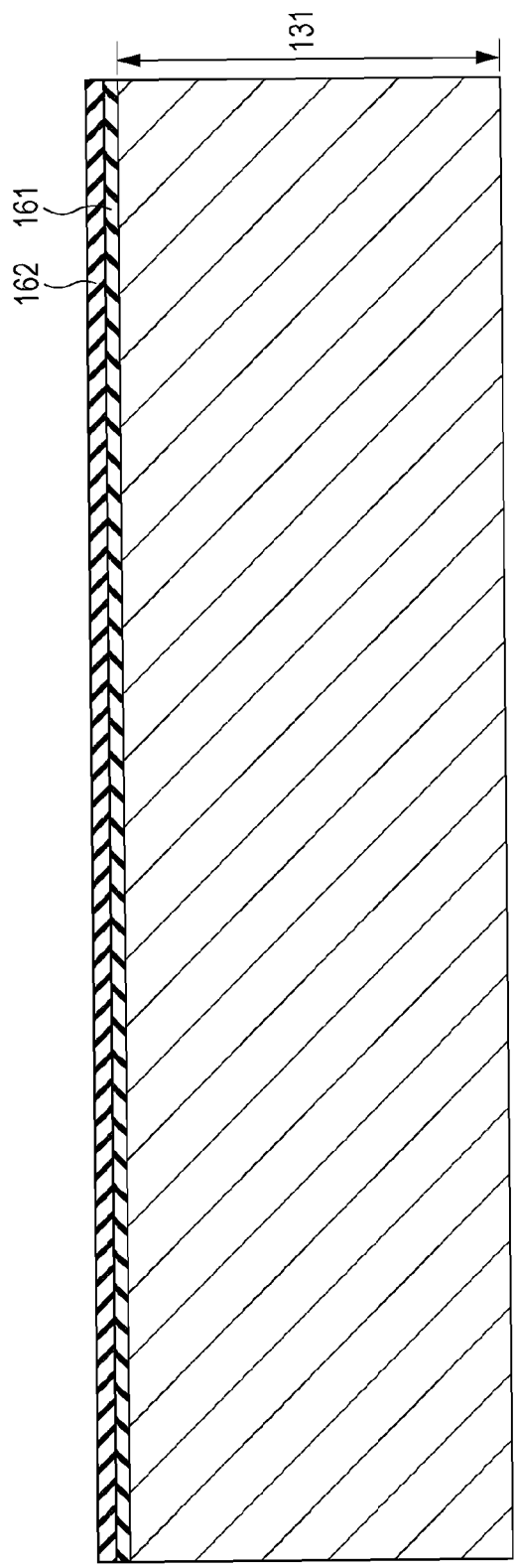
FIG. 3 is a diagram illustrating a method of manufacturing the pixel of FIG. 2.
Figure 4:
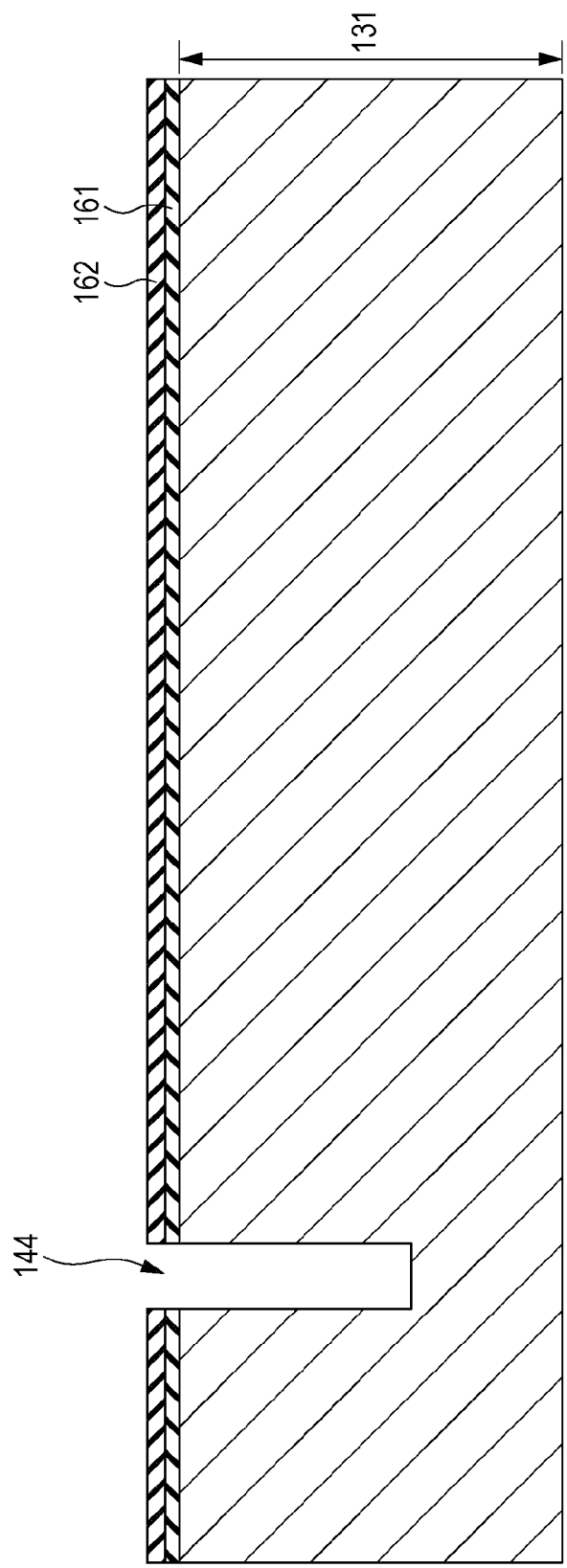
FIG. 4 is a diagram illustrating a method of manufacturing the pixel of FIG. 2.
Figure 5:
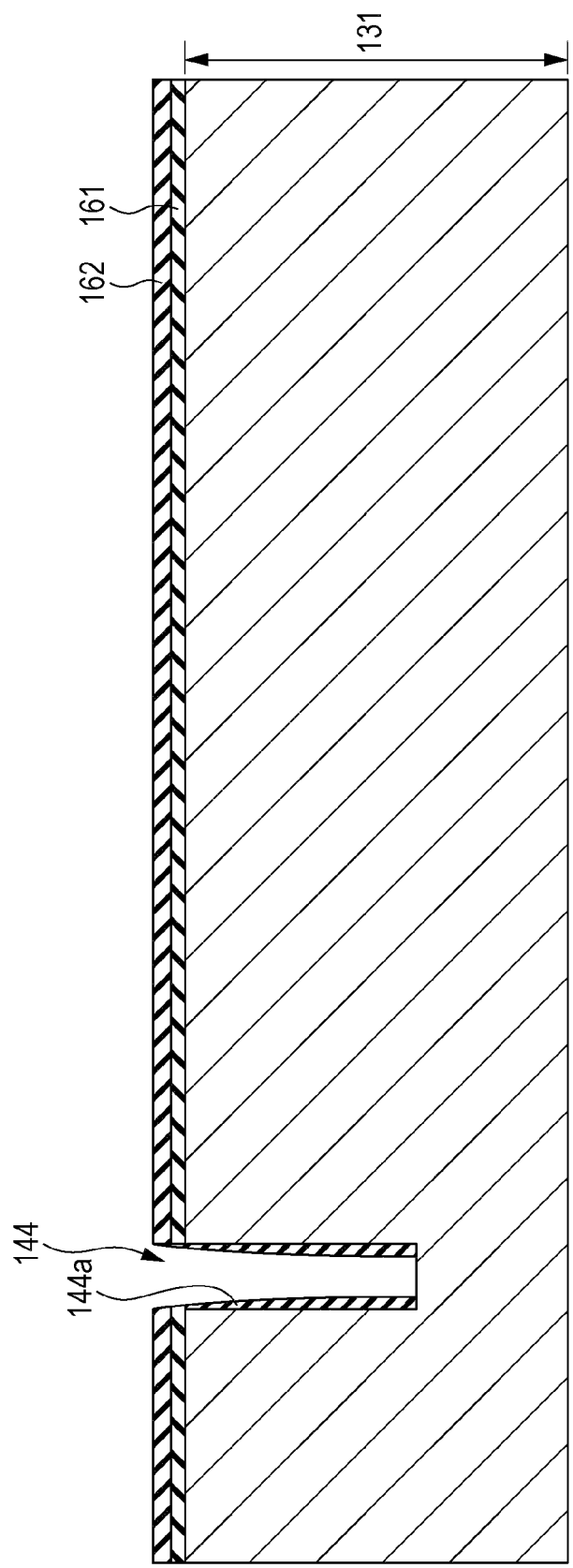
FIG. 5 is a diagram illustrating a method of manufacturing the pixel of FIG. 2.

First, a $SiO_2$ film 161 and a SiN film 162 of about 10 nm to about 20 nm are formed on a surface of the silicon substrate 131, as illustrated in FIG. 3. Then, a trench having a depth ranging from about 1 μm to about 2 μm is formed as the connection portion 144, as illustrated in FIG. 4. Also, a SiN film 144a is formed on the sidewall of the connection portion 144, as illustrated in FIG. 5.

Figure 6:
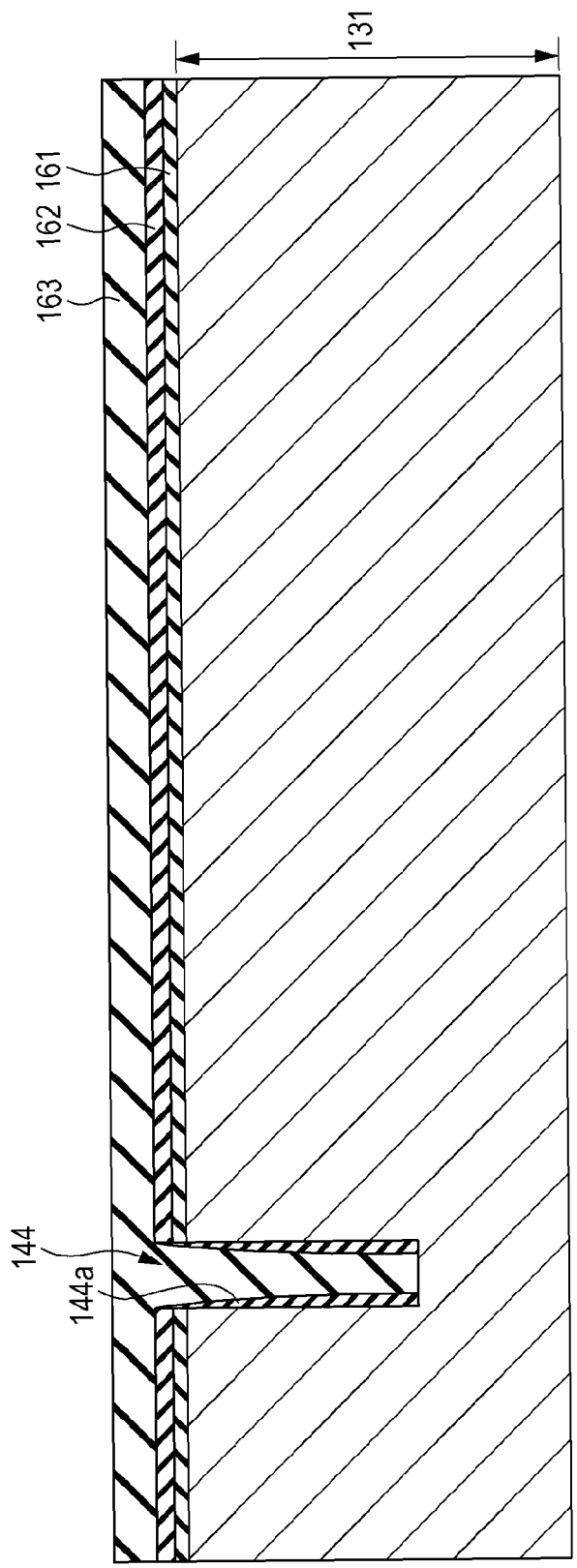
FIG. 6 is a diagram illustrating a method of manufacturing the pixel of FIG. 2.
Figure 7:
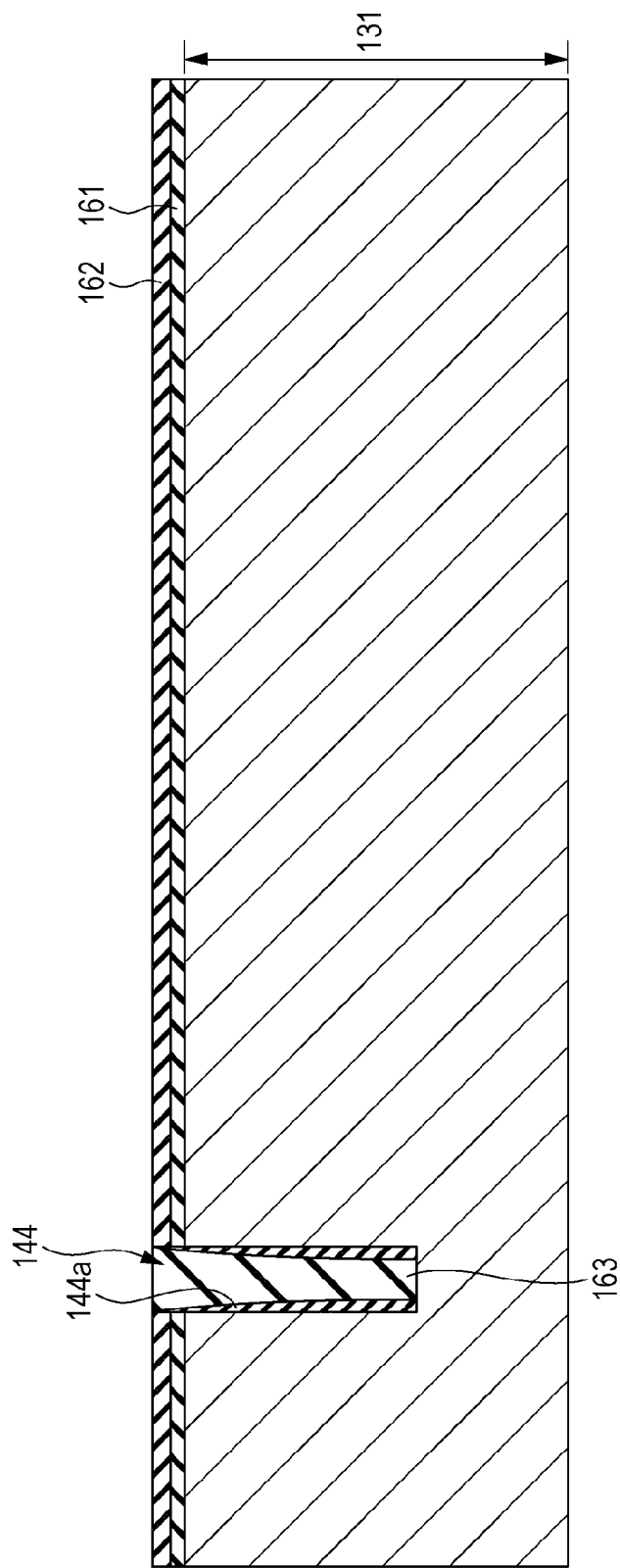
FIG. 7 is a diagram illustrating a method of manufacturing the pixel of FIG. 2.
Figure 8:
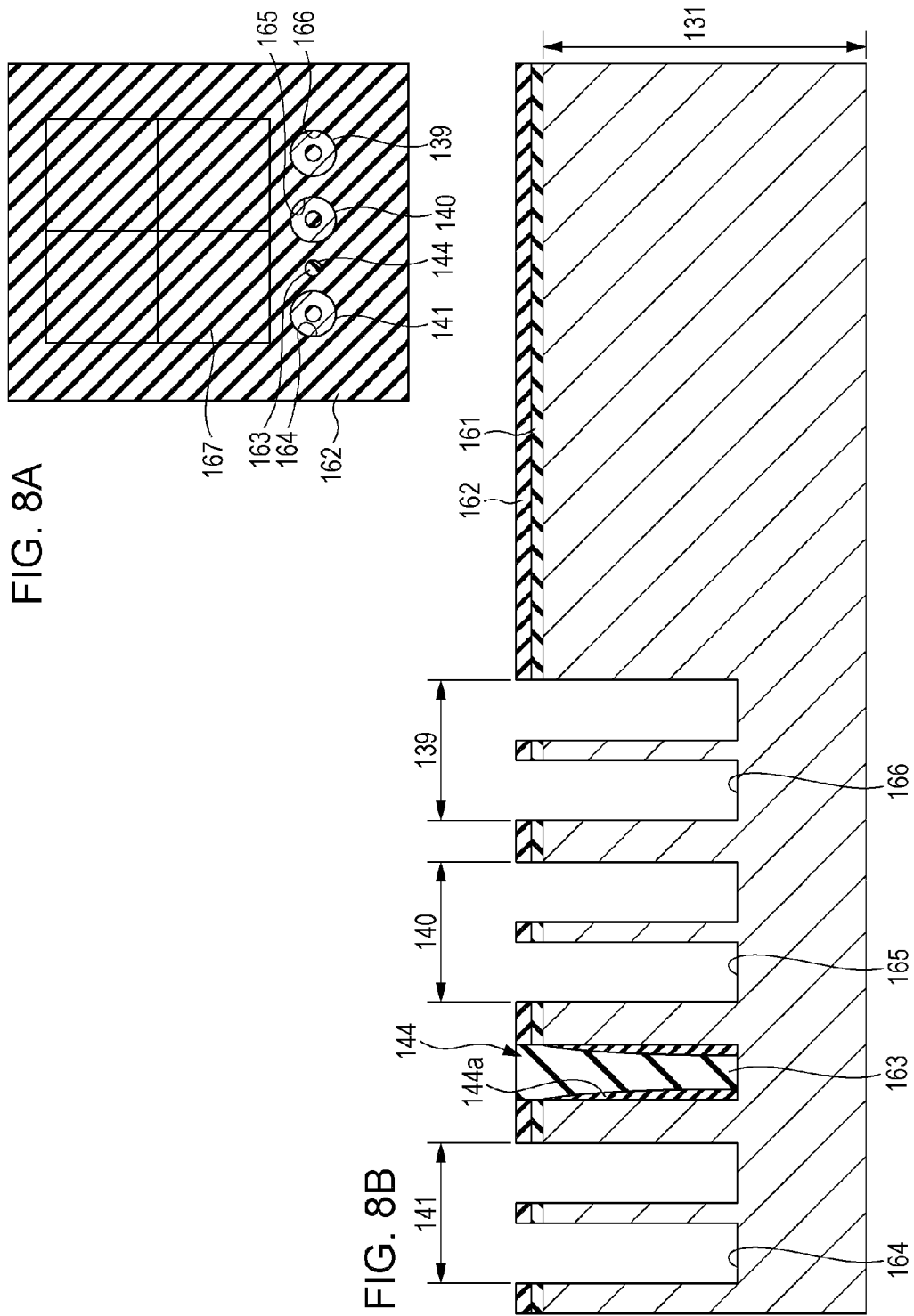
FIGS. 8A and 8B are diagrams illustrating a method of manufacturing the pixel of FIG. 2.

Then, a $SiO_2$ film 163 is buried in the connection portion 144, as illustrated in FIG. 6. The unnecessary $SiO_2$ film 163 on the SiN film 162 is then removed by Chemical Mechanical Planarization (CMP) or the like, as illustrated in FIG. 7.

Then, a trench 164 in a donut-cylindrical shape for the reset transistor 141 is formed on the left side of the connection portion 144 in FIG. 8B, as illustrated in FIG. 8B. Further, a trench 165 in a donut-cylindrical shape for the amplification transistor 140 and a trench 166 in a donut-cylindrical shape for the readout transistor 139 are formed on the right side of the connection portion 144 in FIG. 8B. Depths of the trenches 164 to 166 are about 1 μm to about 2 μm, and an inner diameter of the donut cylinder is about 10 nm to about 100 nm. Using this inner diameter, an area of the cylindrical channel regions 139b to 141b can be controlled.

Regions around the reset transistor 141, the connection portion 144, the amplification transistor 140 and the readout transistor 139 viewed from the surface side of the silicon substrate 131 are as illustrated in FIG. 8A. Further, an imaging region 167 including, for example, the photodiode 134, the charge-voltage conversion unit 137, and the transfer transistor 138 of each pixel 130 is collectively arranged in every four pixels 130, as illustrated in FIG. 8A.

Further, while the imaging region 167 is illustrated in an upper portion of a region around the reset transistor 141, the connection portion 144, the amplification transistor 140, and the readout transistor 139 in FIG. 8A for convenience of the description, an actual positional relationship between both the regions is not such a relationship. This is similar in FIGS. 16A to 18A, 30A, and 38A to 40A to be described below.

Figure 9:
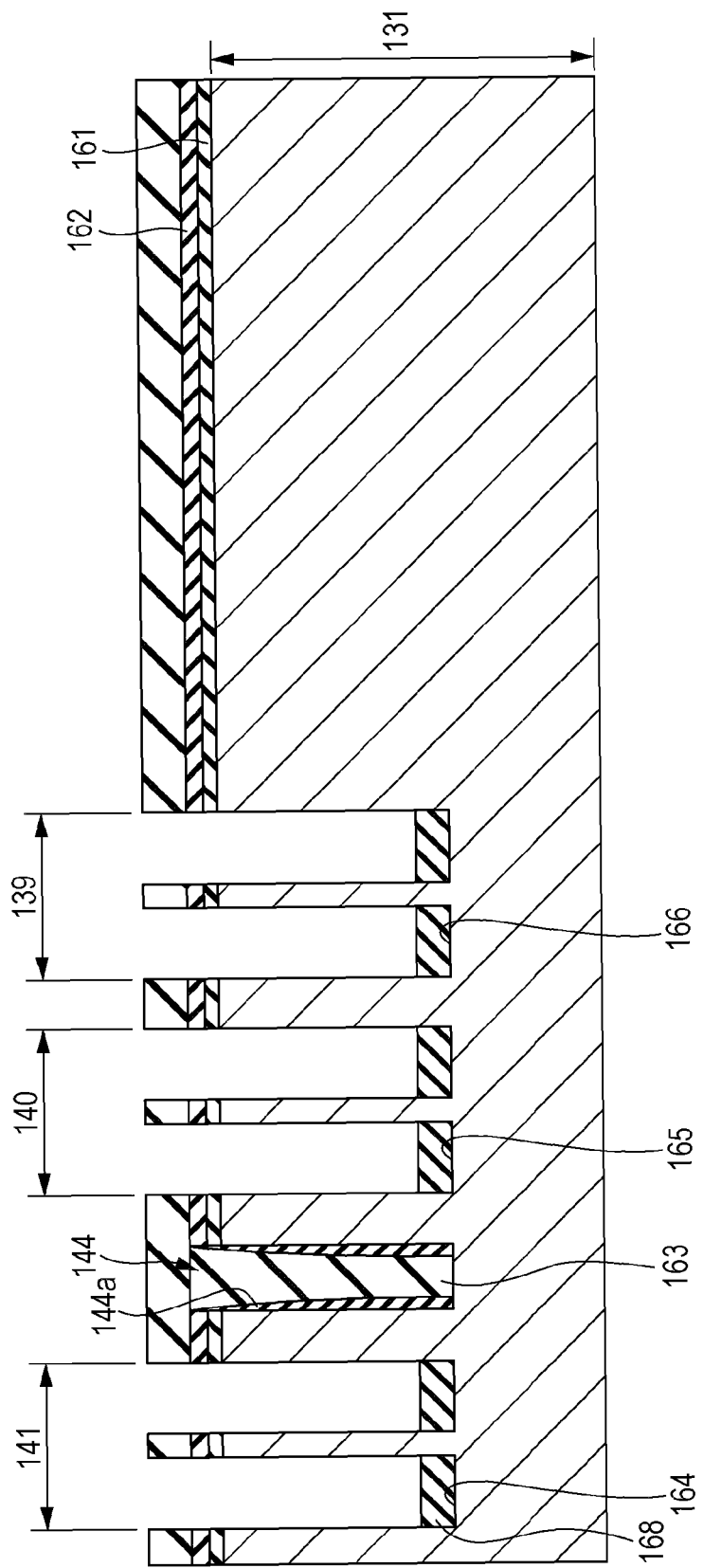
FIG. 9 is a diagram illustrating a method of manufacturing the pixel of FIG. 2.

After the formation of the trenches 164 to 166, a $SiO_2$ film 168 is anisotropically buried not to be formed on sidewalls of the trenches 164 to 166, as illustrated in FIG. 9. Here, a film thickness of the $SiO_2$ film 168 is about 50 nm to about 100 nm, but is not limited thereto. Using the film thickness of the $SiO_2$ film 168, channel lengths of the channel regions 139b to 141b can be controlled. When the $SiO_2$ film 168 is formed on the sidewall of the trenches 164 to 166, the $SiO_2$ film 168 on the sidewalls is removed using wet etching or the like.

Figure 10:
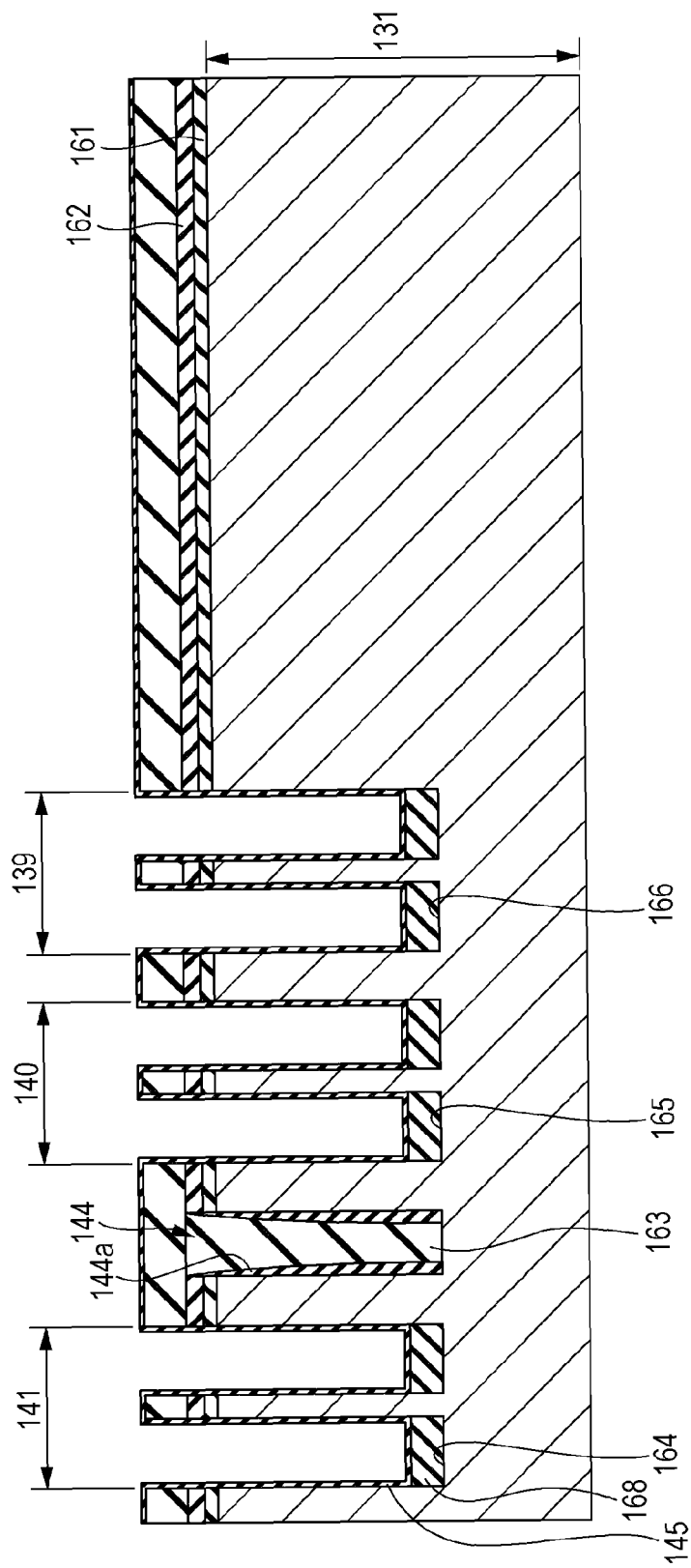
FIG. 10 is a diagram illustrating a method of manufacturing the pixel of FIG. 2.

Also, a high permittivity gate insulating film (Hf or Al-based insulating film) of about 3 nm to about 5 nm is formed as the gate insulating film 145, as illustrated in FIG. 10. The film formation is performed using a pre-cursor and an ozone gas at ambient temperature of about 300° C. by atomic layer deposition (ALD). Post deposition annealing is performed at 500° C. to 700° C. for about 10 min to about 60 min, as necessary.

Figure 11:
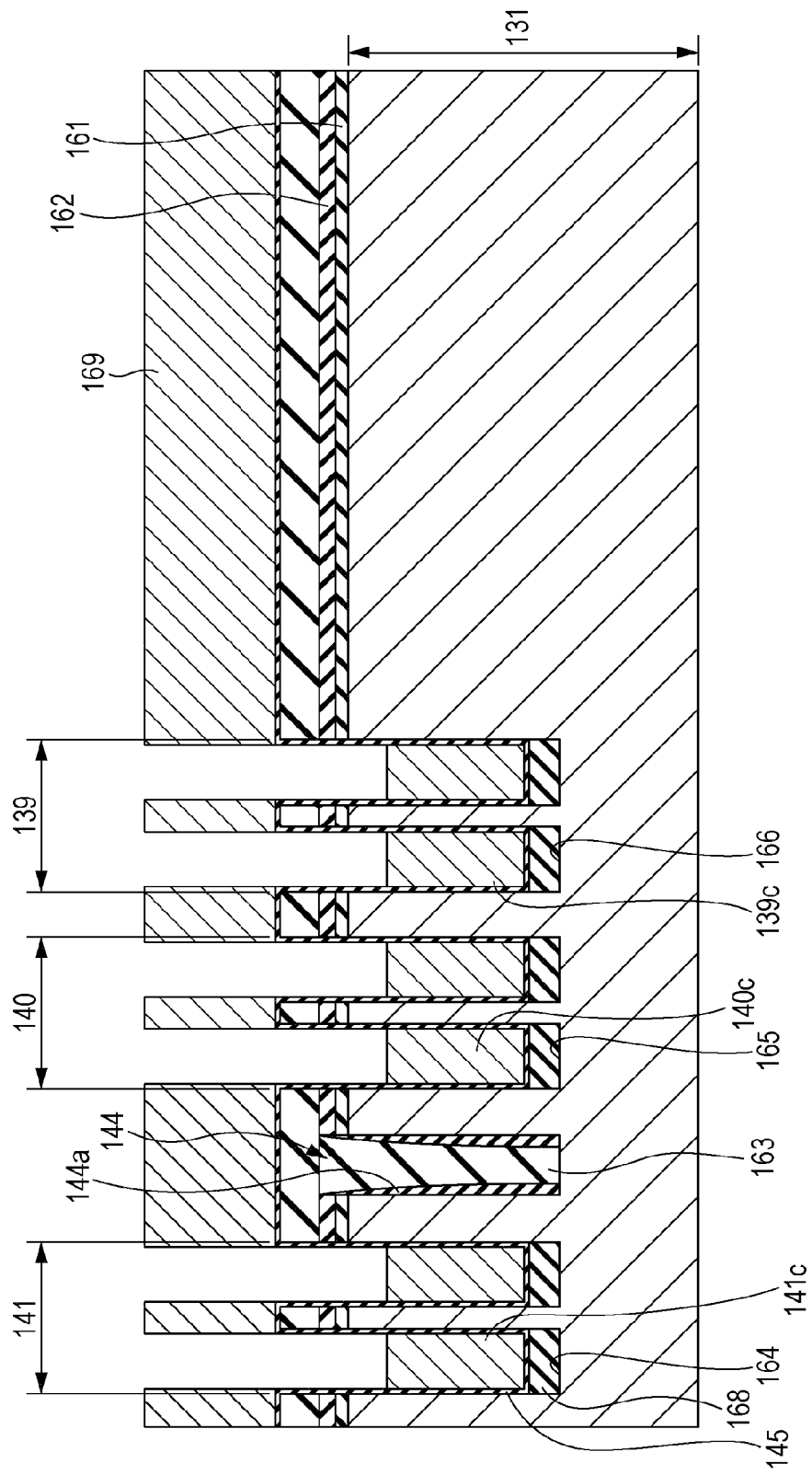
FIG. 11 is a diagram illustrating a method of manufacturing the pixel of FIG. 2.

Then, metal materials 169 are anisotropically buried in the trenches 164 to 166 as the gate electrodes 139c to 141c, as illustrated in FIG. 11. It is necessary to select metal materials having a work function suitable for Vth of the readout transistor 139, the amplification transistor 140, and the reset transistor 141 as the metal materials 169 of the gate electrodes 139c to 141c. Therefore, the metal materials 169 buried in the respective trenches 164 to 166 may be different.

While the metal material 169 includes, for example, HfSi or TiN, another element such as Al may be added thereto. When different metal materials are buried in the respective trenches 164 to 166, regions of the trenches in which different metal materials are to be buried are opened by lithography, and unnecessary metal materials already buried are removed by fluoric acid. Then, a new metal material is buried in the trench.

The channel length can be controlled according to the length in the direction perpendicular to the silicon substrate 131 of the gate electrodes 139c to 141c.

Figure 12:
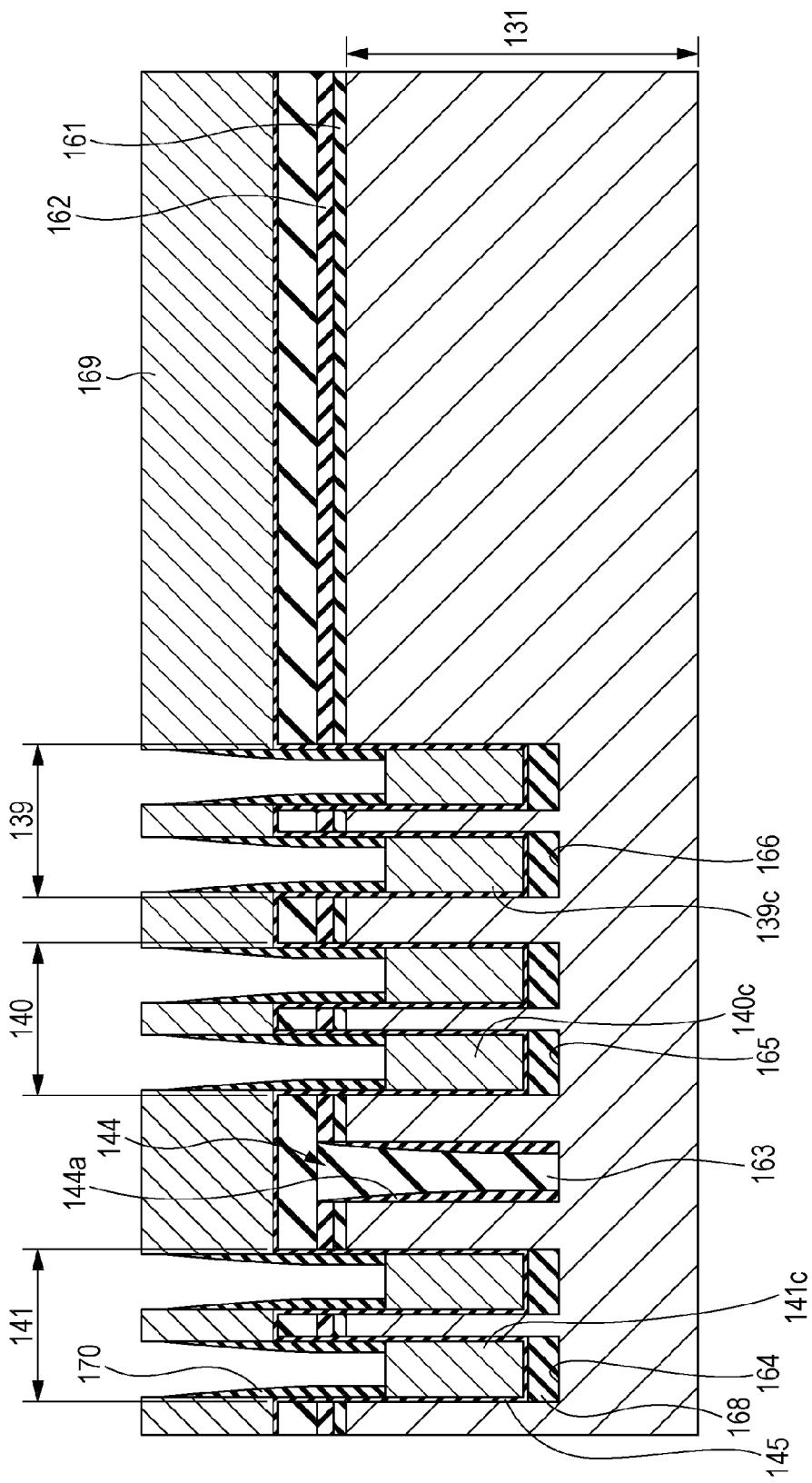
FIG. 12 is a diagram illustrating a method of manufacturing the pixel of FIG. 2.
Figure 13:
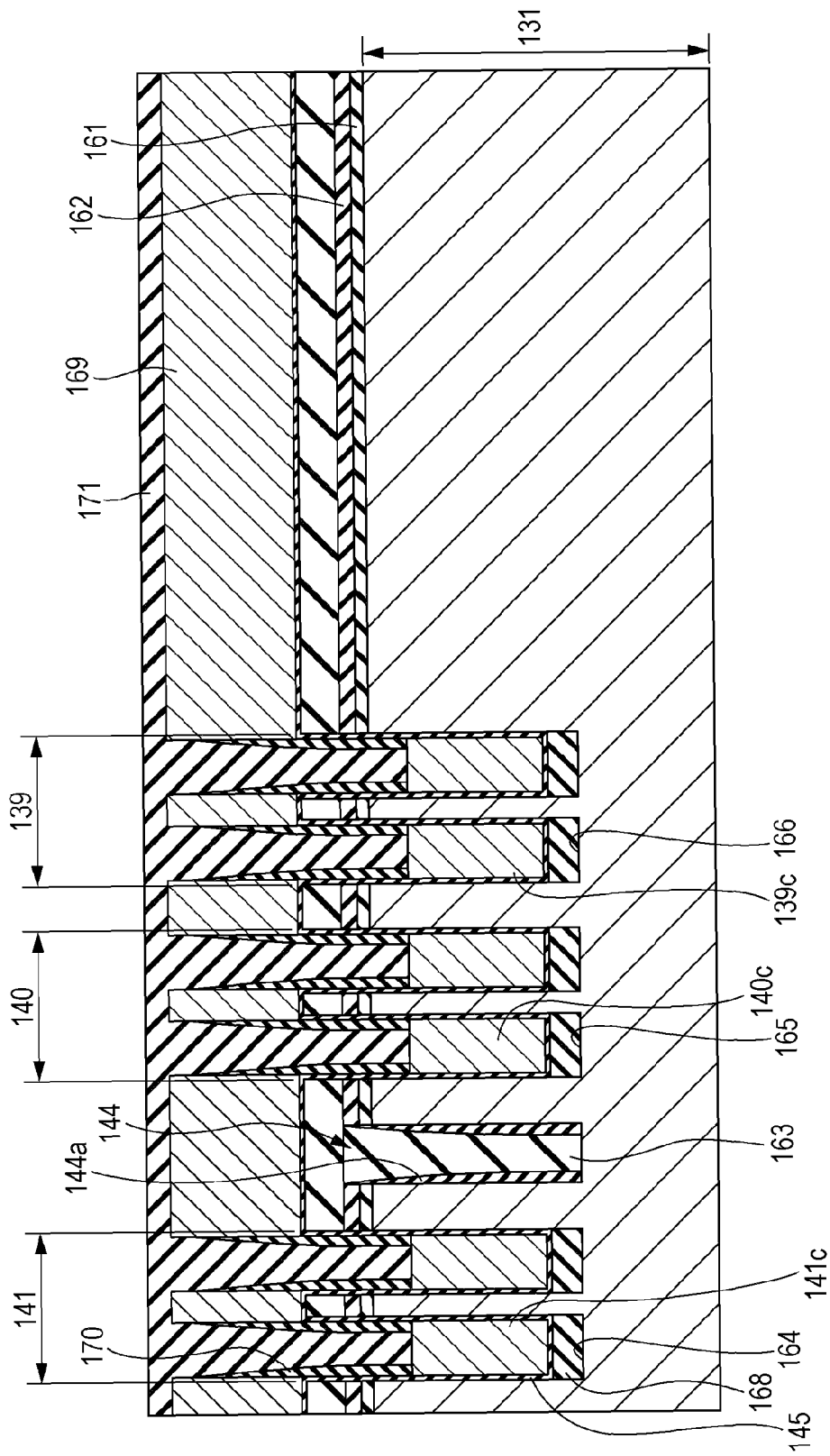
FIG. 13 is a diagram illustrating a method of manufacturing the pixel of FIG. 2.
Figure 14:
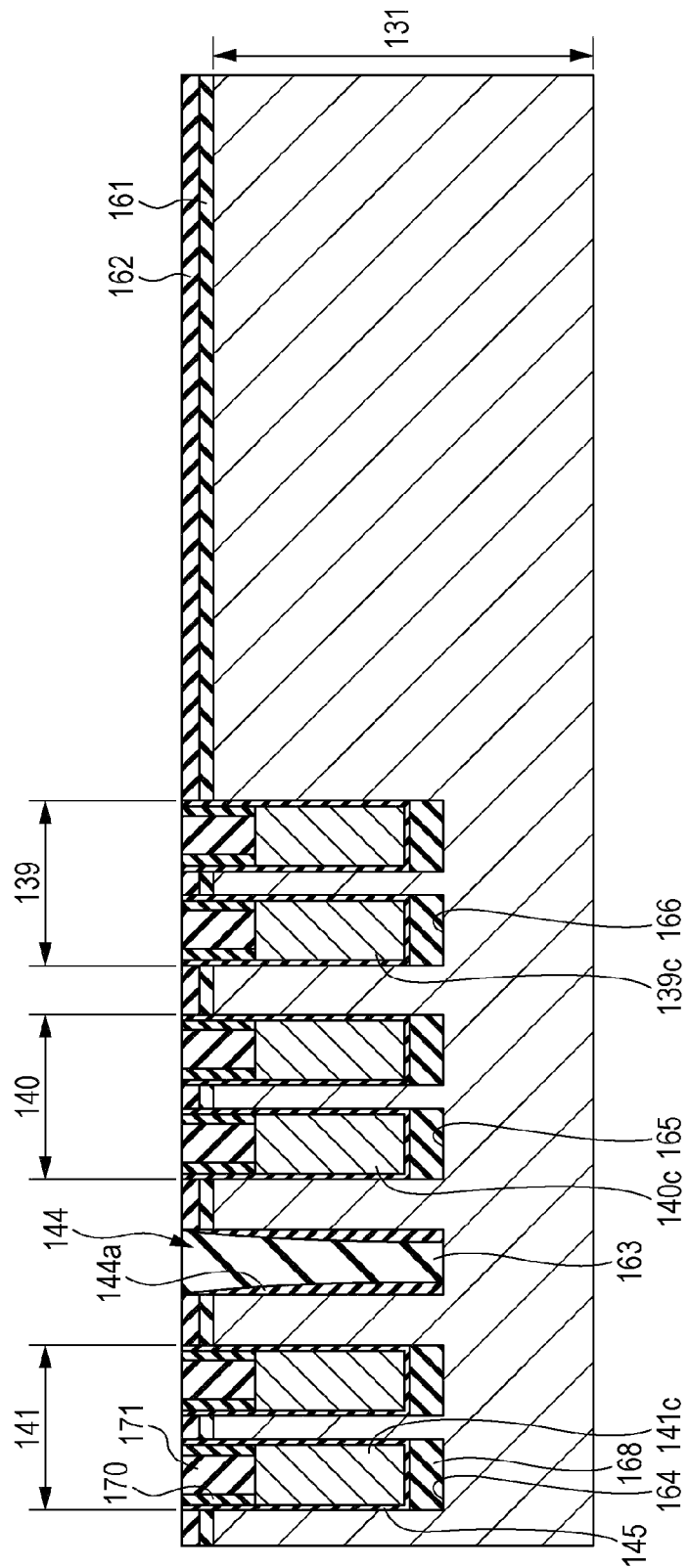
FIG. 14 is a diagram illustrating a method of manufacturing the pixel of FIG. 2.

Then, a SiN film 170 is formed on the sidewalls of the trenches 164 to 166, as illustrated in FIG. 12. Then, a $SiO_2$ film 171 is buried in the trenches 164 to 166, as illustrated in FIG. 13. Also, the $SiO_2$ film 168 is removed by CMP or the like, as illustrated in FIG. 14.

Figure 15:
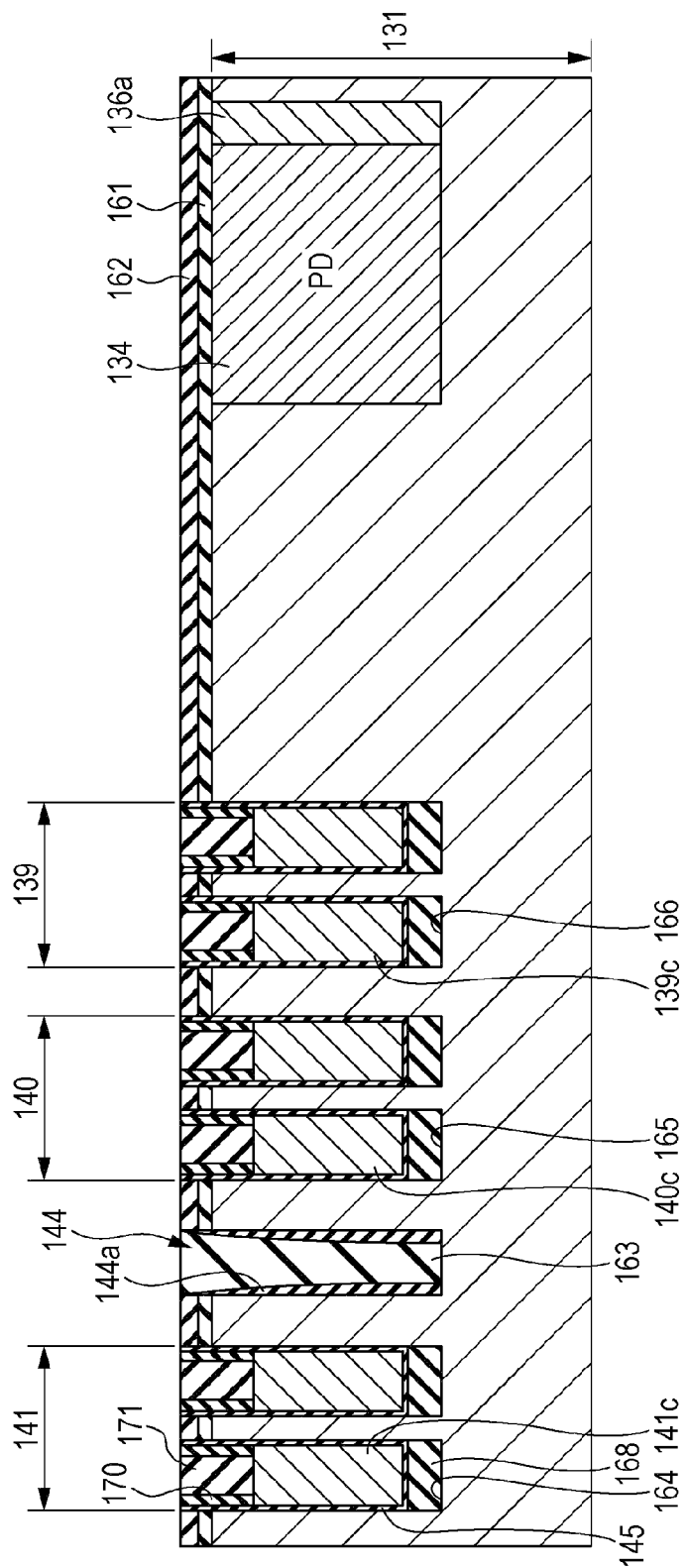
FIG. 15 is a diagram illustrating a method of manufacturing the pixel of FIG. 2.
Figure 16:
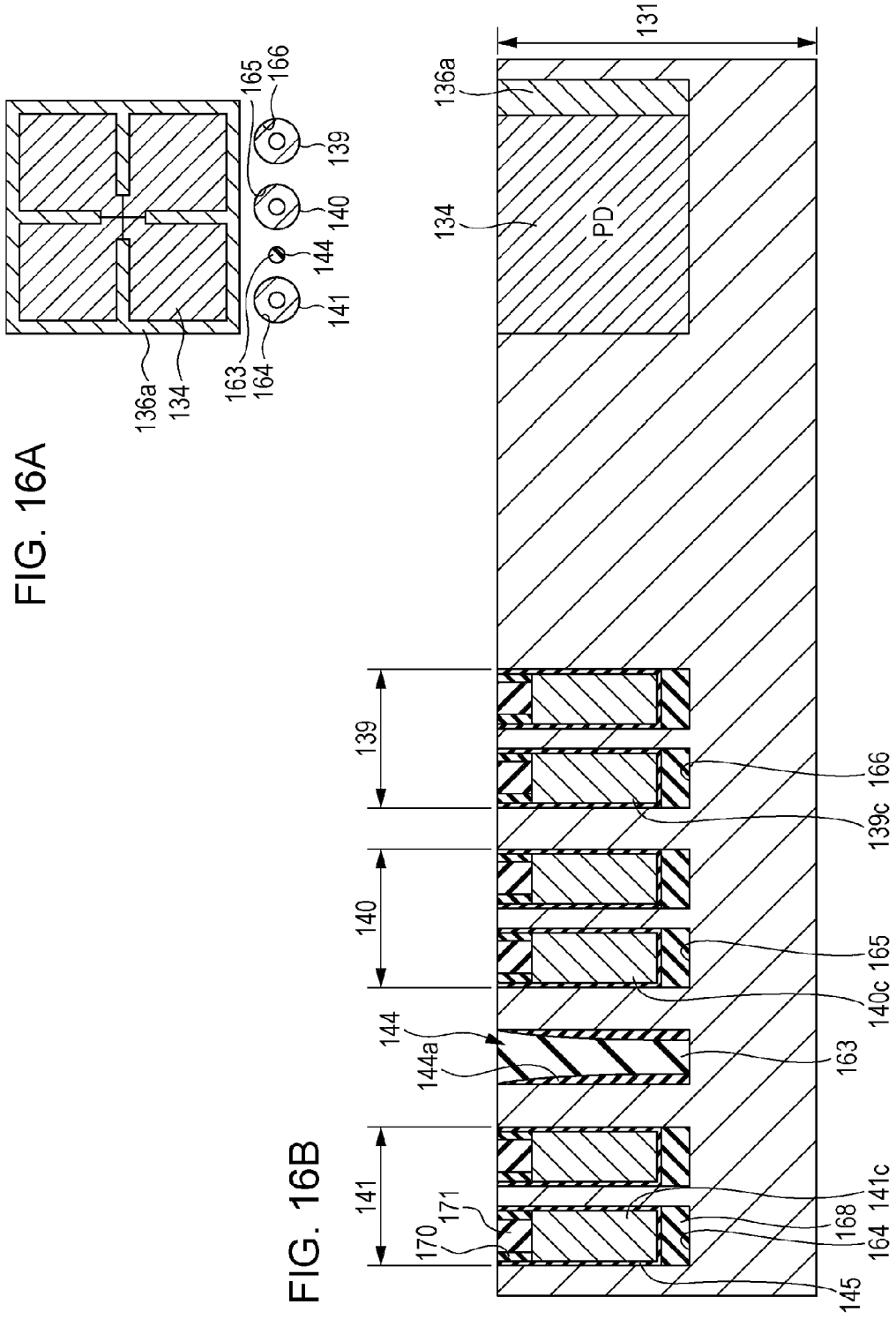
FIGS. 16A and 16B are diagrams illustrating a method of manufacturing the pixel of FIG. 2.
Figure 17:
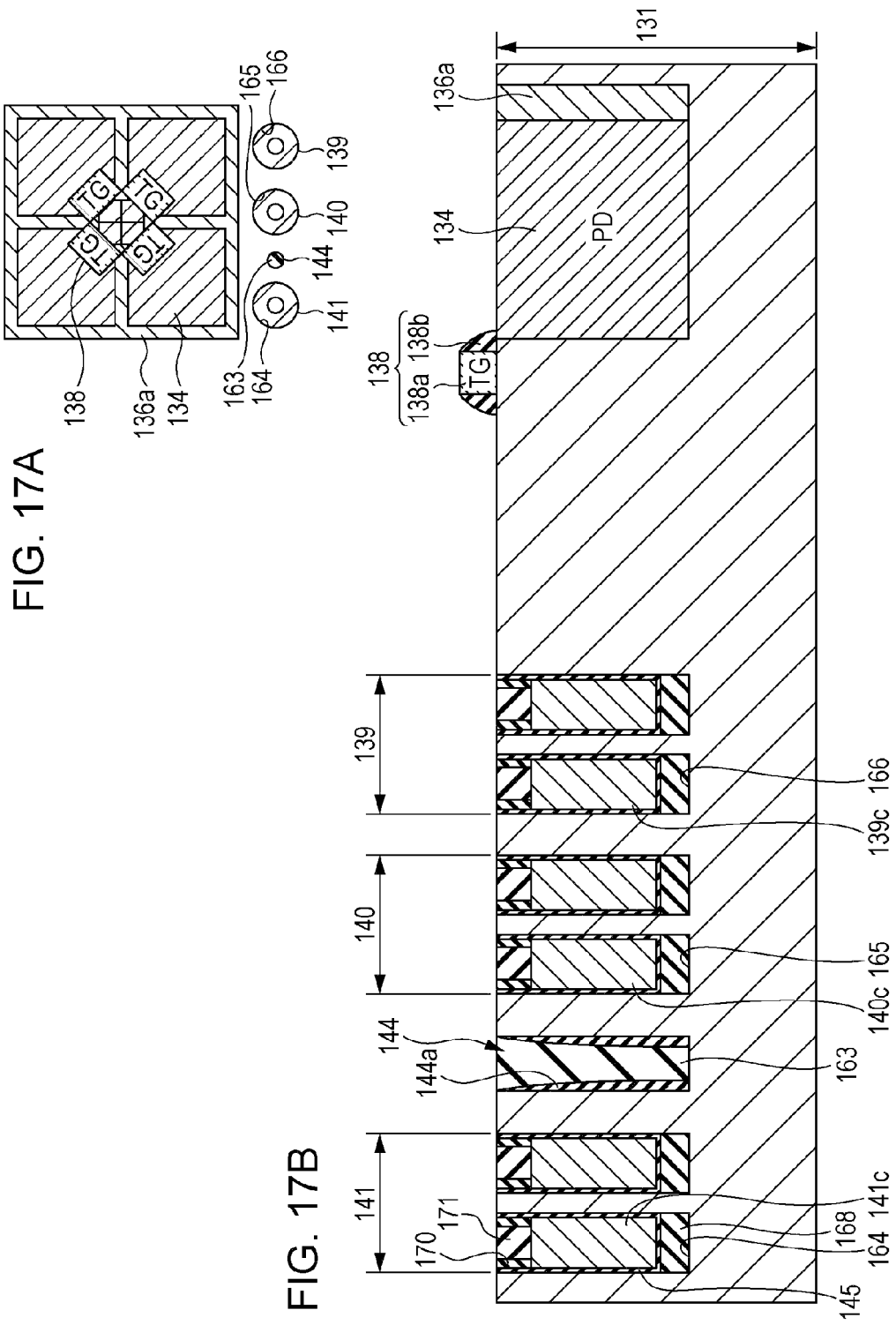
FIGS. 17A and 17B are diagrams illustrating a method of manufacturing the pixel of FIG. 2.
Figure 18:
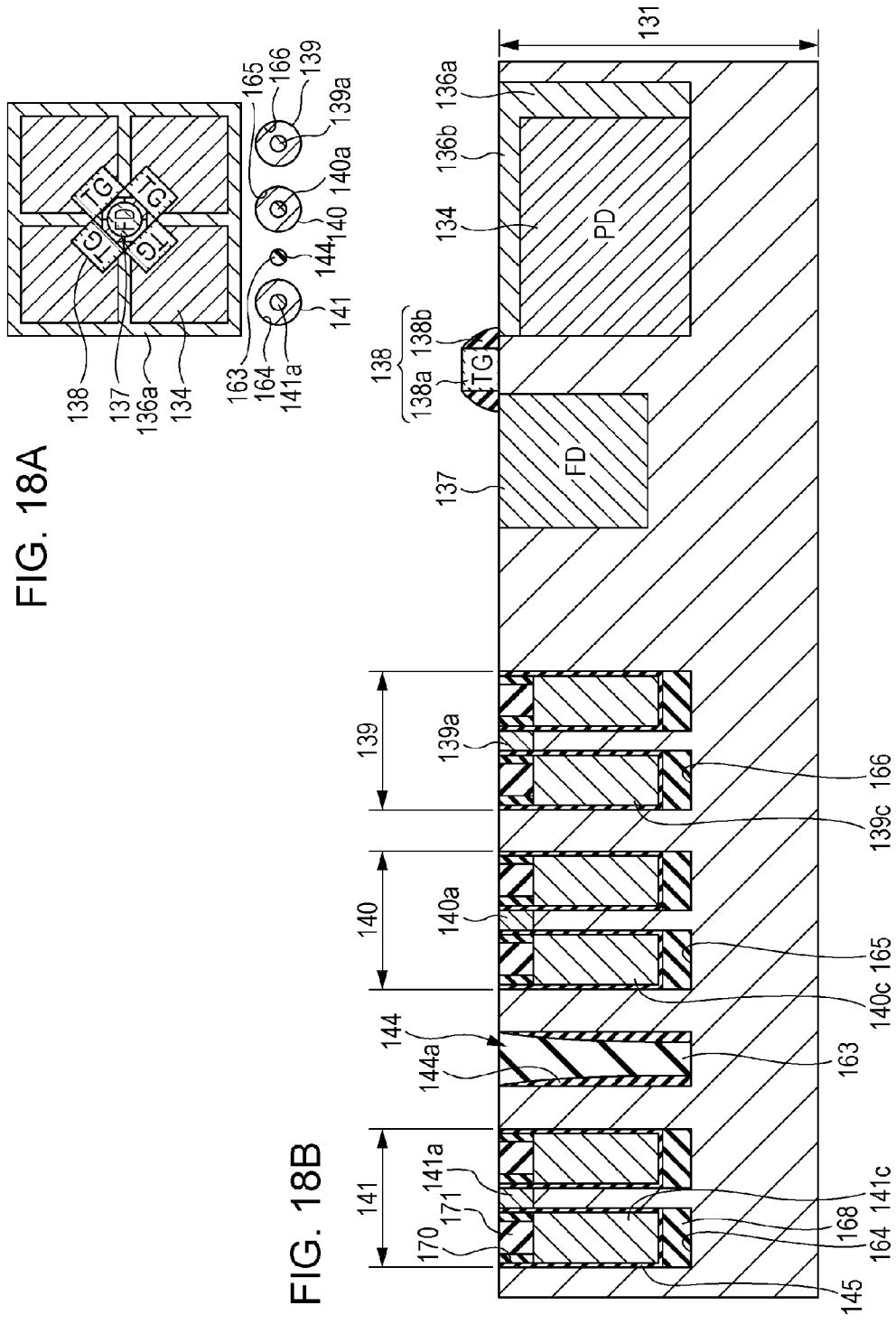
FIGS. 18A and 18B are diagrams illustrating a method of manufacturing the pixel of FIG. 2.

Then, an n-type semiconductor is ion-implanted as the photodiode 134 into the surface of the silicon substrate 131, as illustrated in FIG. 15. This ion implantation is performed with energy ranging from 400 keV to 3 MeV several times, as necessary. An amount of implantation is about $1 \times 10^{12}$ ($cm^{-2}$). Further, a p-type semiconductor is ion-implanted, as the HAD 136a on the right side of FIG. 15 of the photodiode 134, which has been provided for separation from a photodiode of an adjacent pixel among the HADs 136, into the surface of the silicon substrate 131. This ion implantation is performed with energy ranging from 100 keV to 2 MeV several times, as necessary.

Then, the SiN film 162 is removed through CMP, wet etching using hot phosphoric acid or the like, and the $SiO_2$ film 161 is removed through DHF or the like, as illustrated in FIGS. 16A and 16B. Also, the transfer transistor 138 is formed, as illustrated in FIGS. 17A and 17B.

Specifically, a gate insulating film having a film thickness of about 6 nm is formed, a Poly-Si film is formed to about 150 nm, and dry etching is performed using lithographic patterning to form the gate electrode 138a. Then, the sidewall 138b is formed using the $SiO_2$ film and the SiN film. A film thickness of the $SiO_2$ film of the sidewall 138b is about 20 nm, and a film thickness of the SiN film is about 50 nm.

Then, an n-type semiconductor is ion-implanted into the surface of the silicon substrate 131 with energy ranging from about 10 keV to about 30 keV to form the source and drain regions 139a to 141a, as illustrated in FIG. 18A. An amount of implantation is about $1 \times 10^{15}$ ($cm^{-2}$). The charge-voltage conversion unit 137 is formed through ion implantation under the same conditions, as illustrated in FIGS. 18A and 18B. Further, Spike RTA (Rapid Thermal Anneal) of 1000° C. to 1100° C. is performed as activation annealing.

Also, the HAD 136b on the surface side of the photodiode 134 among the HADs 136 is formed by ion-implanting a p-type semiconductor with energy ranging from 10 keV to 100 keV, as illustrated in FIGS. 18A and 18B. An amount of implantation is about $1\times10^{13}$ (cm$^{-2}$). For example, heat treatment having small heat history, such as laser spike anneal (LSA), is used as the activation annealing. This activation annealing may be Spike RTA for a preceding stage. Further, the HAD 136b is not illustrated in FIG. 18B so as to illustrate the arrangement of the transfer transistor 138 or the charge-voltage conversion unit 137. This is similar in FIG. 40B to be described later.

Figure 19:
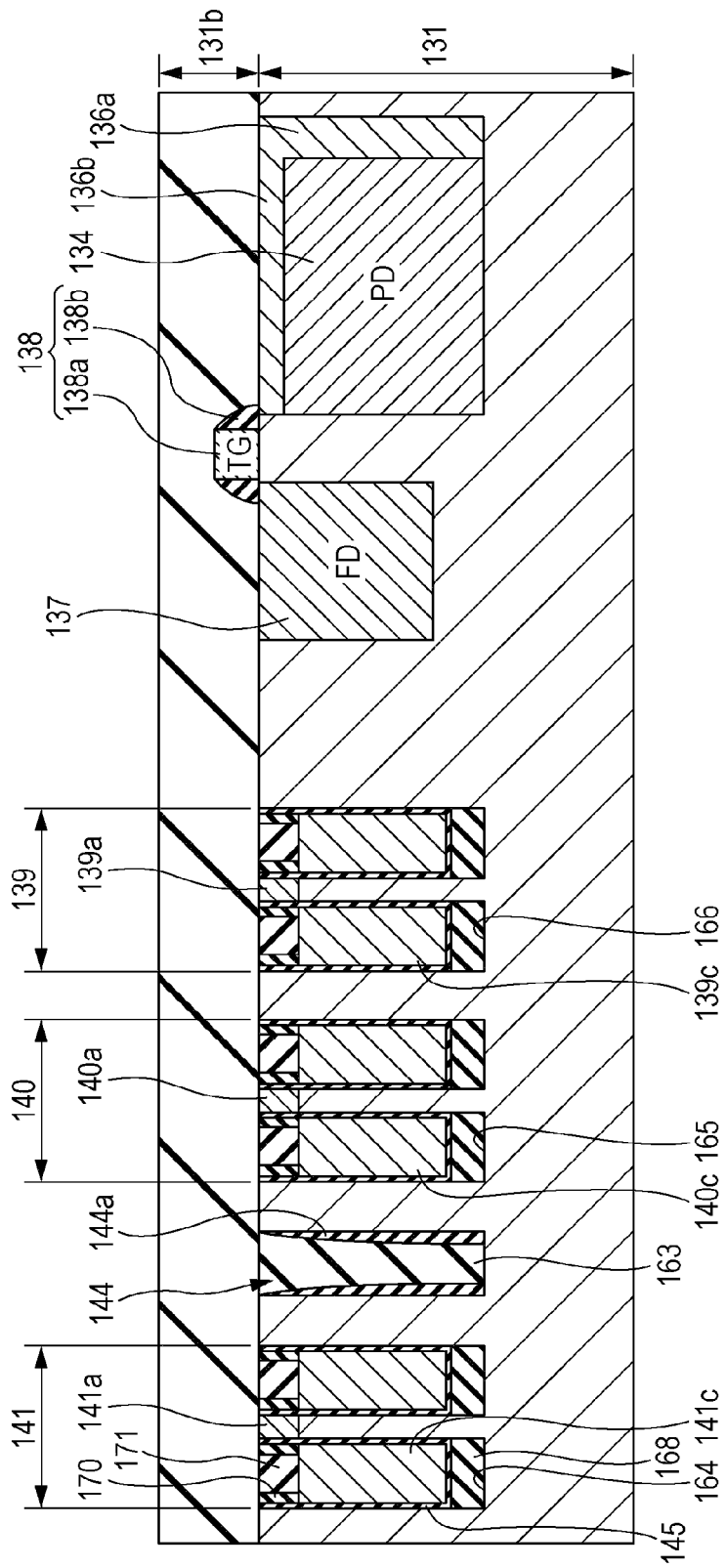
FIG. 19 is a diagram illustrating a method of manufacturing the pixel of FIG. 2.
Figure 20:
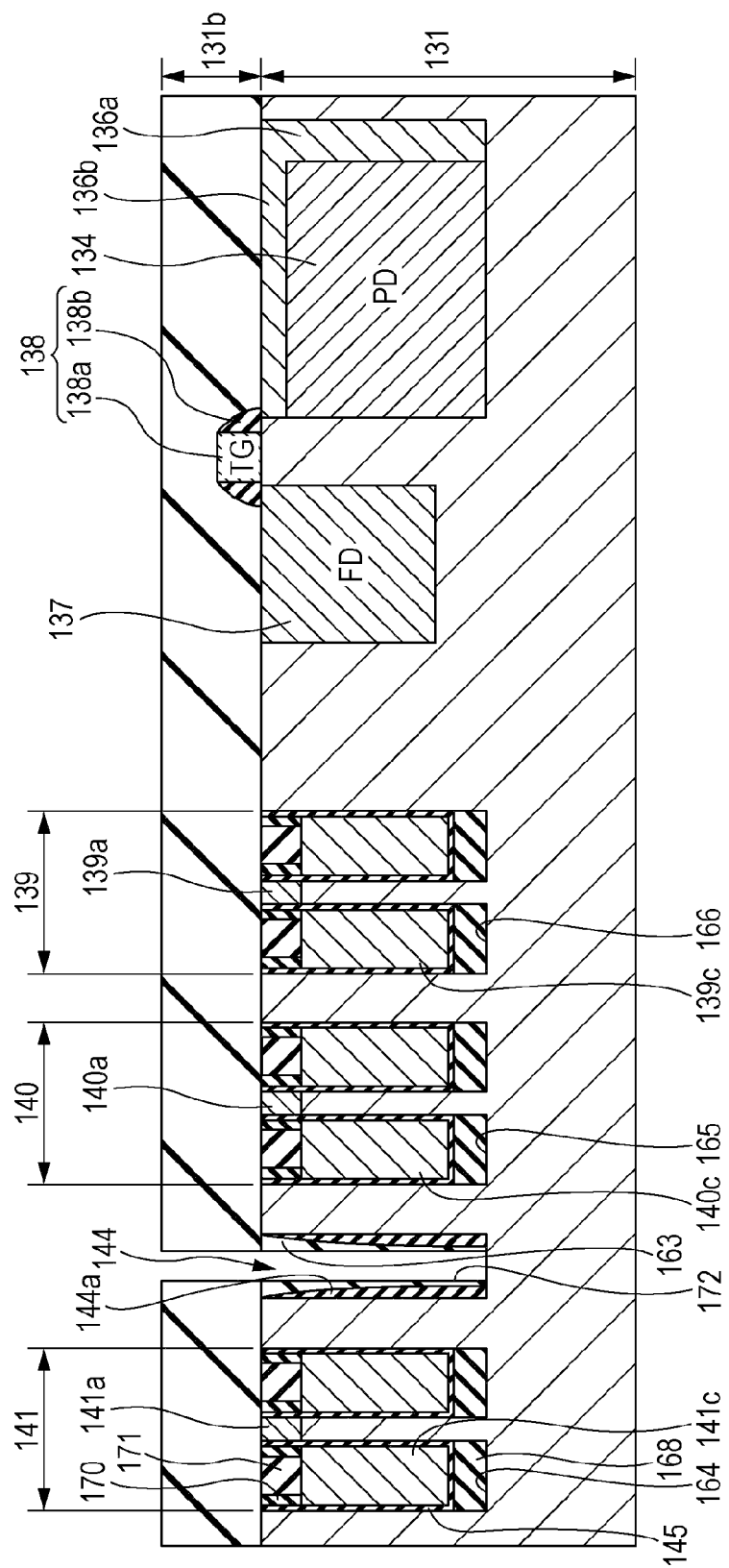
FIG. 20 is a diagram illustrating a method of manufacturing the pixel of FIG. 2.
Figure 21:
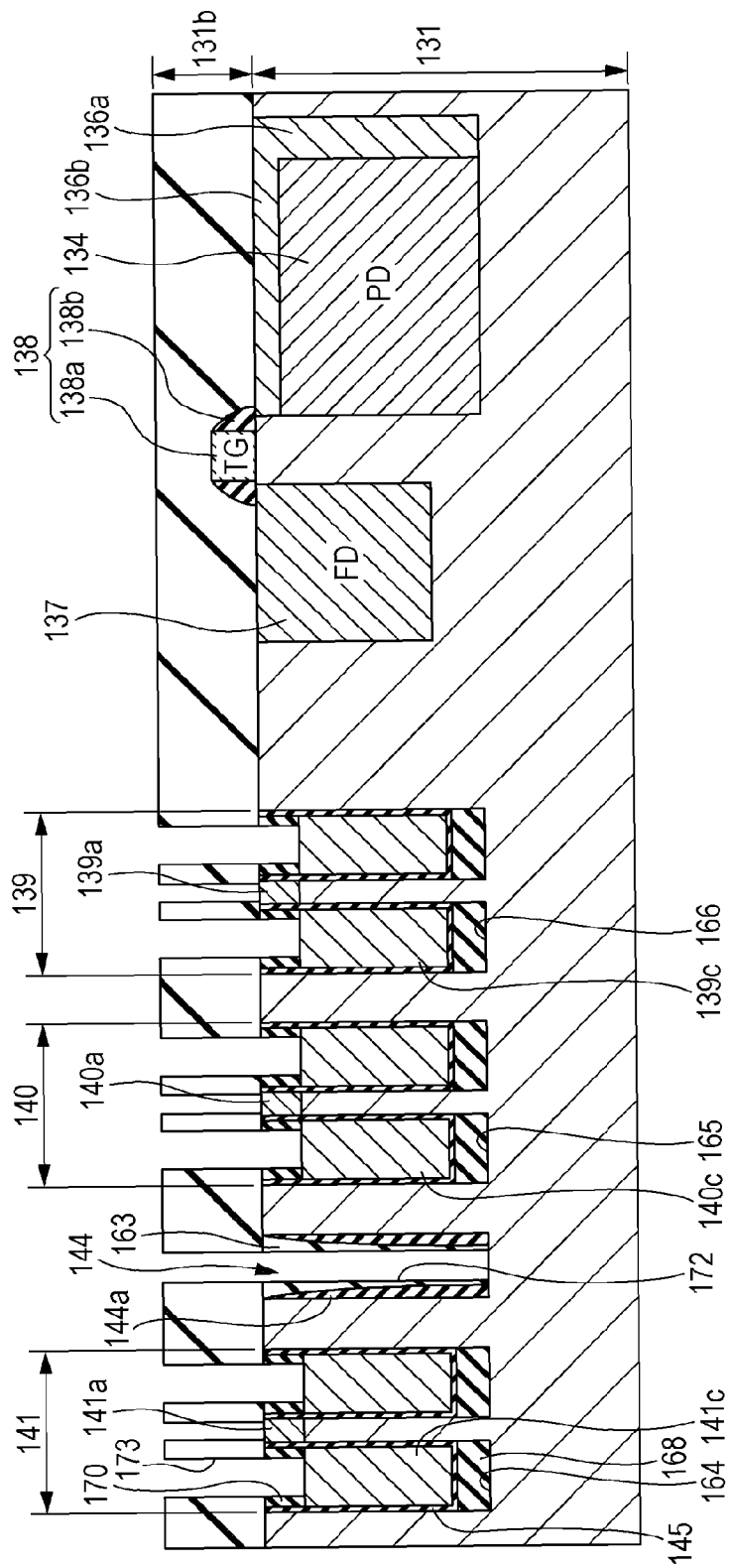
FIG. 21 is a diagram illustrating a method of manufacturing the pixel of FIG. 2.
Figure 22:
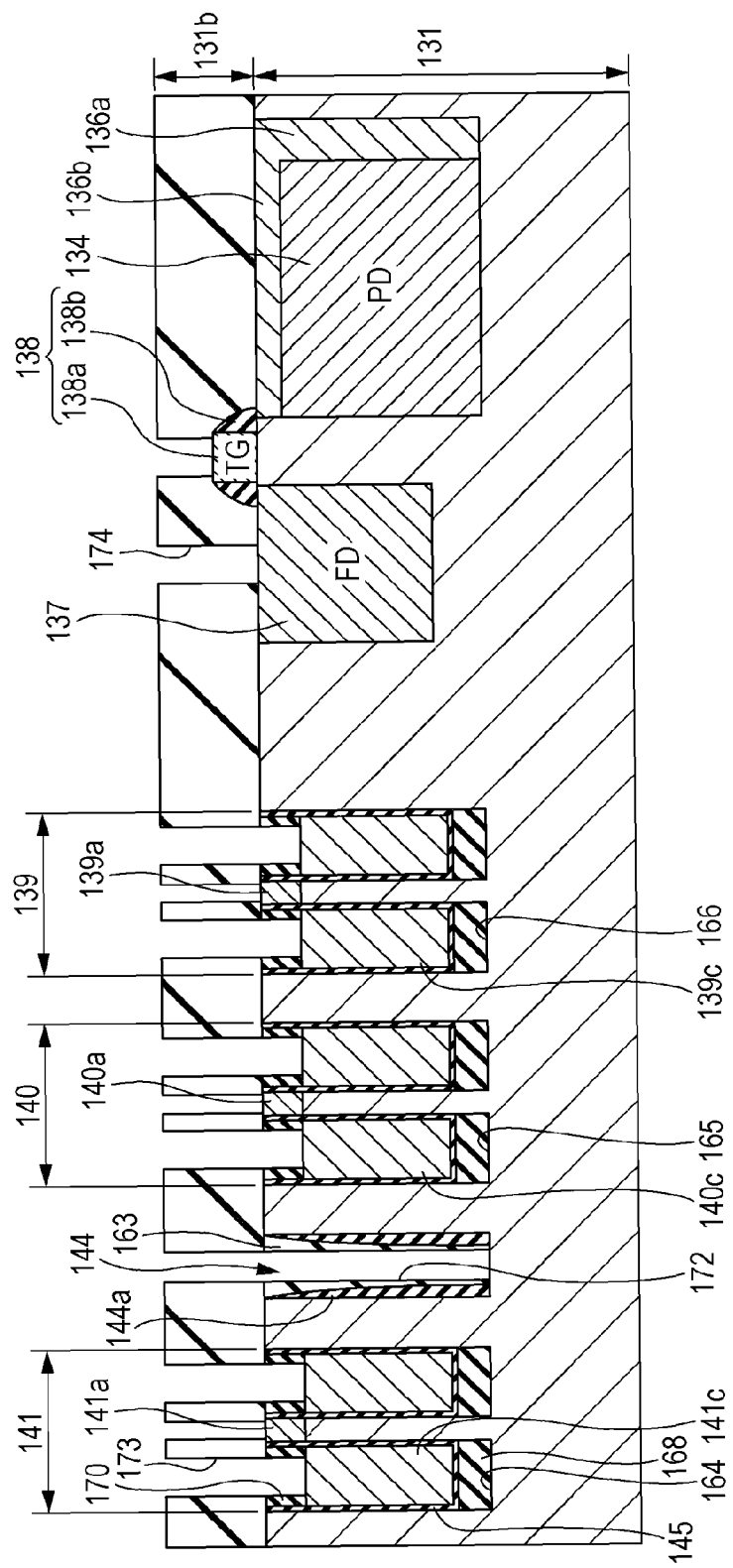
FIG. 22 is a diagram illustrating a method of manufacturing the pixel of FIG. 2.

Then, a SiO$_2$ film 131b of about 500 nm is formed as an interlayer film as illustrated in FIG. 19, and planarization by CMP is performed. Also, a deep trench 172 is formed in the SiO$_2$ film 131b of the connection portion 144 through lithography, as illustrated in FIG. 20. Further, shallow trenches 173 are formed in the SiO$_2$ film 131b of the trenches 164 to 166 through lithography, as illustrated in FIG. 21. Further, a shallower trench 174 is formed in the SiO$_2$ film 131b on the surface side of the charge-voltage conversion unit 137 and the transfer transistor 138 through lithography, as illustrated in FIG. 22.

Figure 23:
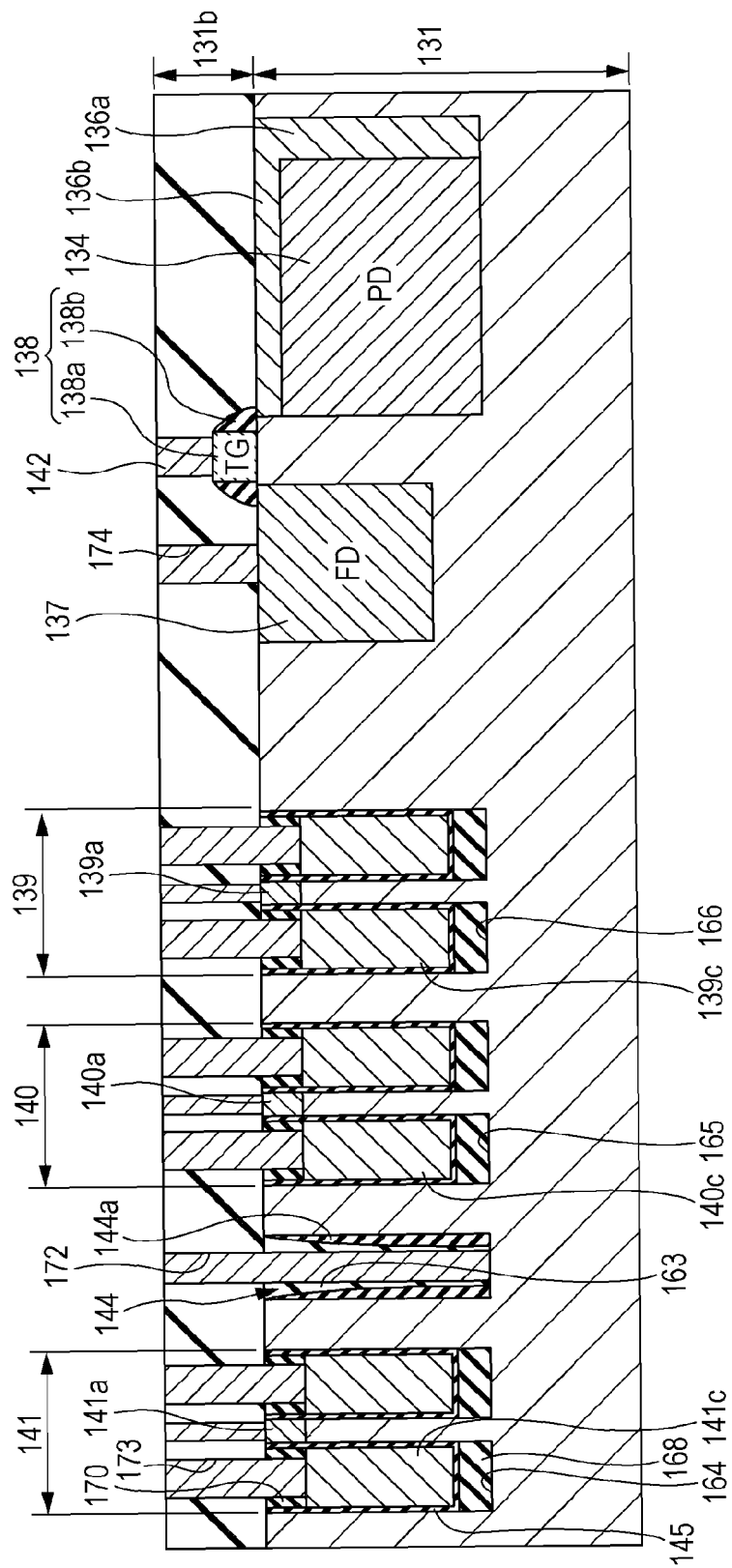
FIG. 23 is a diagram illustrating a method of manufacturing the pixel of FIG. 2.
Figure 24:
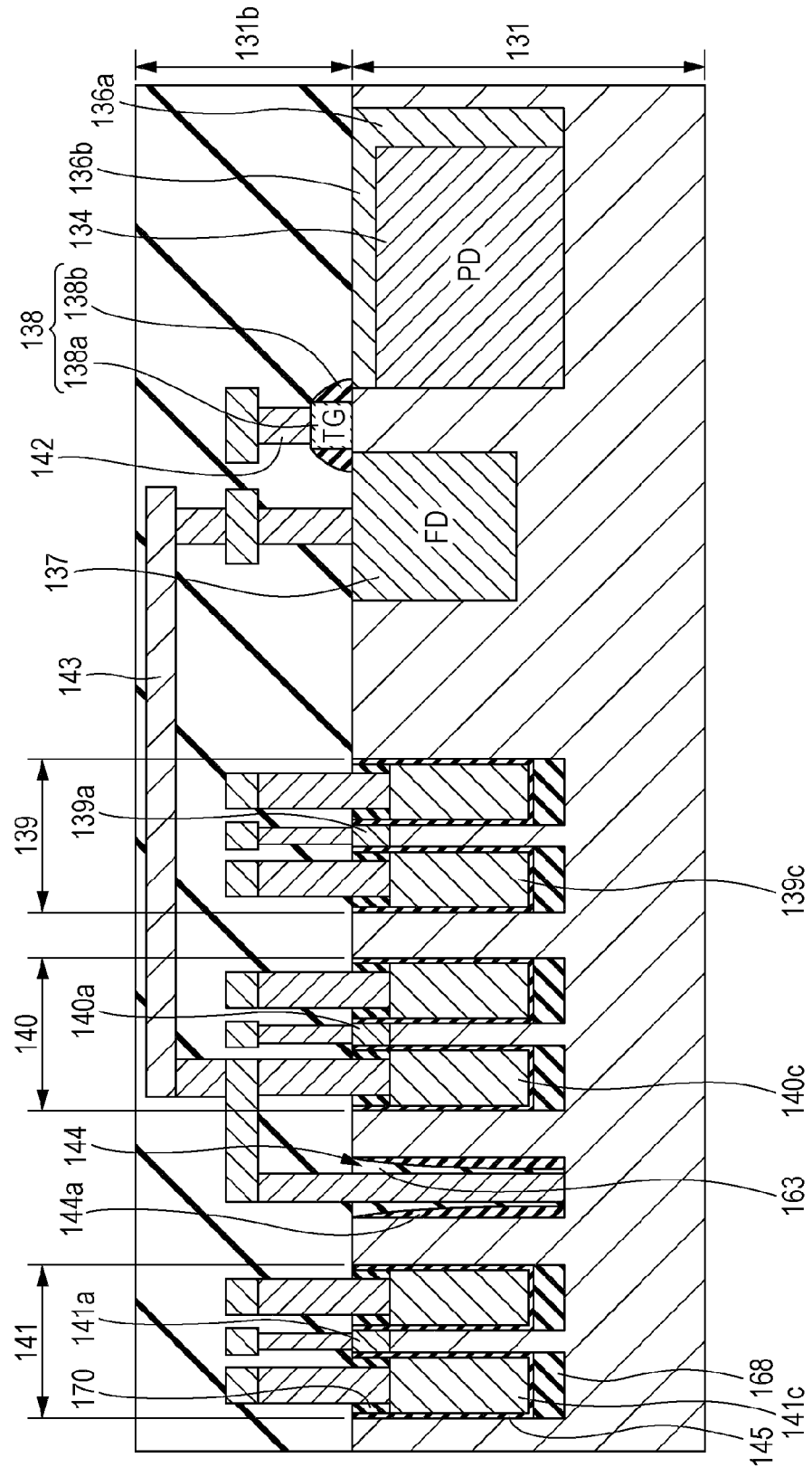
FIG. 24 is a diagram illustrating a method of manufacturing the pixel of FIG. 2.

Then, the contact plug 142 is buried in the deep trench 172, the shallow trench 173 and the shallower trench 174, and an unnecessary material such as W is removed, as illustrated in FIG. 23. Also, the wiring 143 is formed to be connected to the contact plug 142, as illustrated in FIG. 24.

Figure 25:
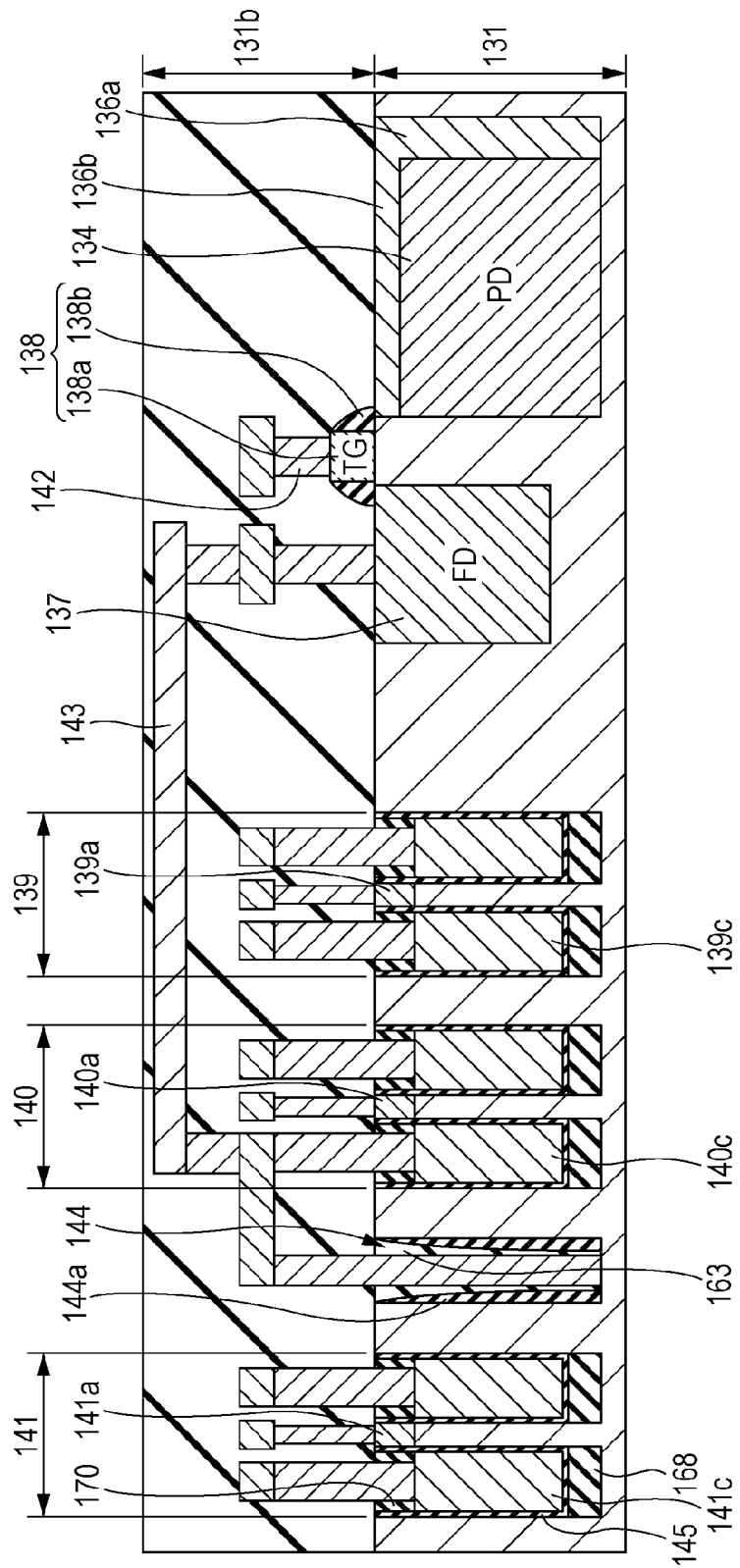
FIG. 25 is a diagram illustrating a method of manufacturing the pixel of FIG. 2.
Figure 26:
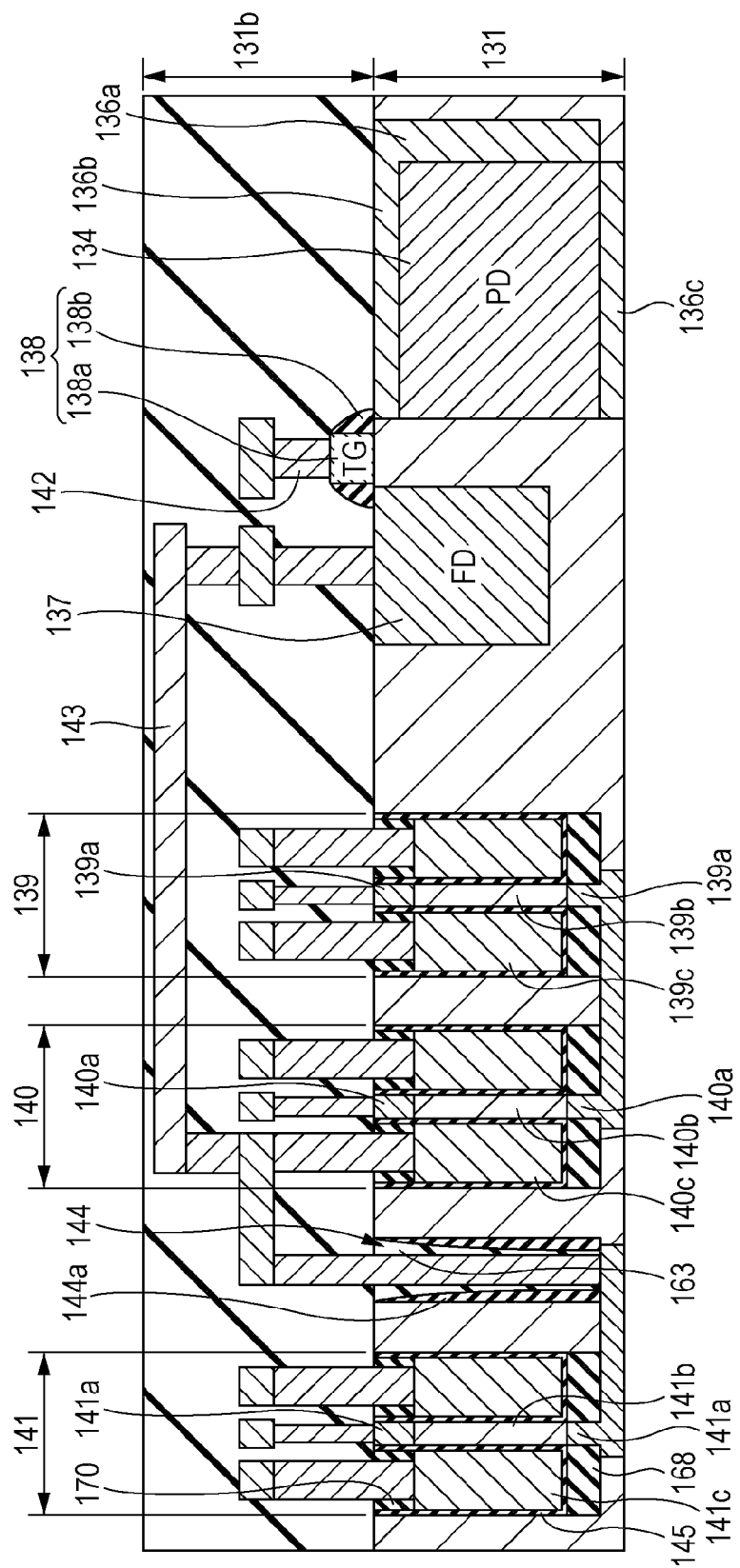
FIG. 26 is a diagram illustrating a method of manufacturing the pixel of FIG. 2.

Then, the surface of the silicon substrate 131 is affixed on a support substrate (not illustrated), and the back surface side of the silicon substrate 131 is polished, as illustrated in FIG. 25. Also, an n-type semiconductor is ion-implanted into the back surface of the silicon substrate 131 with energy ranging from about 10 keV to about 30 keV to form the source and drain regions 139a to 141a, as illustrated in FIG. 26. Accordingly, the channel regions 139b to 141b interposed between the source and drain regions 139a to 141a on the surface side and the back surface side of the silicon substrate 131 are formed. An amount of implantation is about $1\times10^{15}$ (cm$^{-2}$).

Further, the HAD 136c on the back surface side of the photodiode 134 among the HADs 136 is formed through ion implantation of a p-type semiconductor with energy ranging from 10 keV to 100 keV. An amount of implantation is about $1\times10^{13}$ (cm$^{-2}$). Heat treatment of small heat history such as LSA is used as activation annealing.

Figure 27:
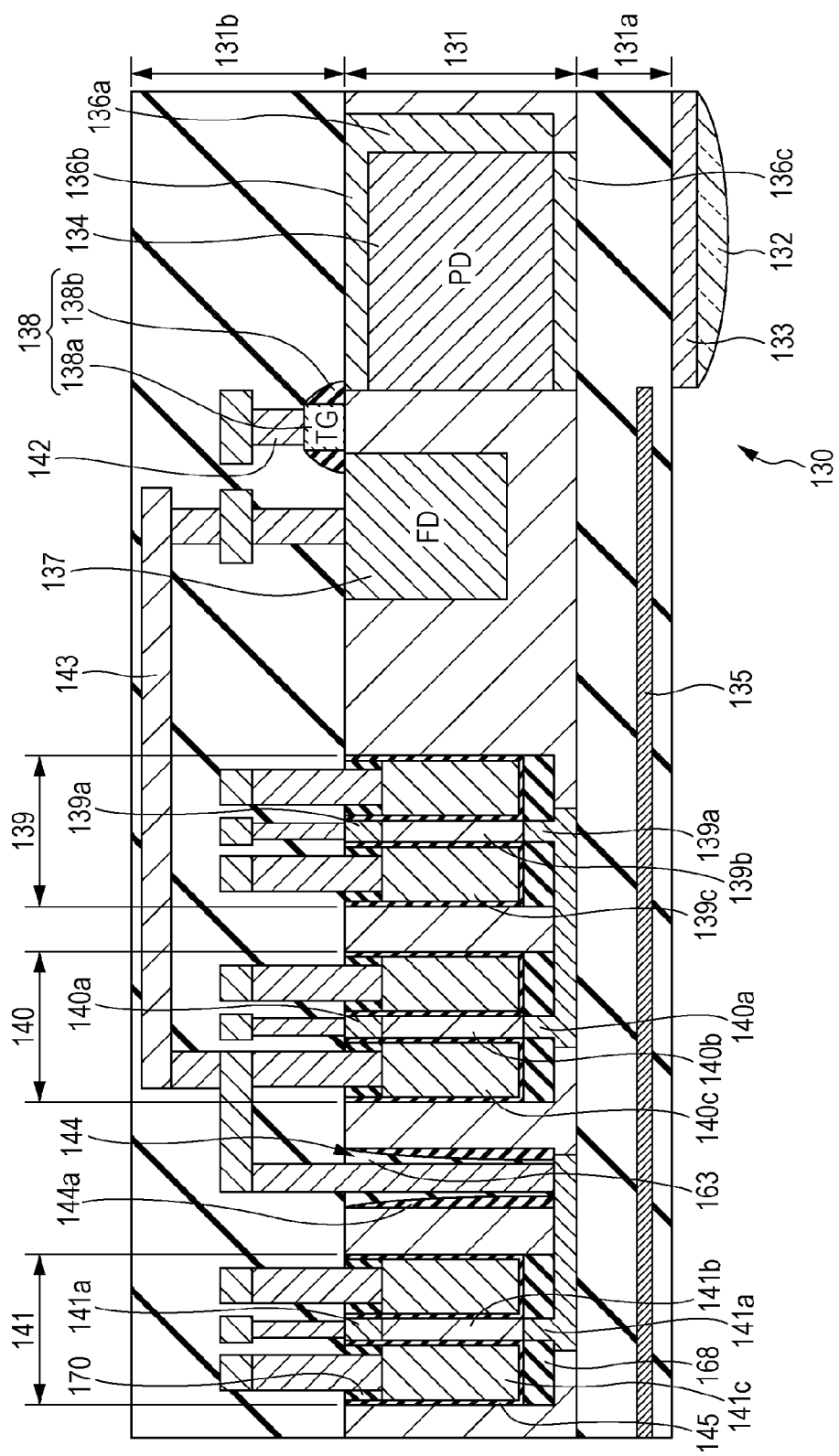
FIG. 27 is a diagram illustrating a method of manufacturing the pixel of FIG. 2.

Finally, the SiO$_2$ film 131a, the light shielding film 135, the color filter 133, and the on-chip lens 132 are formed using a normal method, as illustrated in FIG. 27, and the manufacture of the pixel 130 is completed.

Second Embodiment

Example of Configuration of Pixel of Solid-State Imaging Device According to Second Embodiment A configuration of a CMOS image sensor according to a second embodiment as the solid-state imaging device to which the present disclosure is applied is the same as that of the CMOS image sensor 100 of FIG. 1 except for a pixel. Therefore, hereinafter, only a configuration of the pixel will be described.

Figure 28:
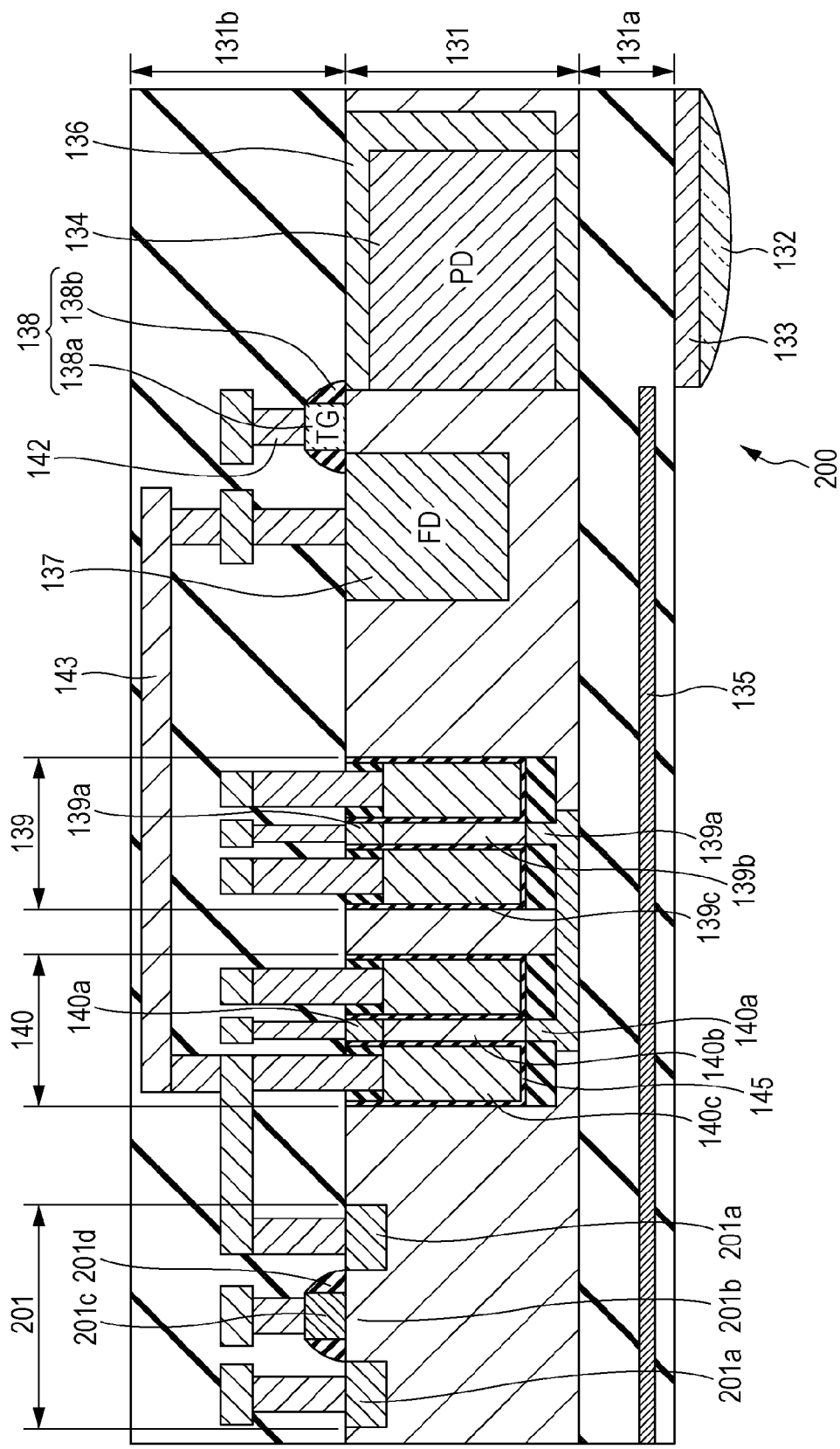
FIG. 28 is a cross-sectional view illustrating an example of a configuration of a pixel of a CMOS image sensor according to a second embodiment as the solid-state imaging device to which the present disclosure is applied.

FIG. 28 is a cross-sectional view illustrating an example of a configuration of the pixel of the CMOS image sensor according to the second embodiment as the solid-state imaging device to which the present disclosure is applied.

Among configurations illustrated in FIG. 28, the same configurations as those in FIG. 2 are denoted with the same reference signs. Repeated description is appropriately omitted.

A configuration of a pixel 200 of FIG. 28 differs from the configuration of the pixel 130 of FIG. 2 in that a reset transistor 201 is provided in place of the reset transistor 141 and that the connection portion 144 is not provided. In the pixel 200, the reset transistor includes a horizontal MOSFET.

Specifically, two source and drain regions 201a of the reset transistor 201 are formed on a surface side of a silicon substrate 131. Therefore, a channel region 201b interposed between the two source and drain regions 201a is formed in a direction that is horizontal with respect to the silicon substrate 131. A gate electrode 201c is formed on the silicon substrate 131 to face the channel region 201b and is covered by a sidewall 201d.

The source and drain region 201a on the right side of the reset transistor 201 in FIG. 28 is connected to a charge-voltage conversion unit 137 via a contact plug 142 and a wiring 143. Further, the pixel driving line 116 of FIG. 1 is connected to the gate electrode 201c via the contact plug 142. Further, the source and drain region 201a on the left side of the reset transistor 201 in FIG. 28 is connected to a power supply via the contact plug 142. When a control pulse is input to the gate electrode 201c via the pixel driving line 116 and the contact plug 142, the reset transistor 201 resets charges of the charge-voltage conversion unit 137.

Method of Manufacturing Pixel

FIGS. 29 to 48 are diagrams illustrating a method of manufacturing the pixel 200 of FIG. 28.

In FIGS. 29 to 48, the same portions as those in FIGS. 3 to 27 are denoted with the same reference signs. Repeated description is appropriately omitted.

Figure 29:
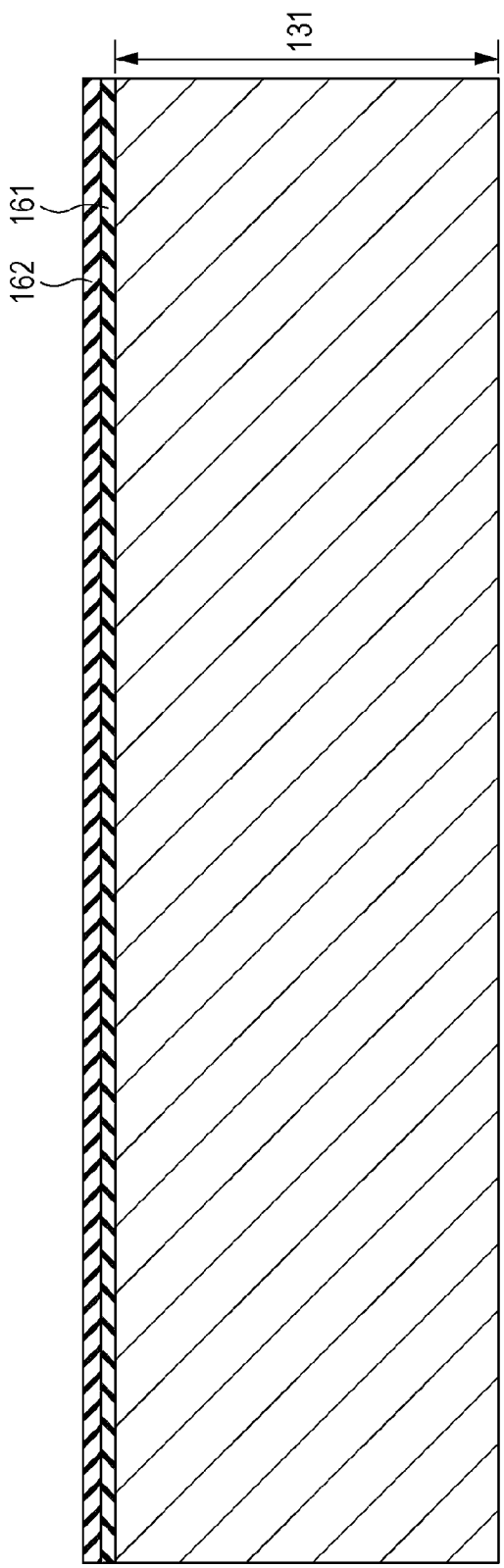
FIG. 29 is a diagram illustrating a method of manufacturing the pixel of FIG. 28.
Figure 30:
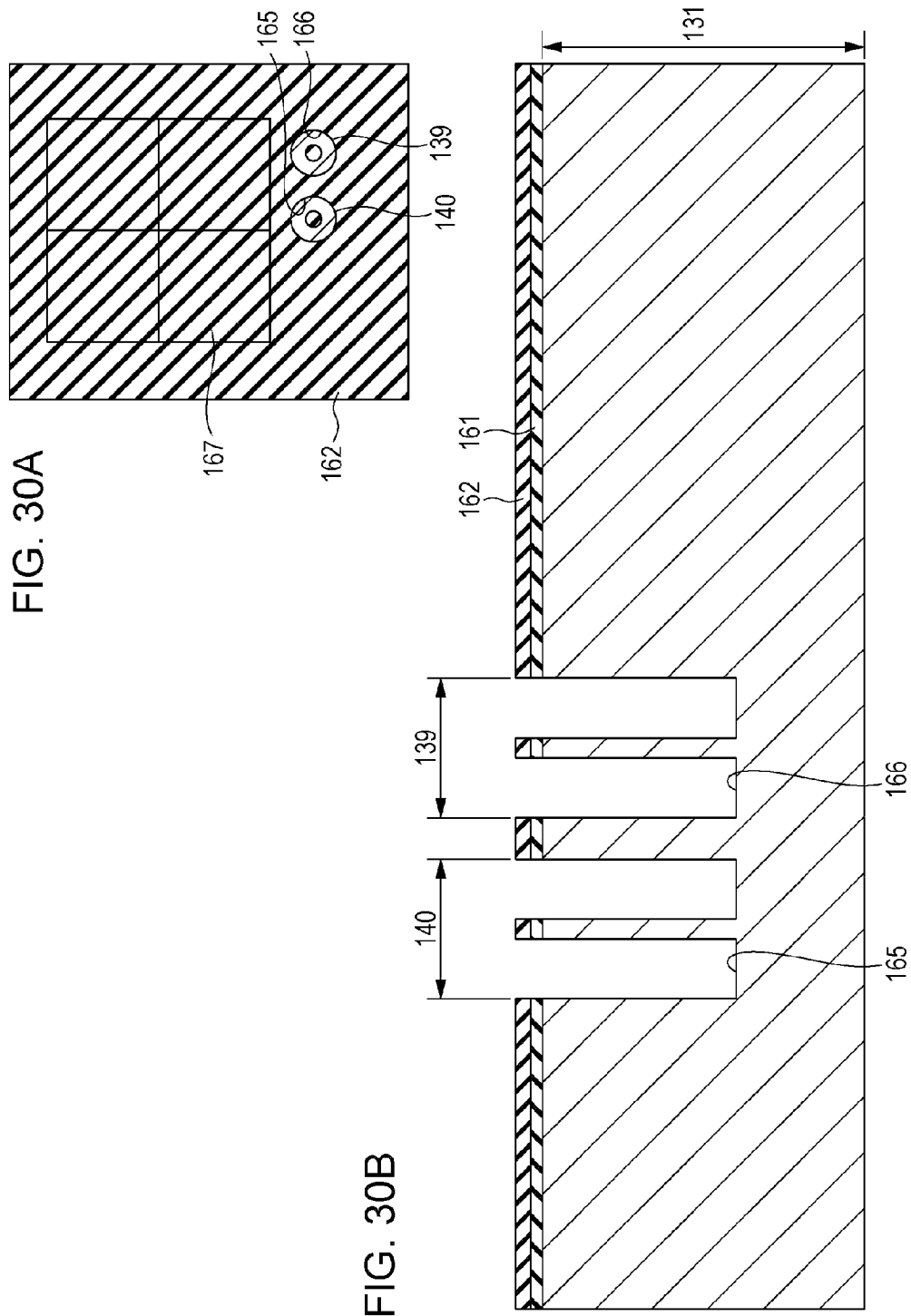
FIGS. 30A and 30B are diagrams illustrating a method of manufacturing the pixel of FIG. 28.

First, a SiO$_2$ film 161 and a SiN film 162 are formed on the surface of a silicon substrate 131, as illustrated in FIG. 29. Then, a trench 165 in a donut-cylindrical shape for an amplification transistor 140 and a trench 166 in a donut-cylindrical shape for a readout transistor 139 are formed, as illustrated in FIG. 30B.

A region around the reset transistor 201, the amplification transistor 140 and the readout transistor 139 viewed from the surface side of the silicon substrate 131 is as illustrated in FIG. 30A. An imaging region 167 is collectively arranged in every four pixels 200, as illustrated in FIG. 30A.

Figure 31:
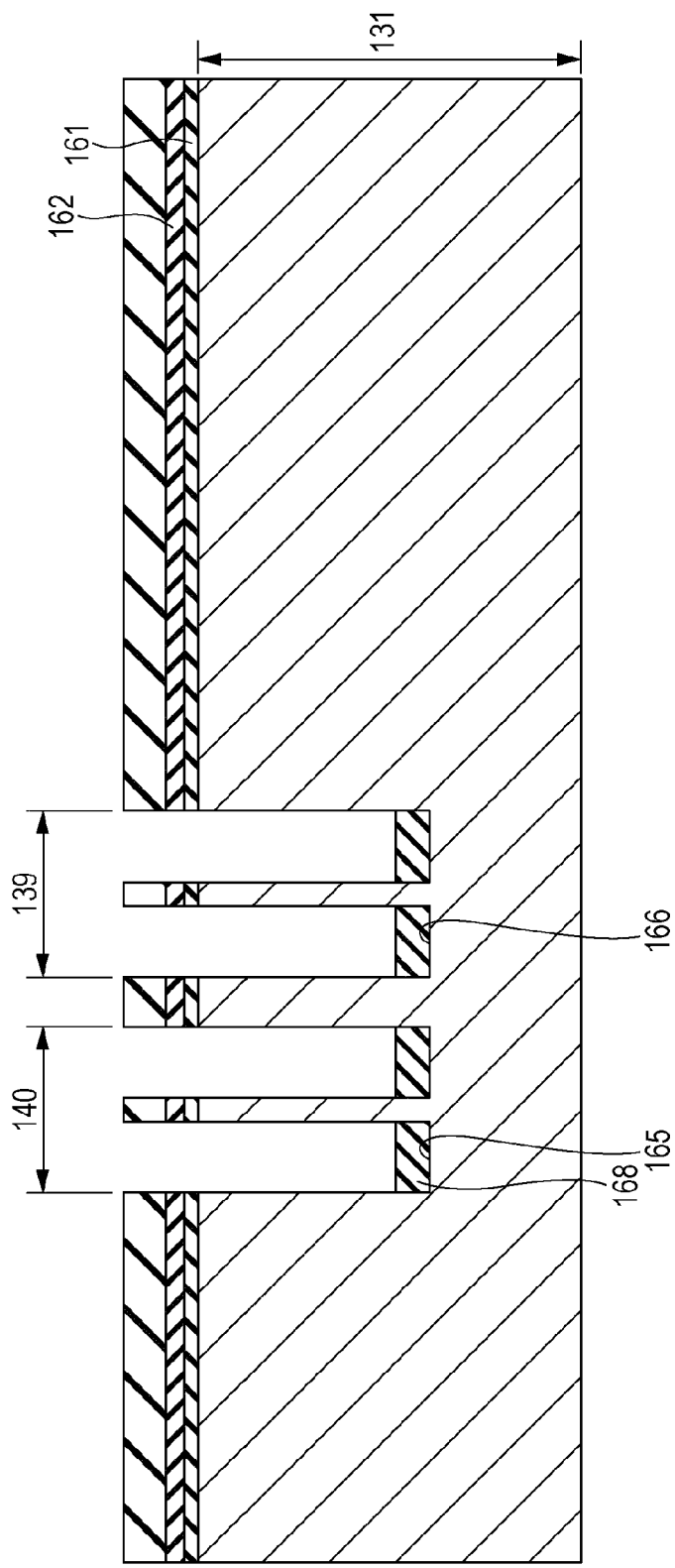
FIG. 31 is a diagram illustrating a method of manufacturing the pixel of FIG. 28.
Figure 32:
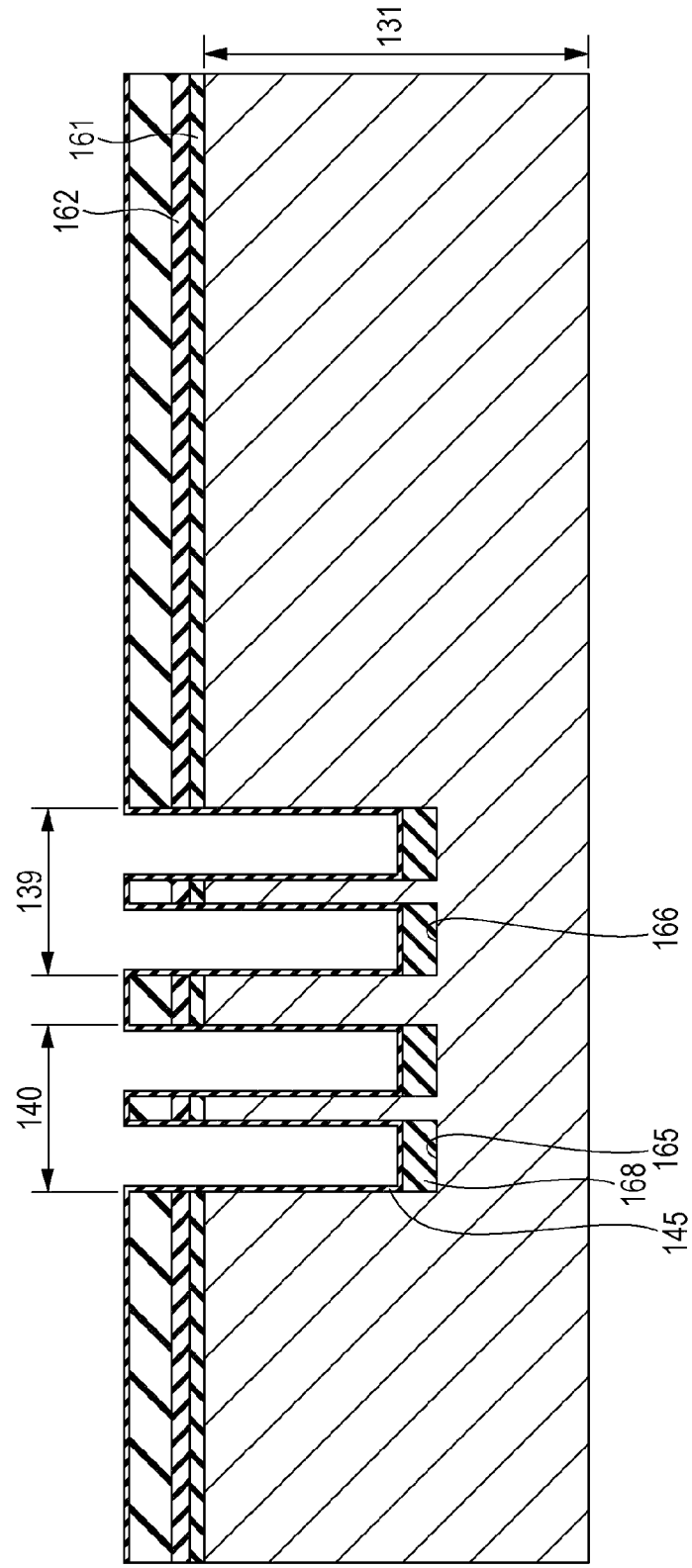
FIG. 32 is a diagram illustrating a method of manufacturing the pixel of FIG. 28.

After the formation of the trench 165 and the trench 166, a SiO$_2$ film 168 is anisotropically buried similar to the case of FIG. 9, as illustrated in FIG. 31. Also, a gate insulating film 145 is formed similar to the case of FIG. 10, as illustrated in FIG. 32.

Figure 33:
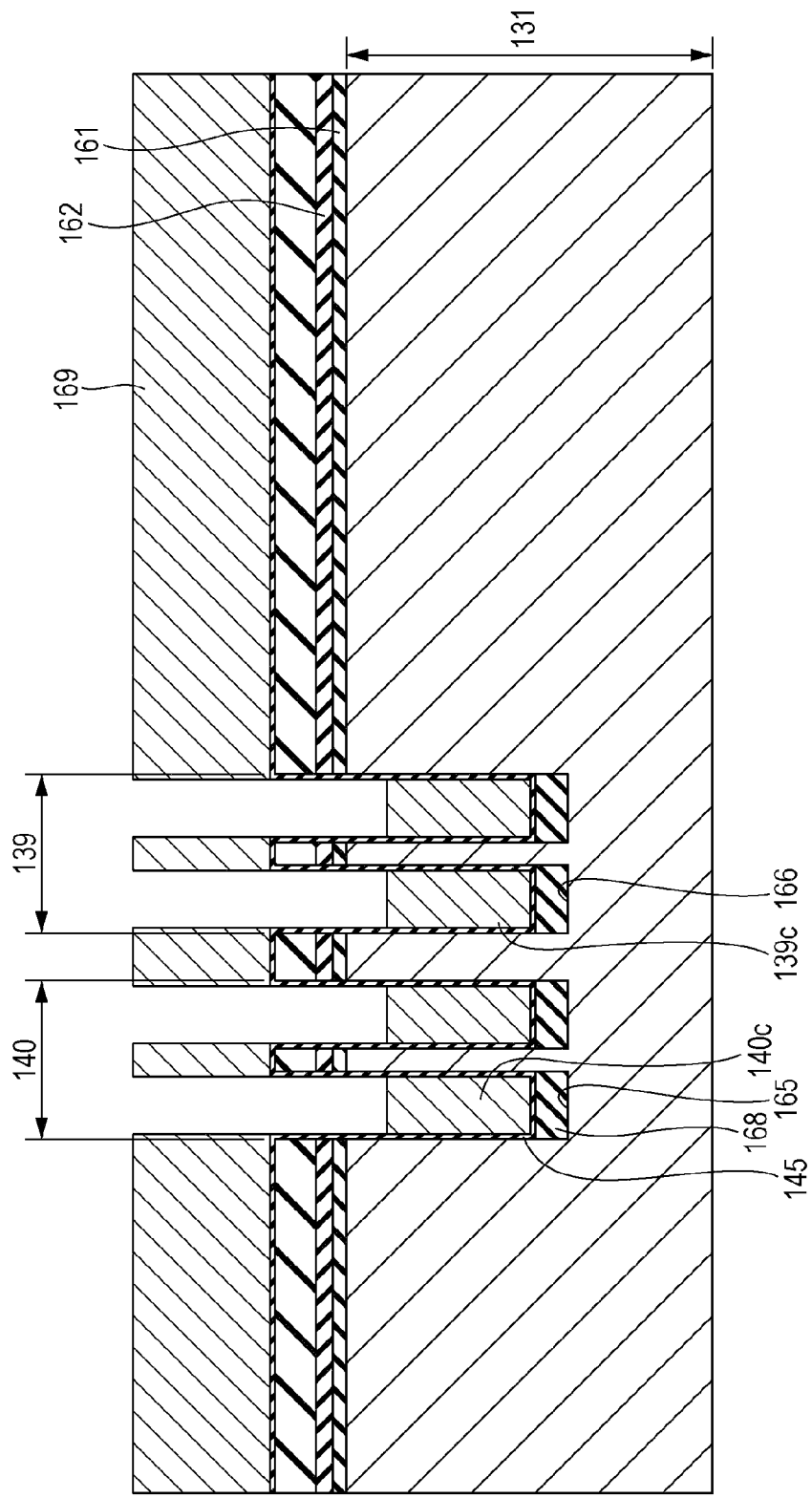
FIG. 33 is a diagram illustrating a method of manufacturing the pixel of FIG. 28.
Figure 34:
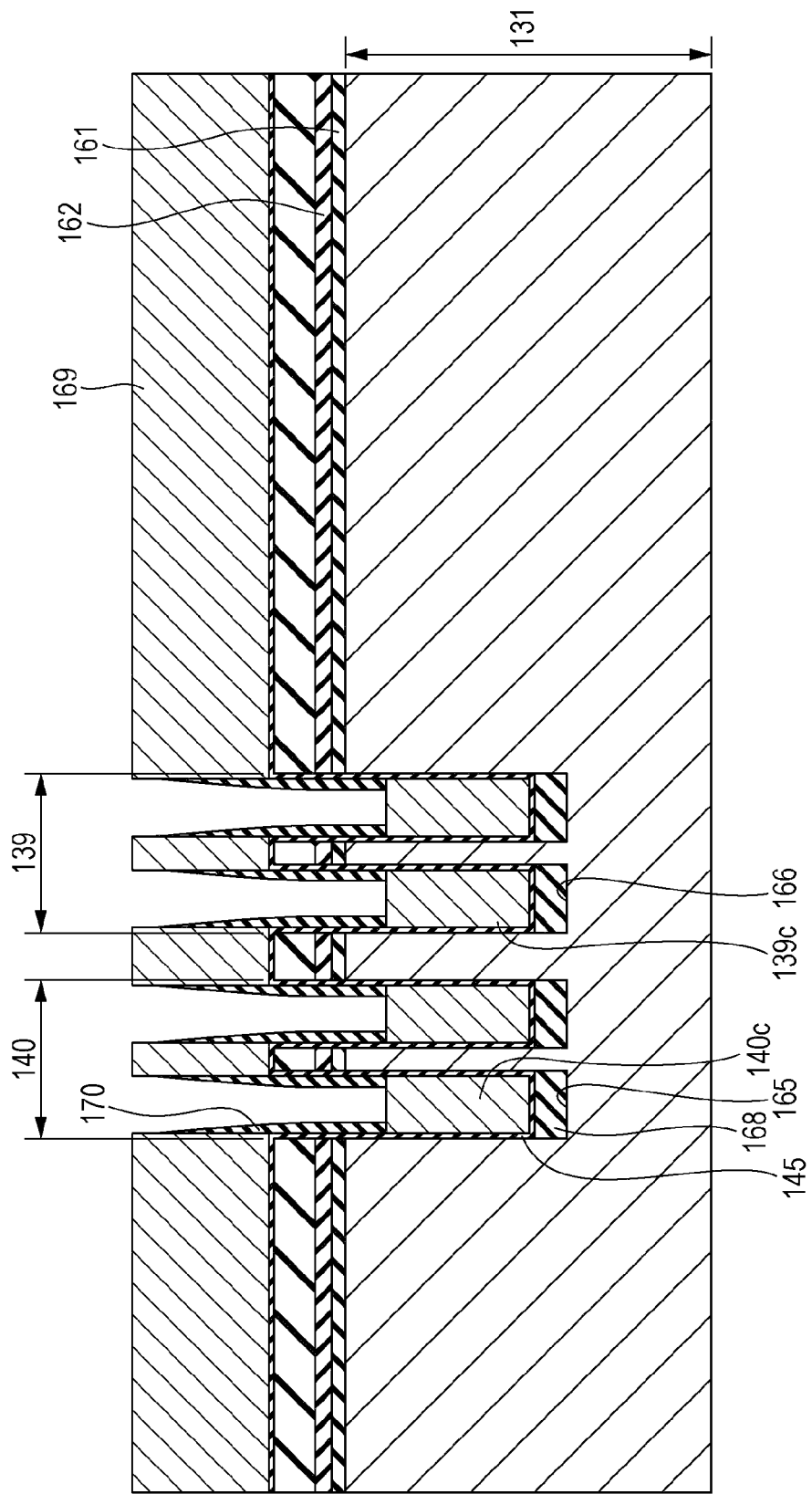
FIG. 34 is a diagram illustrating a method of manufacturing the pixel of FIG. 28.
Figure 35:
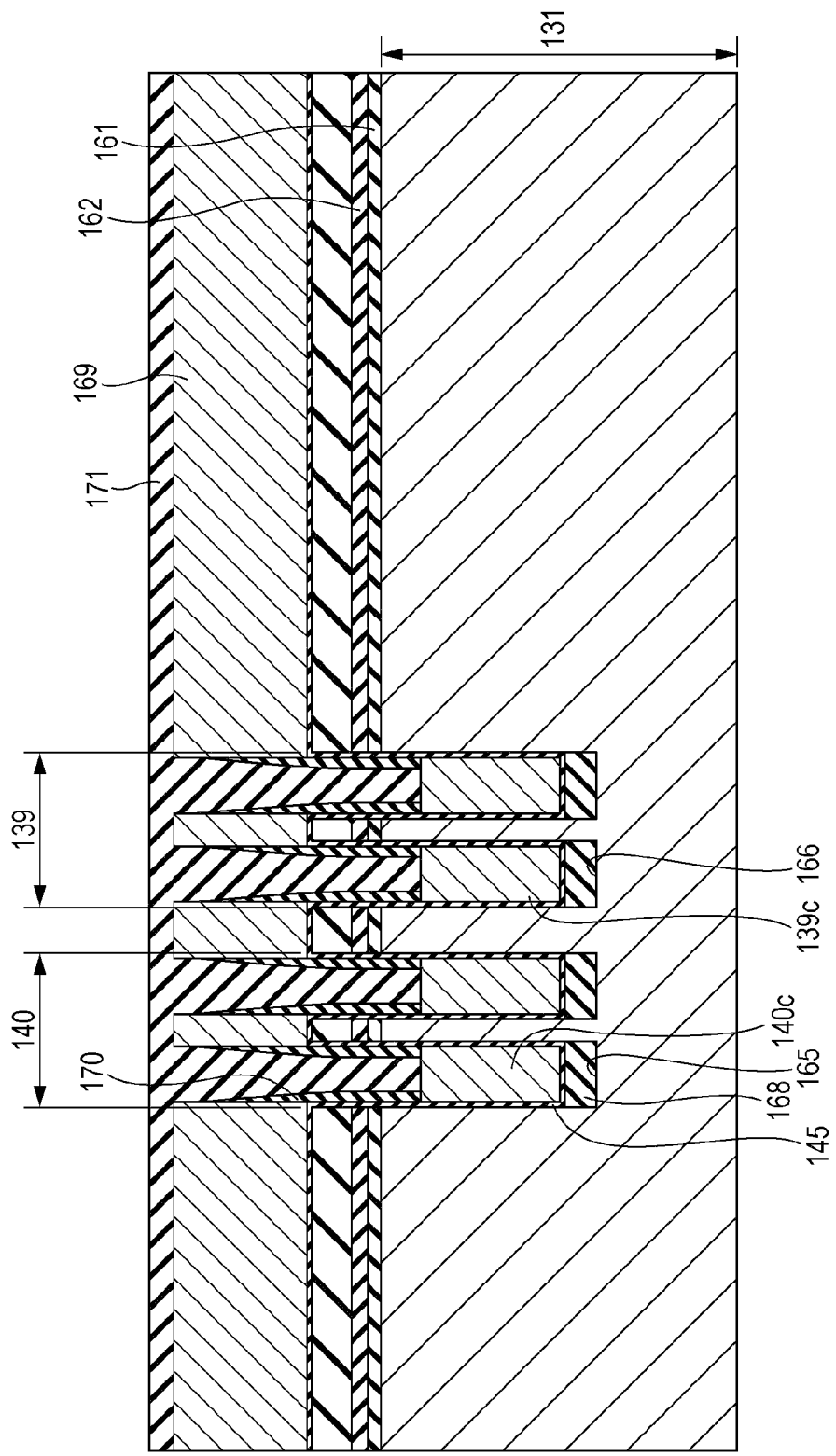
FIG. 35 is a diagram illustrating a method of manufacturing the pixel of FIG. 28.
Figure 36:
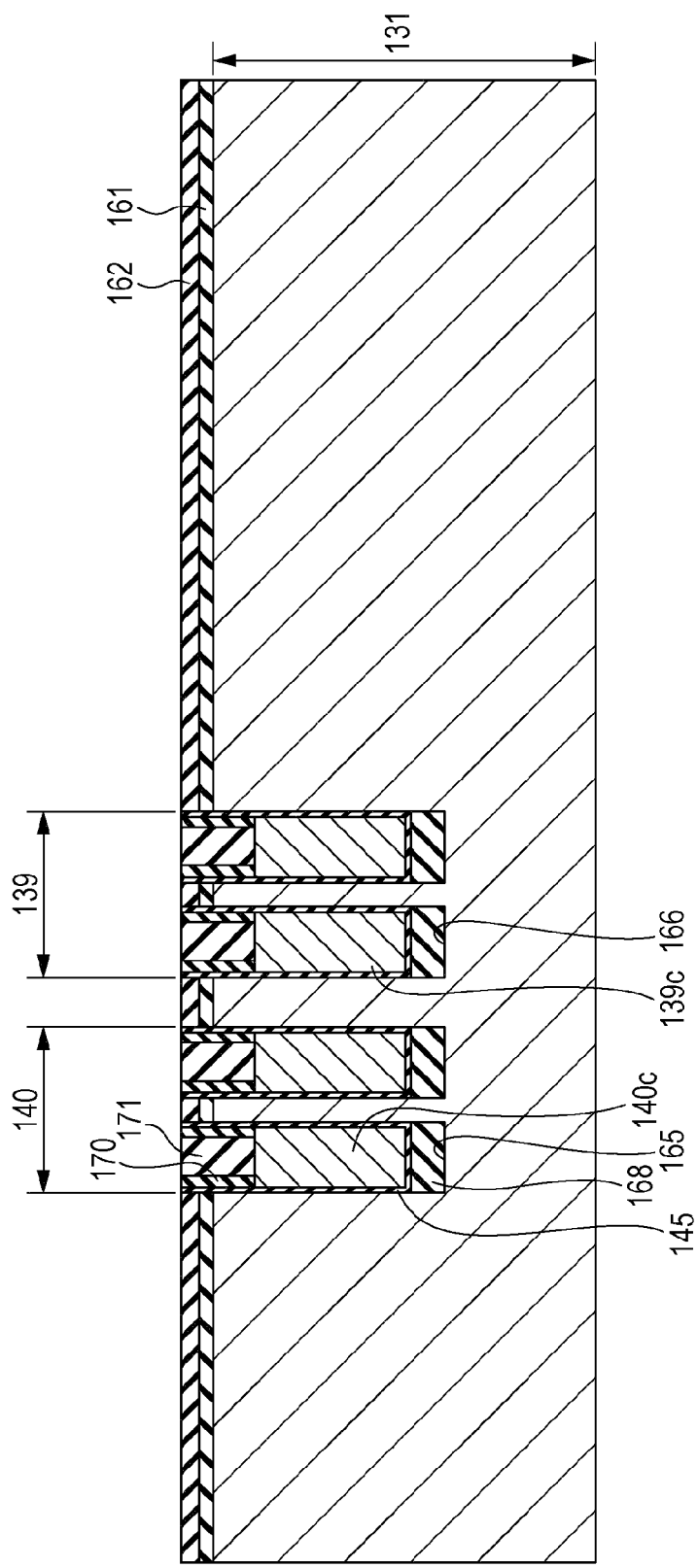
FIG. 36 is a diagram illustrating a method of manufacturing the pixel of FIG. 28.

A metal material 169 is buried as a gate electrode 139c and a gate electrode 140c in the trench 165 and the trench 166 similar to the case of FIG. 11, as illustrated in FIG. 33. Then, a SiN film 170 is formed on sidewalls of the trench 165 and the trench 166, as illustrated in FIG. 34. Then, a SiO$_2$ film 171 is buried in the trench 165 and the trench 166, as illustrated in FIG. 35. Also, the SiO$_2$ film 168 is removed similar to FIG. 14, as illustrated in FIG. 36.

Figure 37:
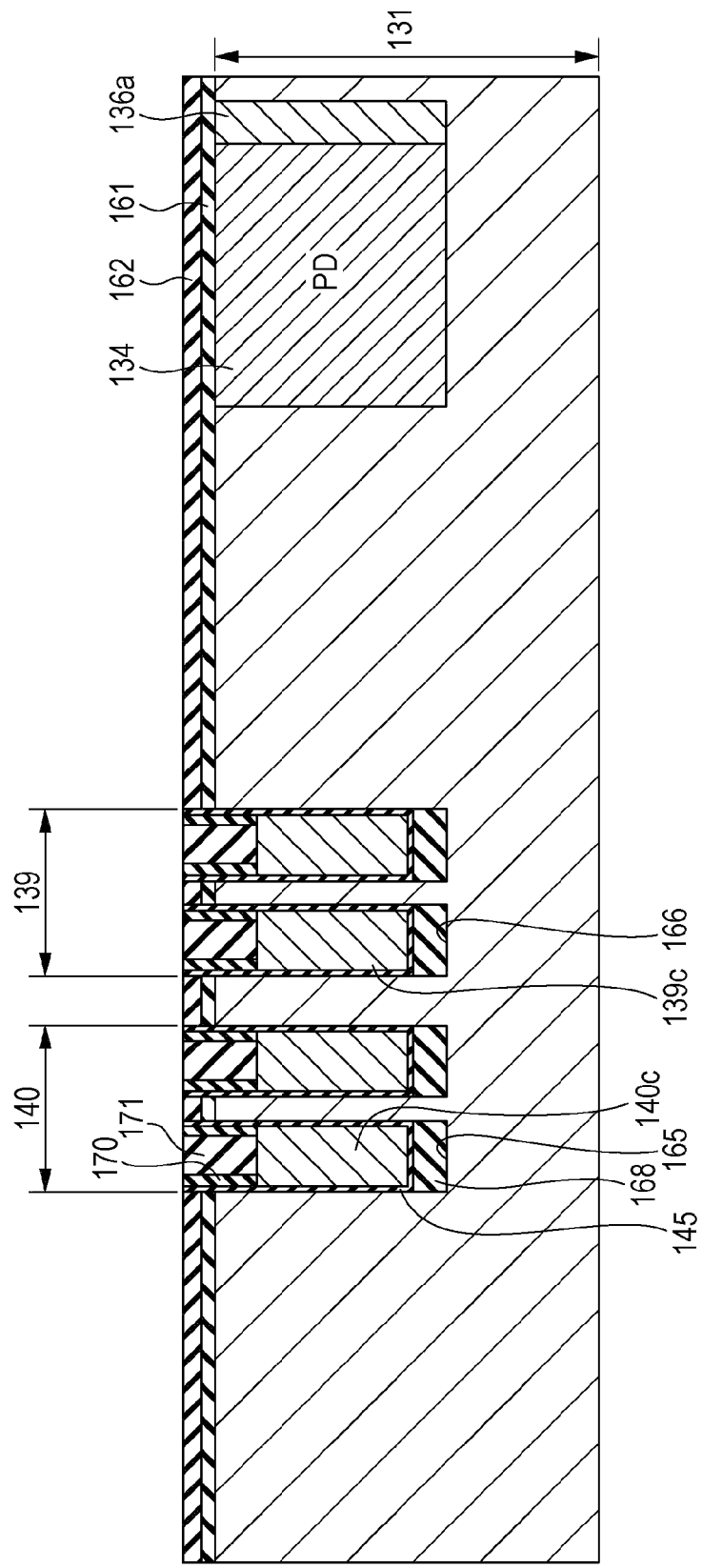
FIG. 37 is a diagram illustrating a method of manufacturing the pixel of FIG. 28.

Then, a photodiode 134 and a HAD 136a are formed through an ion implantation similar to the case of FIG. 15, as illustrated in FIG. 37. Also, the SiN film 162 is removed and the SiO$_2$ film 161 is removed similar to the case of FIGS. 16A and 16B, as illustrated in FIGS. 38A and 38B. Also, a transfer transistor 138, and a gate electrode 201c and a sidewall 201d of the reset transistor 201 are formed, as illustrated in FIGS. 39A and 39B.

Specifically, the gate electrode 138a and the gate electrode 201c are formed by forming a gate insulating film having a film thickness of about 6 nm, forming a Poly-Si film to about 150 nm, and performing dry etching using lithographic patterning. Then, the sidewall 138b and the sidewall 201d are formed using a SiO$_2$ film and a SiN film.

A film thickness of the $SiO_2$ film of the sidewall 138b and the sidewall 201d is about 20 nm, and a film thickness of the SiN film is about 50 nm.

Figure 40A:
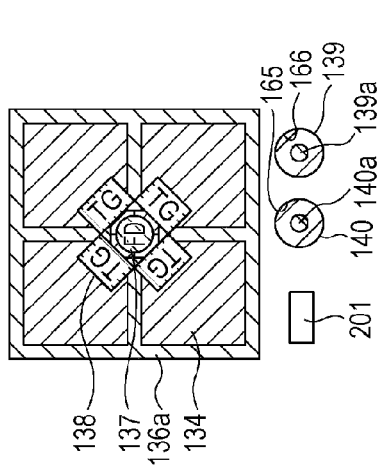
FIGS. 40A and 40B are diagrams illustrating a method of manufacturing the pixel of FIG. 28.
Figure 40B:
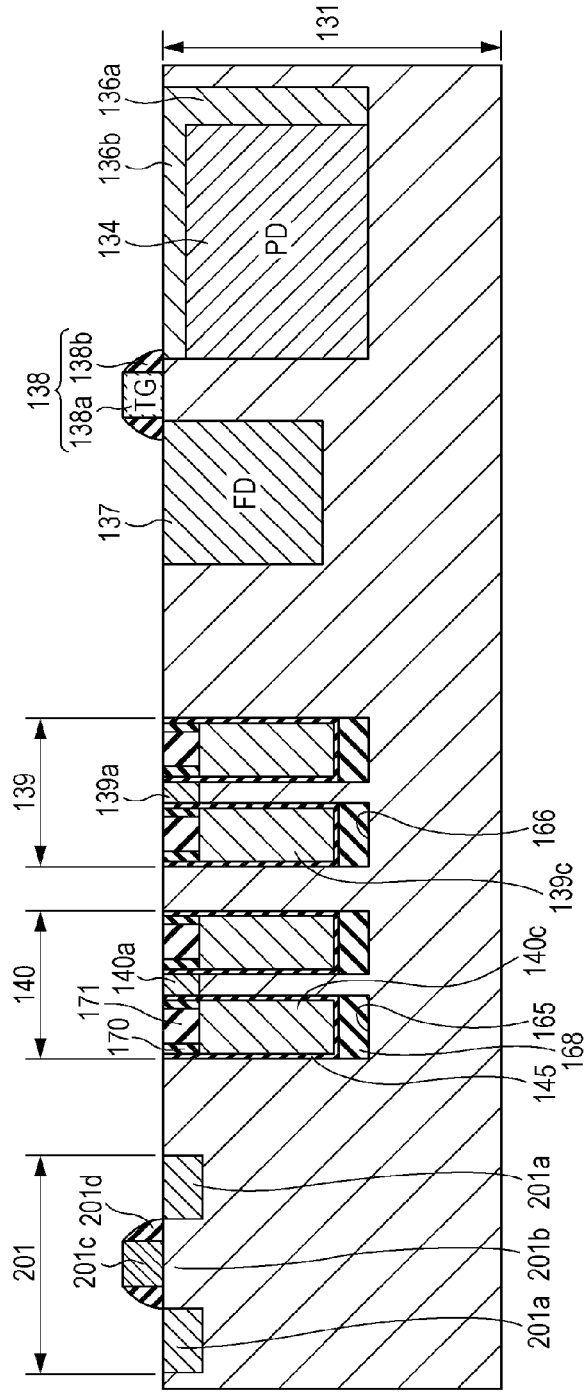

Then, the source and drain regions 139a, 140a and 201a are formed on the surface of the silicon substrate 131 by performing ion implantation of an n-type semiconductor with energy ranging from about 10 keV to about 30 keV, as illustrated in FIG. 40B. An amount of implantation is about $1 \times 10^{15}$ (cm$^{-2}$). A charge-voltage conversion unit 137 is formed through ion implantation under the same conditions, as illustrated in FIGS. 40A and 40B. As activation annealing, Spike RTA of 1000° C. to 1100° C. is performed. Further, a HAD 136b is formed similar to the case of FIGS. 18A and 18B.

Figure 41:
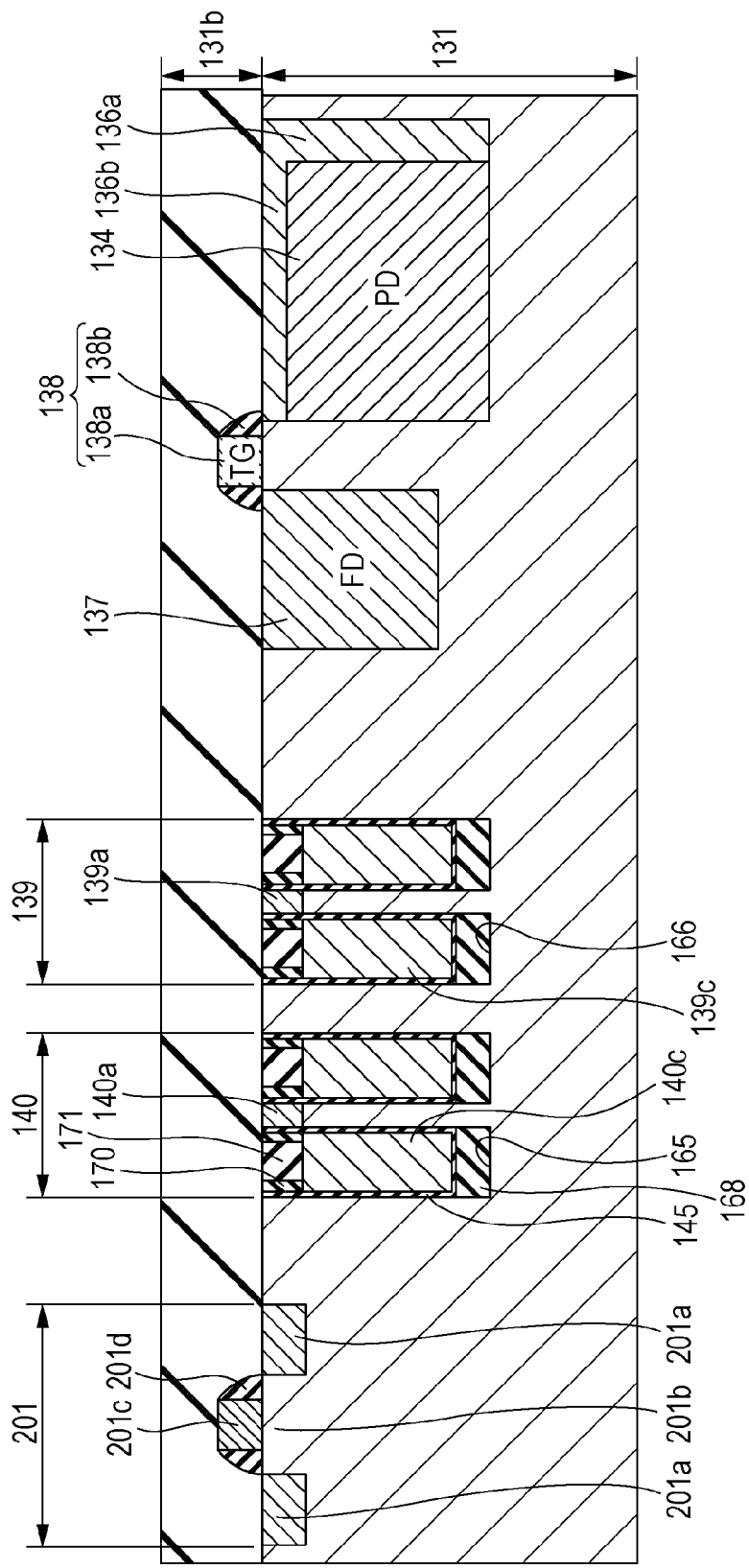
FIG. 41 is a diagram illustrating a method of manufacturing the pixel of FIG. 28.
Figure 42:
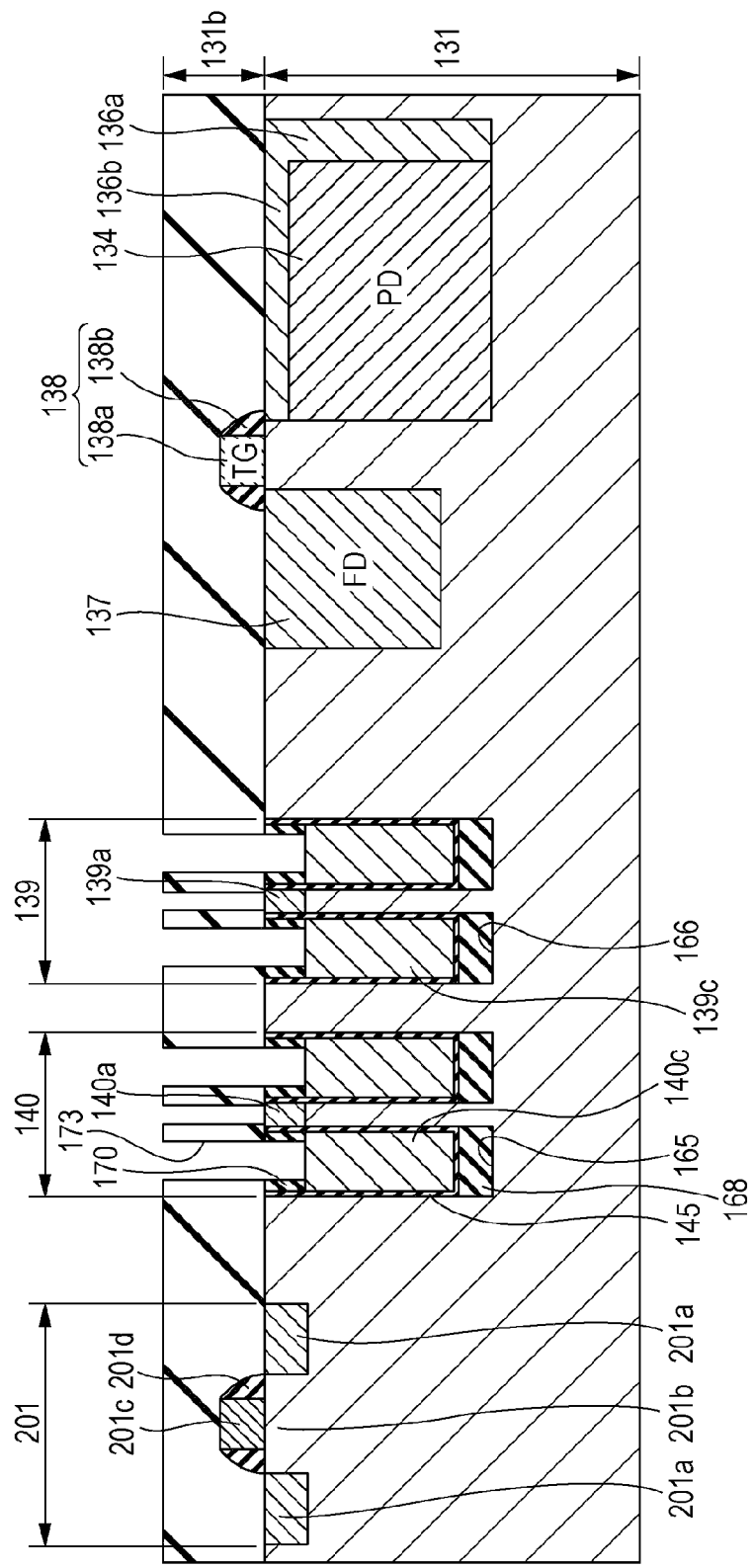
FIG. 42 is a diagram illustrating a method of manufacturing the pixel of FIG. 28.
Figure 43:
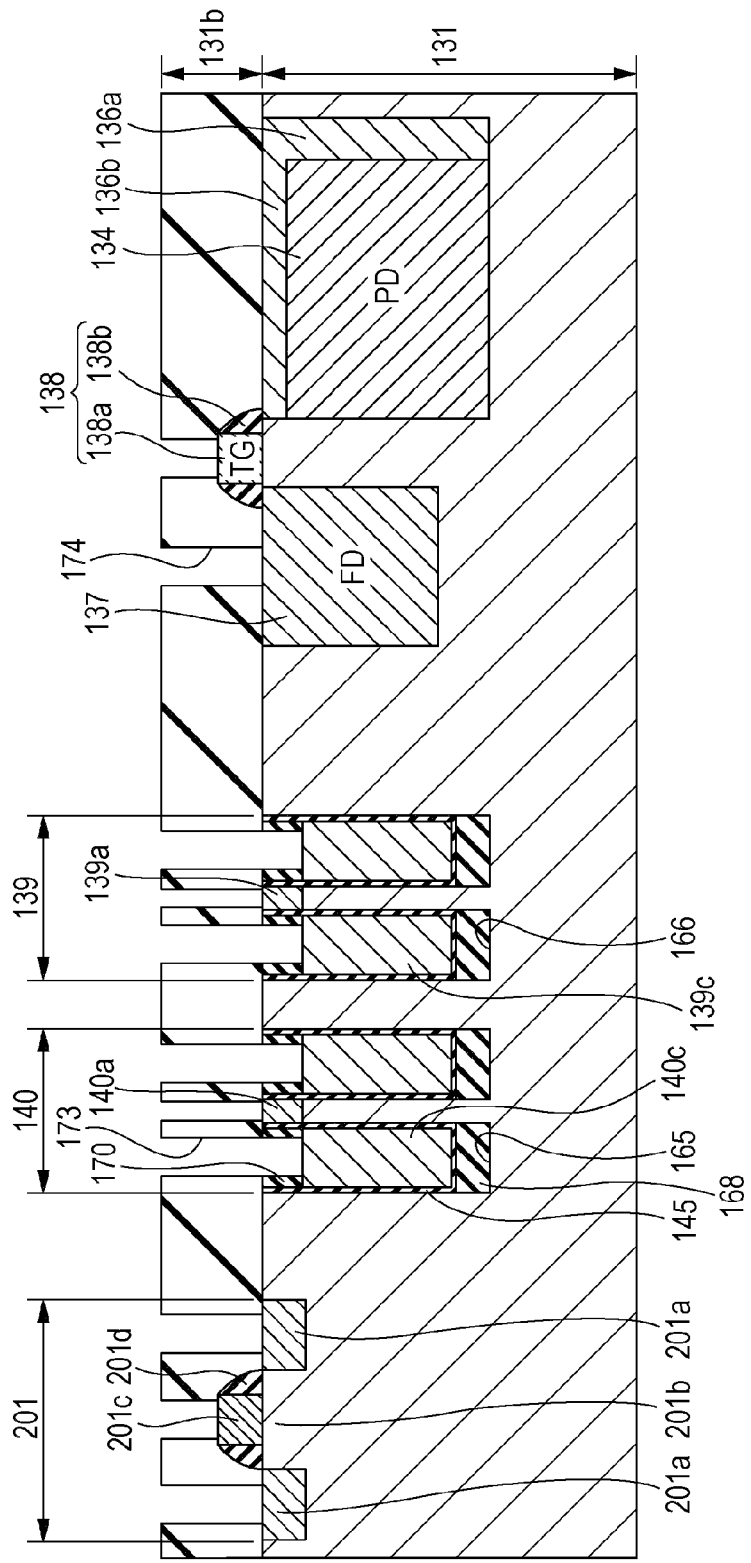
FIG. 43 is a diagram illustrating a method of manufacturing the pixel of FIG. 28.

Then, a $SiO_2$ film 131b is formed similar to the case of FIG. 19, as illustrated in FIG. 41. Also, shallow trenches 173 are formed in the $SiO_2$ film 131b of the trench 165 and the trench 166 similar to the case of FIG. 21, as illustrated in FIG. 42. Further, a shallower trench 174 is formed in the $SiO_2$ film 131b on the surface side of the charge-voltage conversion unit 137 and the transfer transistor 138 similar to the case of FIG. 22, as illustrated in FIG. 43.

Figure 44:
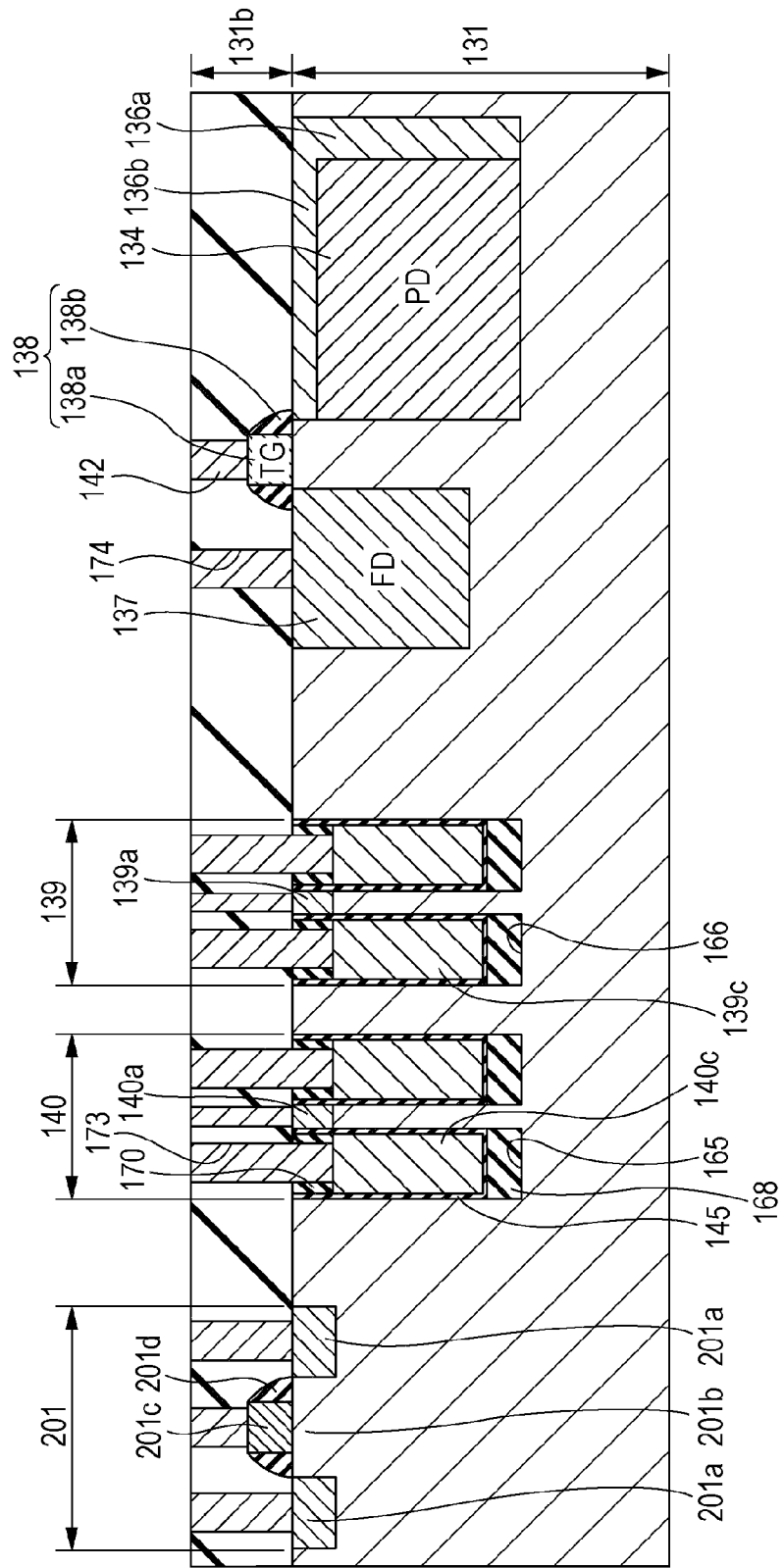
FIG. 44 is a diagram illustrating a method of manufacturing the pixel of FIG. 28.
Figure 45:
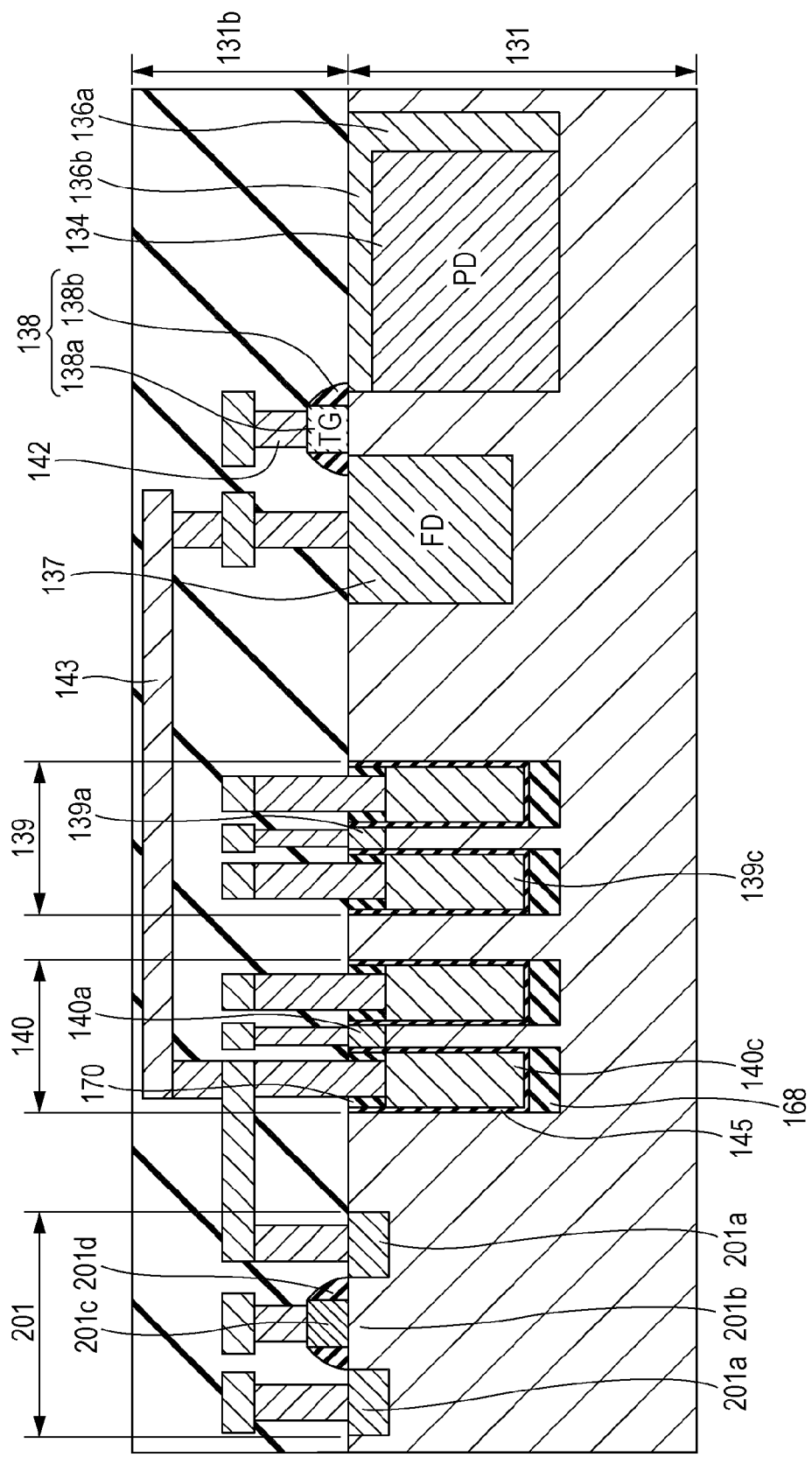
FIG. 45 is a diagram illustrating a method of manufacturing the pixel of FIG. 28.

Then, a contact plug 142 is buried in the shallow trench 173 and the shallower trench 174 similar to the case of FIG. 23, as illustrated in FIG. 44. Also, a wiring 143 is formed to be connected with the contact plug 142, as illustrated in FIG. 45.

Figure 46:
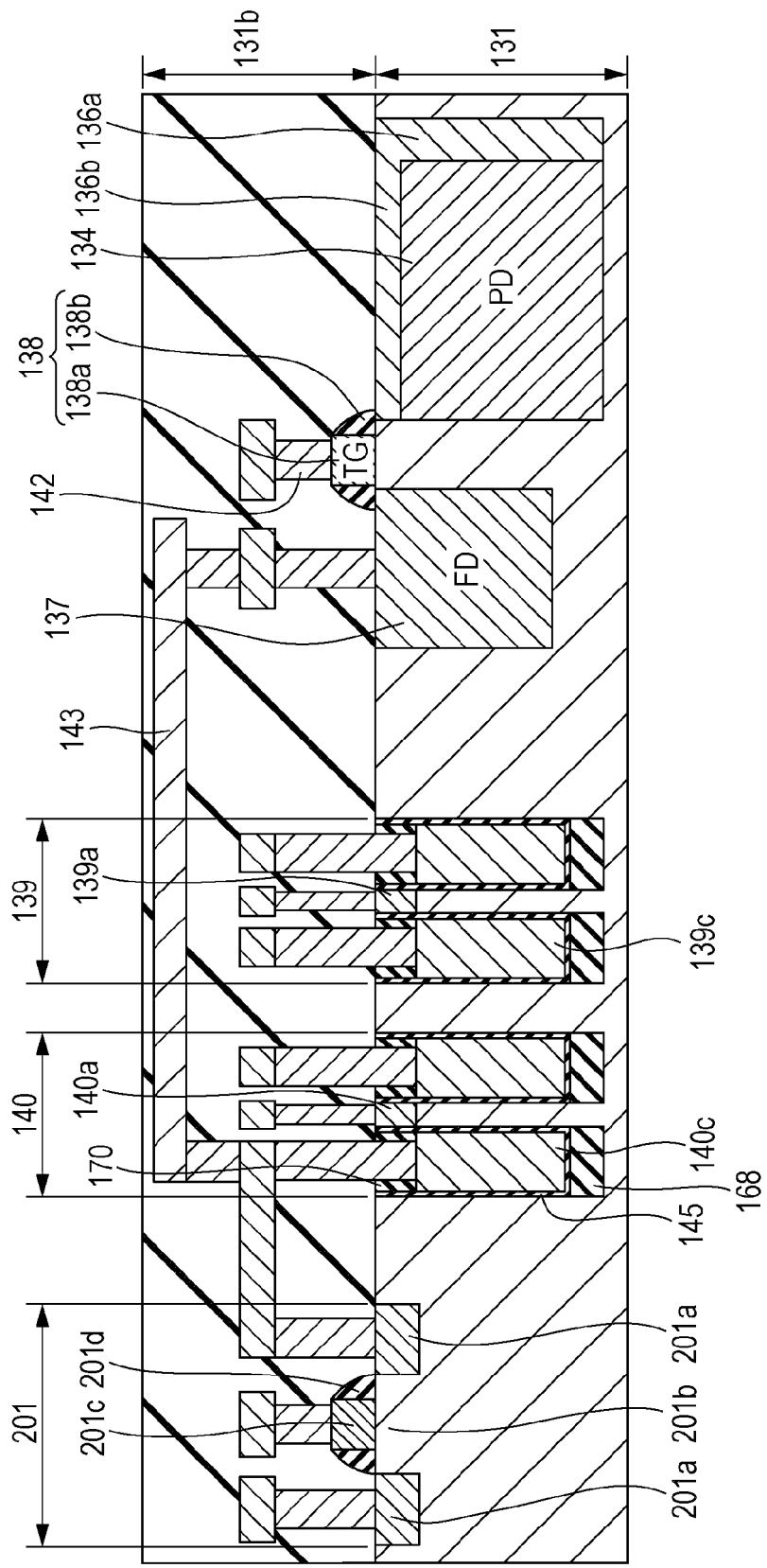
FIG. 46 is a diagram illustrating a method of manufacturing the pixel of FIG. 28.
Figure 47:
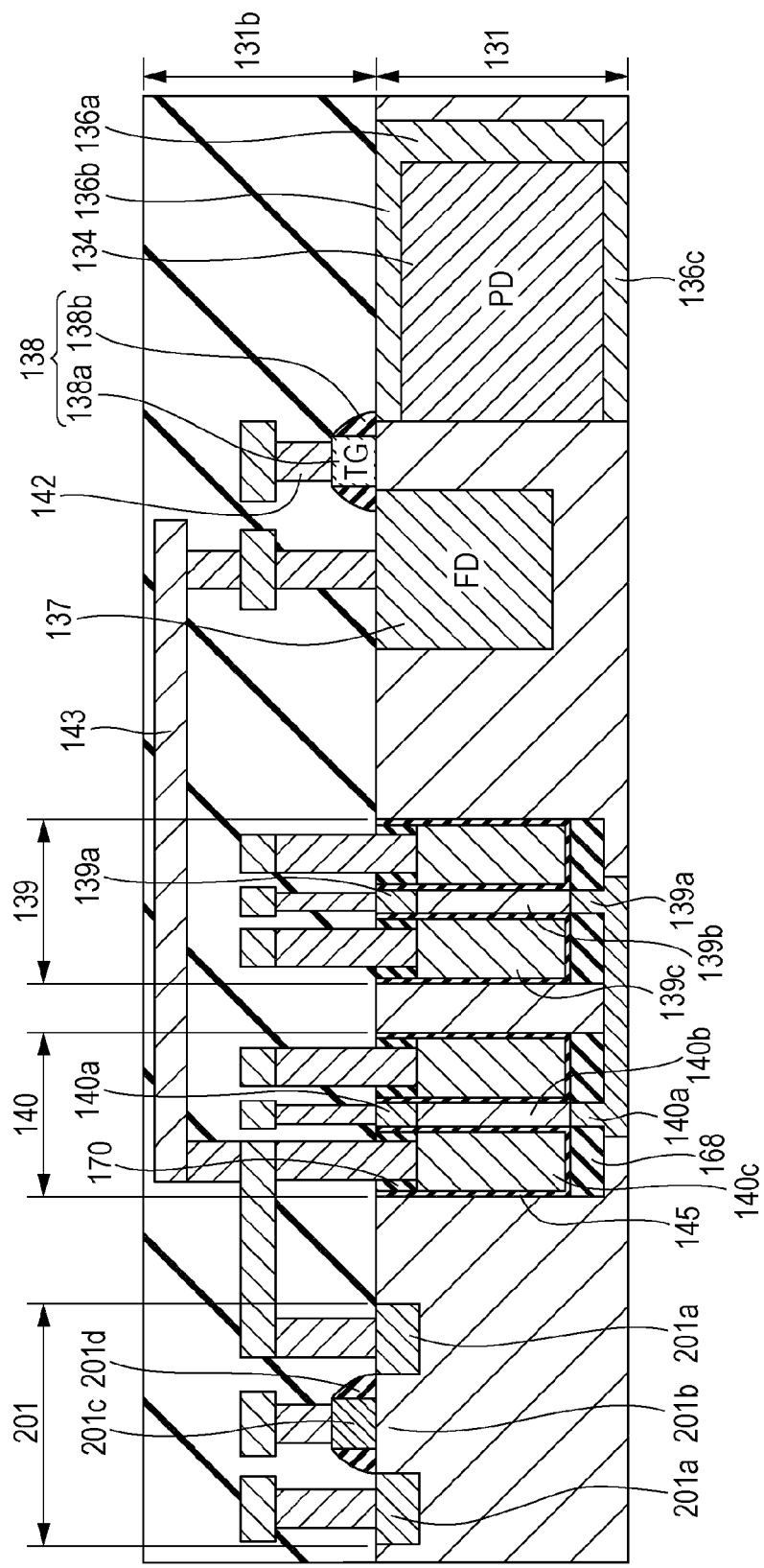
FIG. 47 is a diagram illustrating a method of manufacturing the pixel of FIG. 28.

Then, a back surface side of the silicon substrate 131 is polished similar to the case of FIG. 25, as illustrated in FIG. 46. Also, a source and drain region 139a and a source and drain region 140a on the back surface side of the silicon substrate 131 are formed similar to the case of FIG. 26, as illustrated in FIG. 47. Further, a HAD 136c is formed similar to the case of FIG. 26.

Figure 48:
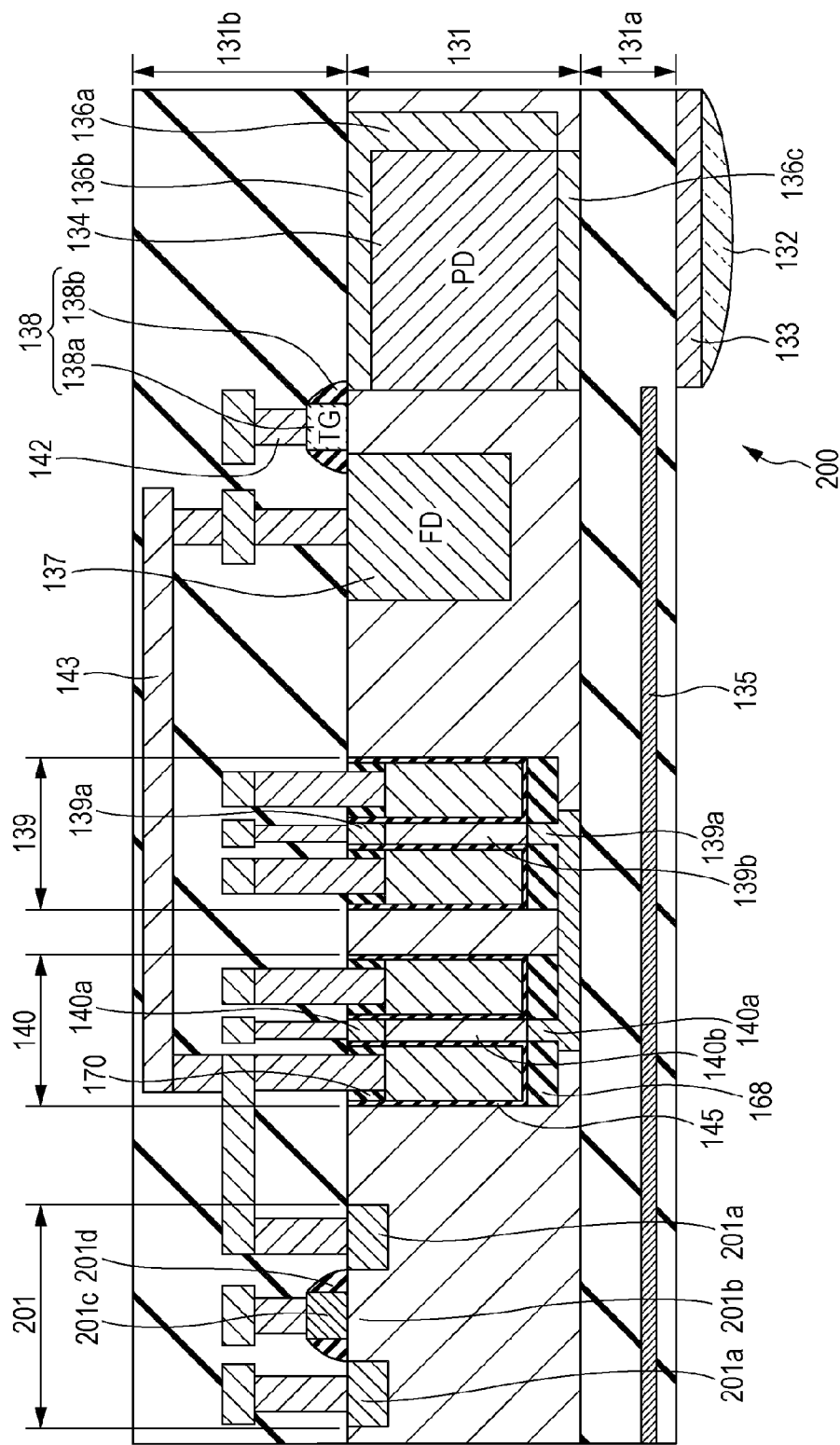
FIG. 48 is a diagram illustrating a method of manufacturing the pixel of FIG. 28.

Finally, a $SiO_2$ film 131a, a light shielding film 135, a color filter 133, and an on-chip lens 132 are formed using a normal method as illustrated in FIG. 48, and the manufacture of the pixel 200 is completed.

Third Embodiment

Example of Configuration of Pixel of Solid-State Imaging Device According to Third Embodiment A configuration of a CMOS image sensor according to a third embodiment as the solid-state imaging device to which the present disclosure is applied is the same as the configuration of the CMOS image sensor 100 of FIG. 1 except for a pixel. Therefore, hereinafter, only a configuration of the pixel will be described.

Figure 49:
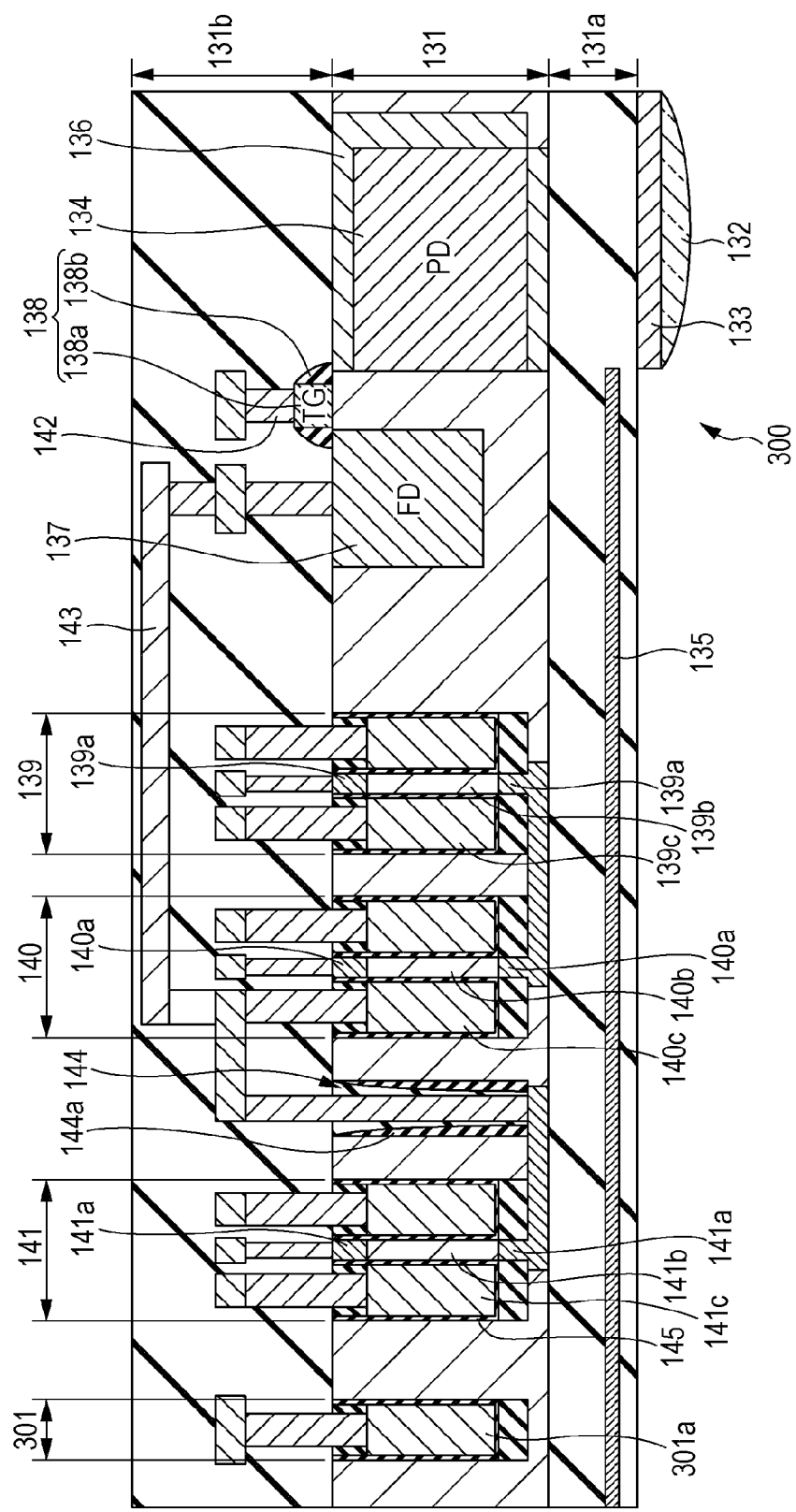
FIG. 49 is a cross-sectional view illustrating an example of a configuration of a pixel of a CMOS image sensor according to a third embodiment as the solid-state imaging device to which the present disclosure is applied.

FIG. 49 is a cross-sectional view illustrating an example of a configuration of a pixel in the CMOS image sensor according to the third embodiment as the solid-state imaging device to which the present disclosure is applied.

Among configurations illustrated in FIG. 49, the same configurations as those in FIG. 2 are denoted with the same reference signs. Repeated description is appropriately omitted.

A configuration of a pixel 300 of FIG. 49 differs from that of the pixel 130 of FIG. 2 in that a trench type capacitor (capacitive element) 301 is newly provided.

A gate electrode 301a of the capacitor 301 is connected to a circuit (not illustrated) via a contact plug 142, and holds charges that are supplied from this circuit.

Fourth Embodiment

Example of configuration of CMOS circuit of solid-state imaging device according to fourth embodiment Since a configuration of the CMOS image sensor according to a fourth embodiment as the solid-state imaging device to which the present disclosure is applied is the same as that of the CMOS image sensor 100 of FIG. 2 except for a configuration of a CMOS circuit included in each unit other than a pixel array unit 111, only the CMOS circuit will be described.

Figure 50:
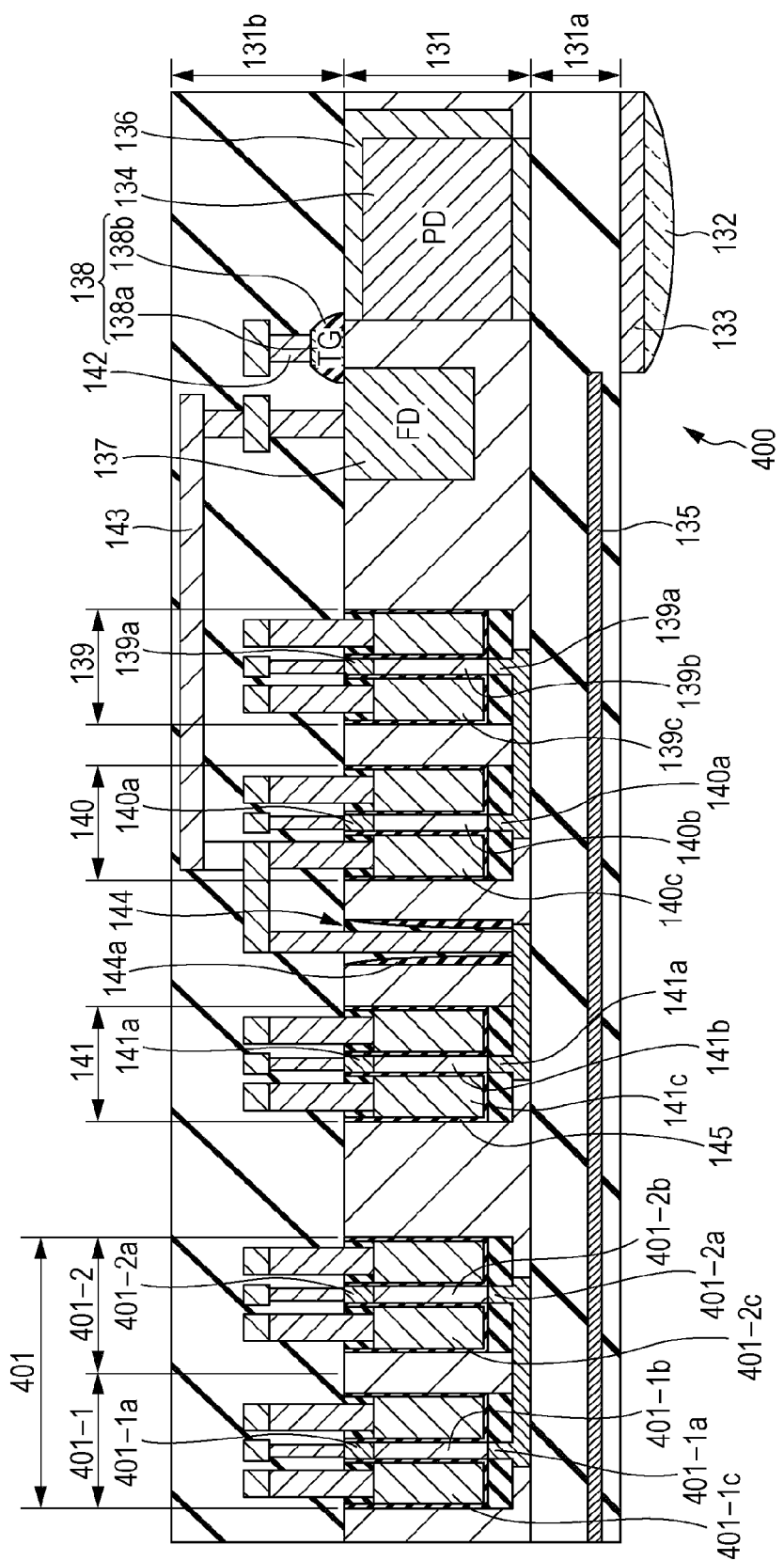
FIG. 50 is a cross-sectional view illustrating an example of a configuration of a CMOS circuit in a CMOS image sensor according to a fourth embodiment as the solid-state imaging device to which the present disclosure is applied.

FIG. 50 is a cross-sectional view illustrating an example of a configuration of the CMOS circuit included in each unit other than the pixel array unit 111 in the CMOS image sensor according to the fourth embodiment as the solid-state imaging device to which the present disclosure is applied.

A CMOS circuit 401 of FIG. 50 includes a vertical MOSFET 401-1 of which a channel region 401-1b is formed in a direction perpendicular to a silicon substrate 131, and a vertical MOSFET 401-2 of which a channel region 401-2b is formed in a direction perpendicular to the silicon substrate 131. A source and drain region 401-1a on the back surface side of the MOSFET 401-1 and a source and drain region 401-2a on the back surface side of the MOSFET 401-2 are connected.

Further, while the CMOS circuit 401 includes the two vertical MOSFETs in the example of FIG. 50, the number of vertical MOSFETs constituting the CMOS circuit 401 is not limited thereto.

Fifth Embodiment

Example of configuration of pixel of solid-state imaging device according to fifth embodiment A configuration of a CMOS image sensor according to a fifth embodiment as the solid-state imaging device to which the present disclosure is applied is the same as that of the CMOS image sensor 100 of FIG. 1 except for a pixel. Therefore, hereinafter, only a configuration of the pixel will be described.

Figure 51:
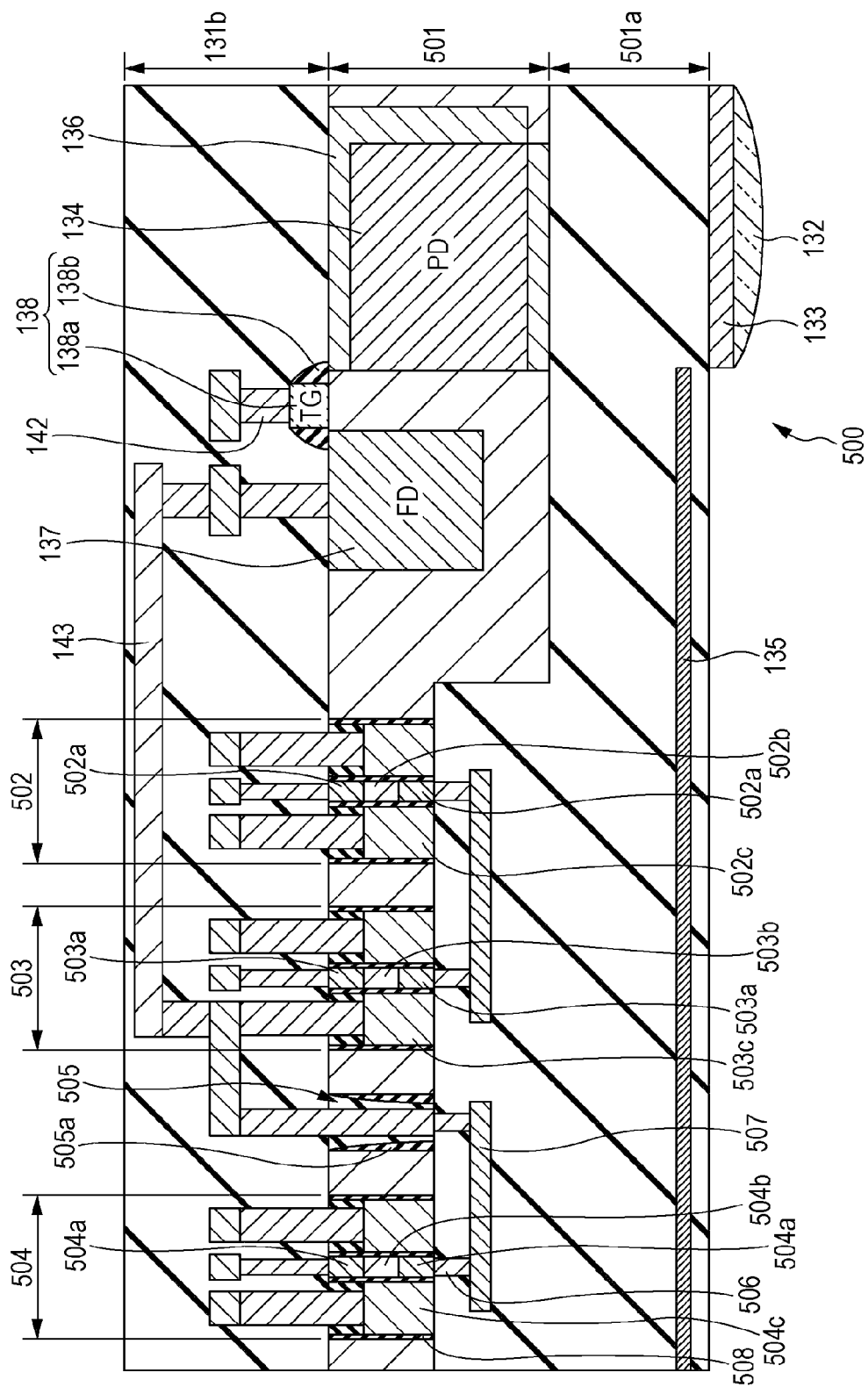
FIG. 51 is a cross-sectional view illustrating an example of a configuration of a pixel of a CMOS image sensor according to a fifth embodiment as the solid-state imaging device to which the present disclosure is applied.

FIG. 51 is a cross-sectional view illustrating an example of a configuration of a pixel of the CMOS image sensor according to the fifth embodiment as the solid-state imaging device to which the present disclosure is applied.

Among configurations illustrated in FIG. 51, the same configurations as those in FIG. 2 are denoted with the same reference signs. Repeated description is appropriately omitted.

A configuration of a pixel 500 of FIG. 51 differs from that of the pixel 130 of FIG. 2 in that a silicon substrate 501, a $SiO_2$ film 501a, a readout transistor 502, an amplification transistor 503, a reset transistor 504, a connection portion 505, a SiN film 505a, and a gate insulating film 508 are provided in place of the silicon substrate 131, the $SiO_2$ film 131a, the readout transistor 139, the amplification transistor 140, the reset transistor 141, the connection portion 144, the SiN film 144a, and the gate insulating film 145, and that a contact plug 506 and a wiring 507 are newly provided.

In the pixel 500, a thickness of the silicon substrate 501 is reduced so as to shorten channel lengths of the readout transistor 502, the amplification transistor 503, and the reset transistor 504.

Specifically, the silicon substrate 501 is formed so that a thickness of a region in which the readout transistor 502, the amplification transistor 503, the reset transistor 504, and the connection portion 505 are arranged is smaller than a region in which a photodiode 134, a charge-voltage conversion unit 137 and a transfer transistor 138 are arranged (a length in a direction perpendicular to the silicon substrate 501 is shorter). A $SiO_2$ film 501a is formed on a back surface of the silicon substrate 501 so that a back surface becomes flat.

The readout transistor 502, the amplification transistor 503, and the reset transistor 504 are formed in an order of proximity to the charge-voltage conversion unit 137 on the left side of the charge-voltage conversion unit 137 in FIG.

51. The readout transistor 502, the amplification transistor 503 and the reset transistor 504 are fully-depleted vertical MOSFETs.

Specifically, two source and drain regions 502a of the readout transistor 502 are formed on the surface side and the back surface side of the silicon substrate 501. Therefore, a channel region 502b interposed between the two source and drain regions 502a is formed in a direction perpendicular to the silicon substrate 501. A gate electrode 502c is formed to cover the channel region 502b.

Source and drain regions 503a, a channel region 503b and a gate electrode 503c of the amplification transistor 503, and source and drain regions 504a, a channel region 504b and a gate electrode 504c of the reset transistor 504 are similarly formed.

The gate electrode 503c of the amplification transistor 503 is connected to the charge-voltage conversion unit 137 via a contact plug 142 and a wiring 143. A power supply is connected to the source and drain region 503a on the surface side via the contact plug 142. The source and drain region 503a on the back surface side is connected to the source and drain region 502a on the back surface side of the readout transistor 502 via a contact plug 506 and a wiring 507 on the back surface side. The amplification transistor 503 amplifies a signal of a voltage input from the charge-voltage conversion unit 137 to the gate electrode 503c, and inputs the resultant signal as a pixel signal to the source and drain region 502a.

The gate electrode 502c of the readout transistor 502 is connected to the pixel driving line 116 via the contact plug 142. Further, the source and drain region 502a on the surface side is connected to the vertical signal line 117 of FIG. 1 via the contact plug 142. When a selection pulse is input to the gate electrode 502c via the pixel driving line 116 and the contact plug 142, the readout transistor 502 outputs a pixel signal input to the source and drain region 502a on the back surface side to the vertical signal line 117 via the source and drain region 502a on the surface side.

The reset transistor 504 is connected to the charge-voltage conversion unit 137 via the contact plug 142 and the wiring 143.

Specifically, the connection portion 505 is provided between the amplification transistor 503 and the reset transistor 504. Also, the charge-voltage conversion unit 137 is connected to the source and drain region 504a on the back surface side of the reset transistor 504 via the contact plug 142 inserted into the connection portion 505. A SiN film 505a is formed on the sidewall of the connection portion 505. Accordingly, it is possible to prevent conduction between the contact plug 142 and the connection portion 505.

The gate electrode 504c of the reset transistor 504 is connected to the pixel driving line 116 via the contact plug 142. Further, the source and drain region 504a on the surface side is connected to the power supply via the contact plug 142. When a control pulse is input to the gate electrode 504c via the pixel driving line 116 and the contact plug 142, the reset transistor 504 resets charges of the charge-voltage conversion unit 137.

A gate insulating film 508 is formed in sidewalls of the gate electrodes 502c to 504c.

Method of Manufacturing Pixel

FIGS. 52 to 59 are diagrams illustrating a method of manufacturing the pixel 500 of FIG. 51.

First, the operation described in FIGS. 3 to 24 is performed on the silicon substrate 131. Further, the connection portion 505 may be formed in place of the connection portion 144 by reducing the depth of the trench that is formed in FIG. 4.

Figure 52:
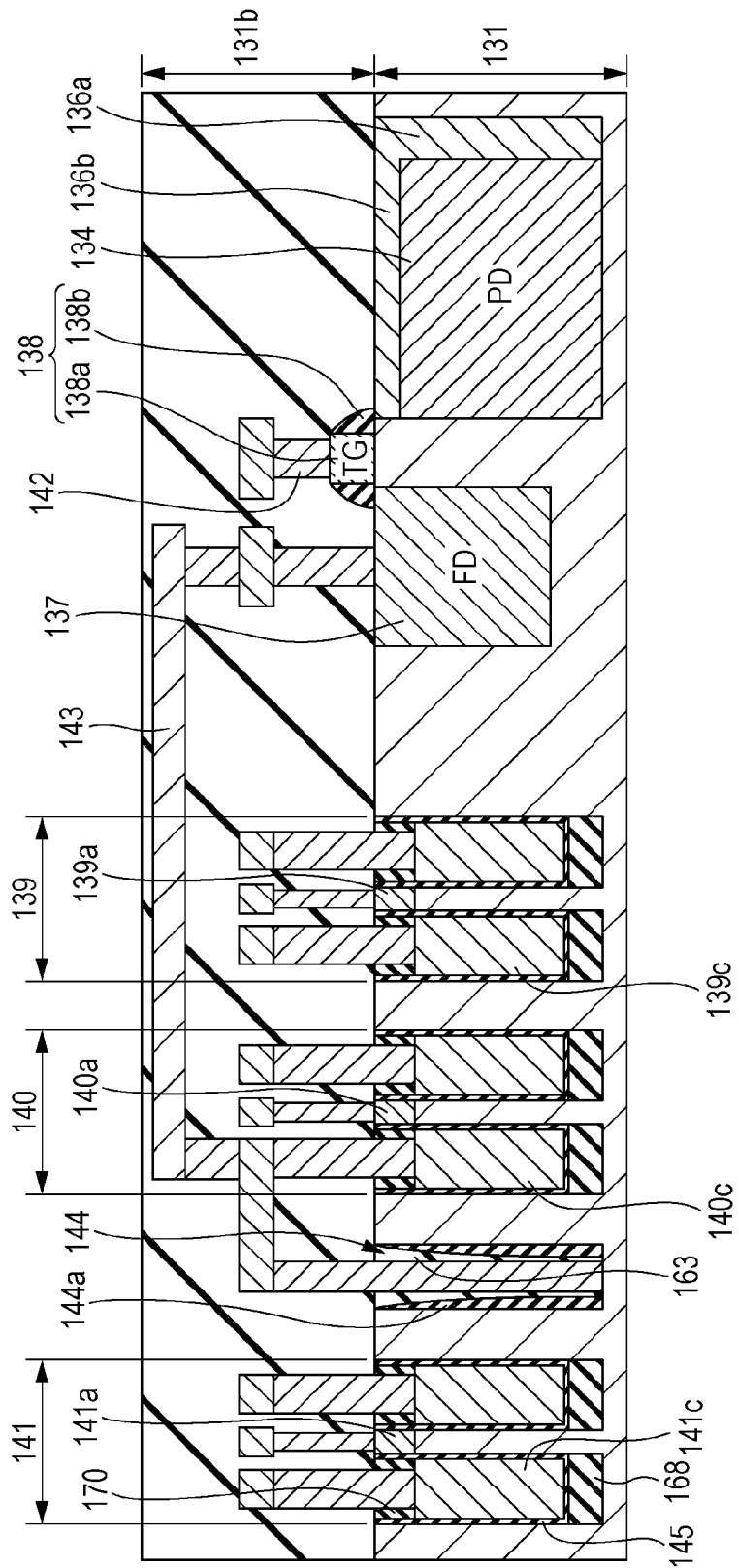
FIG. 52 is a diagram illustrating the method of manufacturing a pixel of FIG. 51.

After the operation of FIG. 24 is performed, the surface of the silicon substrate 131 is affixed to a support substrate (not illustrated) as illustrated in FIG. 52, and the back surface side of the silicon substrate 131 is polished.

Figure 53:
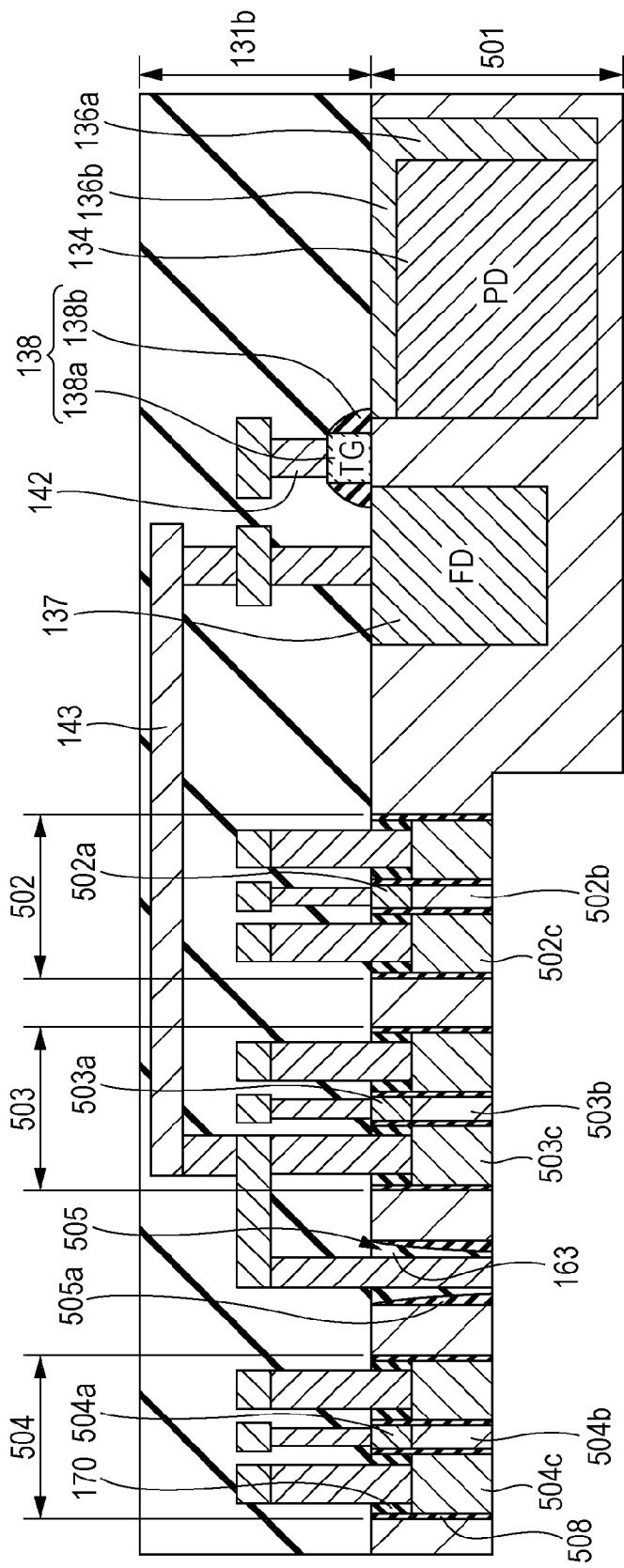
FIG. 53 is a diagram illustrating the method of manufacturing a pixel of FIG. 51.

Also, regions of the readout transistor 502, the amplification transistor 503, the reset transistor 504, and the connection portion 505 in the back surface of the silicon substrate 131 are covered with a resist as illustrated in FIG. 53, and etching by lithography is performed.

Accordingly, the silicon substrate 131 becomes the silicon substrate 501 in which a thickness of the region of the readout transistor 502, the amplification transistor 503, the reset transistor 504, and the connection portion 505 is smaller than that of a region of the photodiode 134, the charge-voltage conversion unit 137, and the transfer transistor 138. Further, the gate electrodes 139c to 141c become gate electrodes 502c to 504c, the SiN film 144a becomes a SiN film 505a, and the gate insulating film 145 becomes a gate insulating film 508. The source and drain regions 139a to 141a on the surface side become source and drain regions 502a to 504a.

Figure 54:
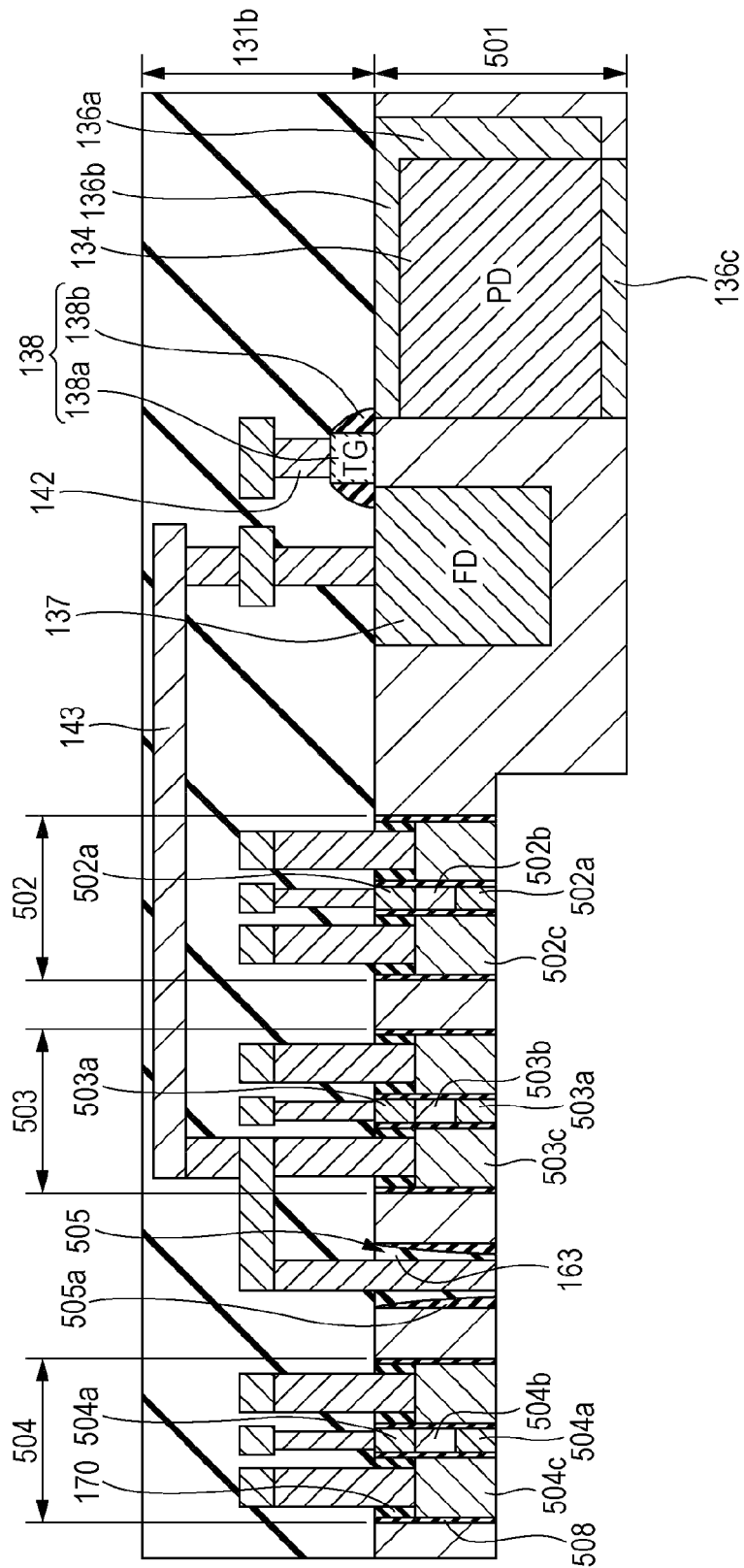
FIG. 54 is a diagram illustrating the method of manufacturing a pixel of FIG. 51.
Figure 55:
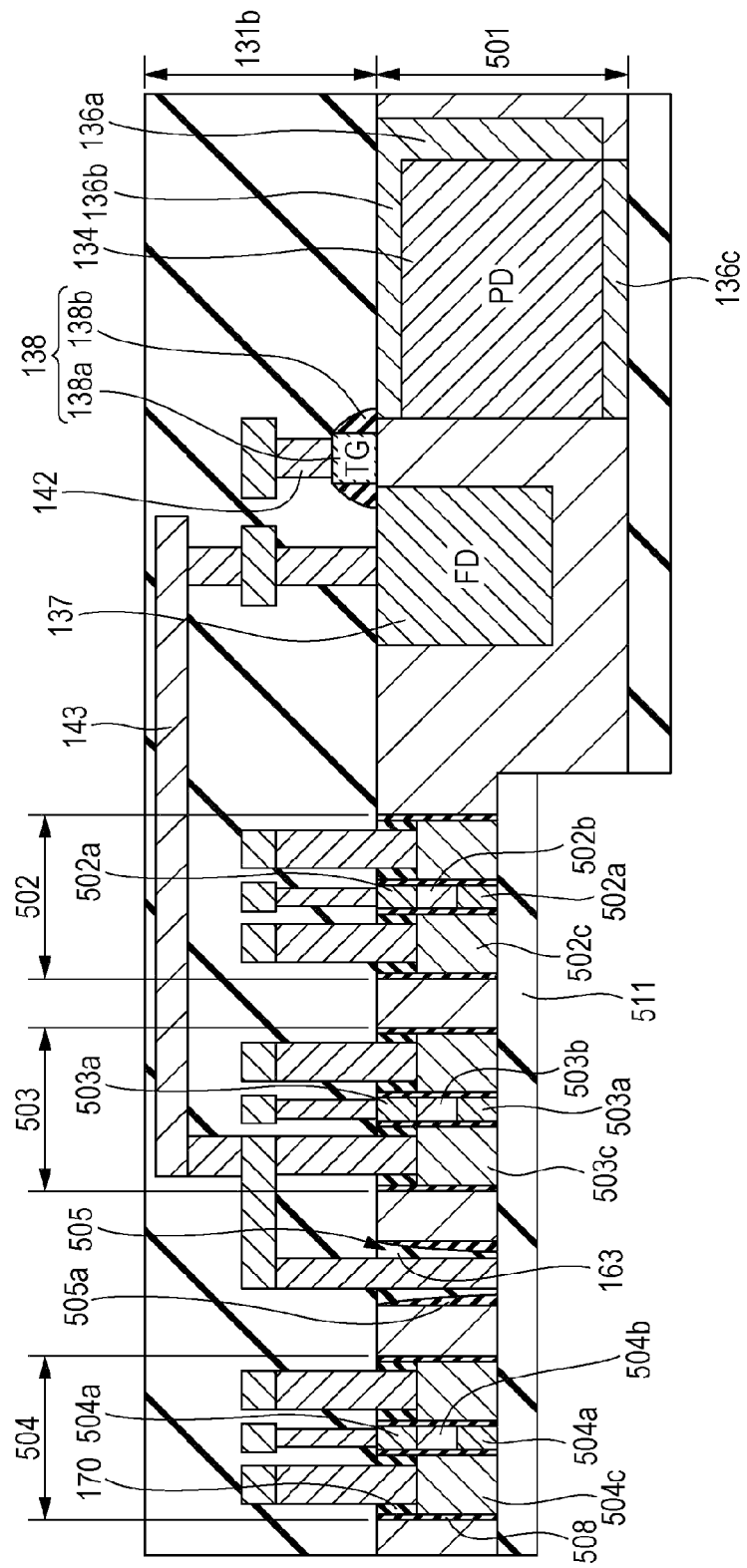
FIG. 55 is a diagram illustrating the method of manufacturing a pixel of FIG. 51.
Figure 56:
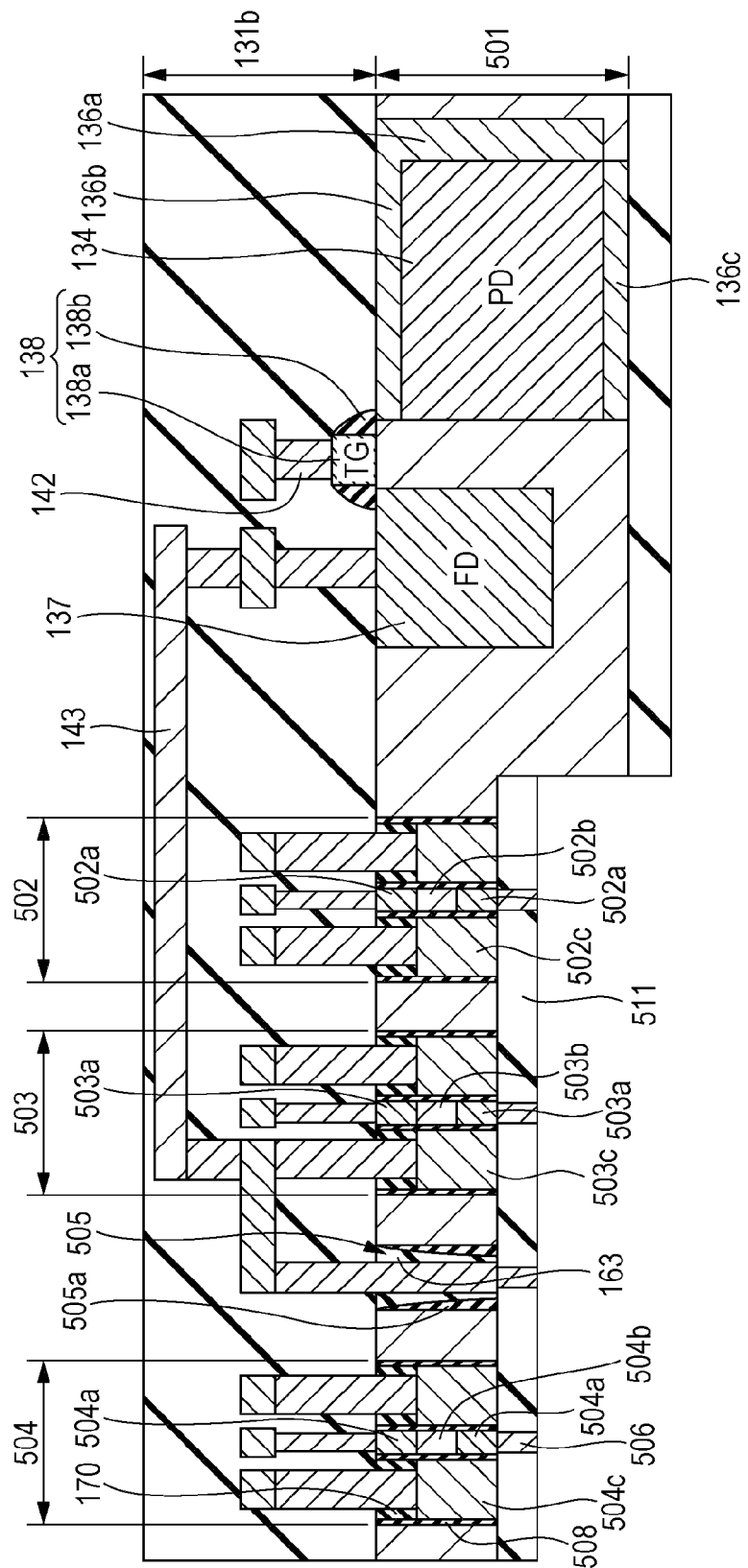
FIG. 56 is a diagram illustrating the method of manufacturing a pixel of FIG. 51.
Figure 57:
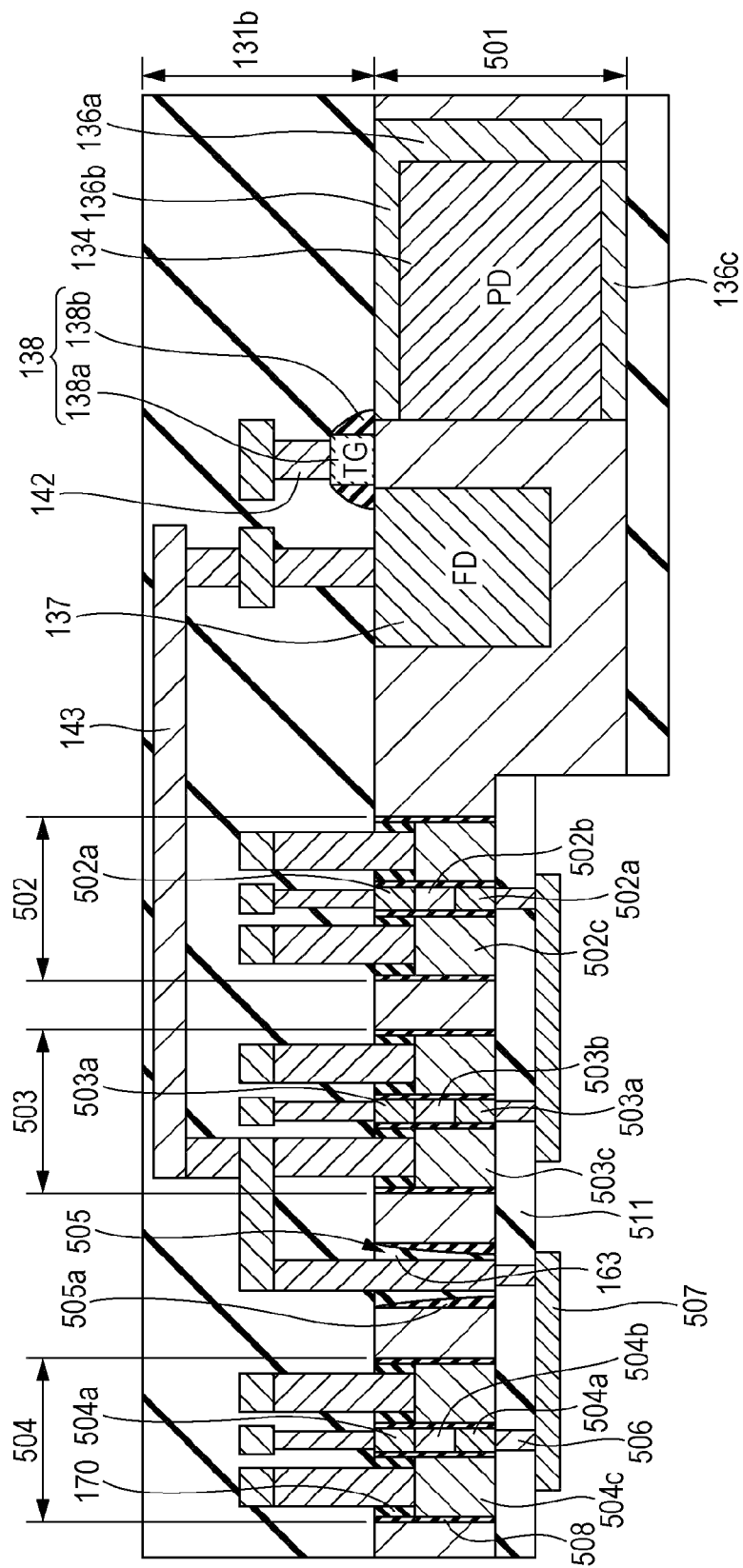
FIG. 57 is a diagram illustrating the method of manufacturing a pixel of FIG. 51.

Then, the source and drain regions 502a to 504a are formed on the back surface of the silicon substrate 501 similar to FIG. 26, as illustrated in FIG. 54. Further, a HAD 136c is formed similar to FIG. 26. Also, a SiO$_2$ film 511 is formed as an interlayer film on the back surface of the silicon substrate 501, as illustrated in FIG. 55. Then, contact plugs 506 are connected to the source and drain regions 502a to 504a on the back surface side of the silicon substrate 501 as illustrated in FIG. 56, and the contact plugs 506 are connected to each other by a wiring 507, as illustrated in FIG. 57.

Figure 58:
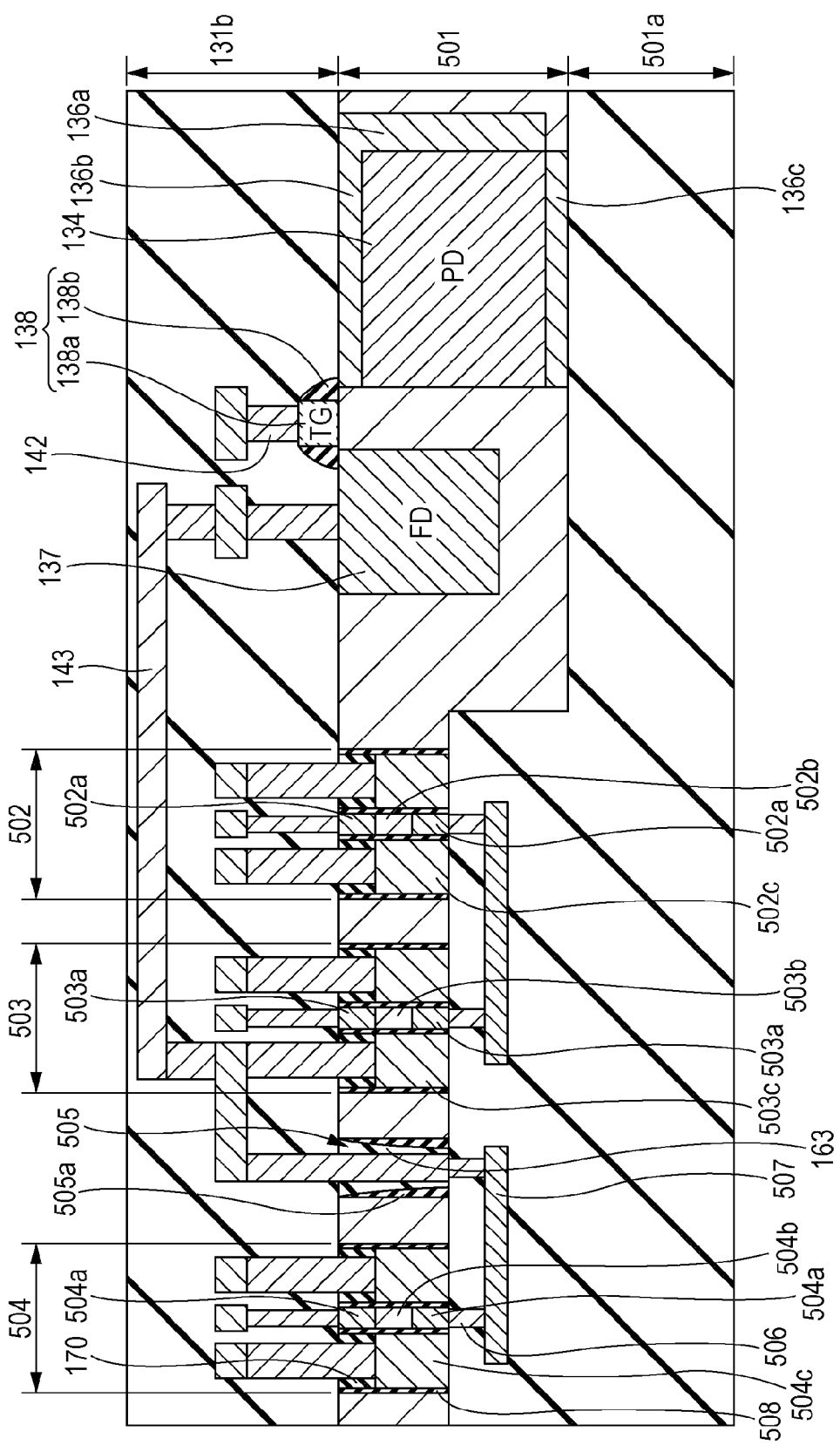
FIG. 58 is a diagram illustrating the method of manufacturing a pixel of FIG. 51.
Figure 59:
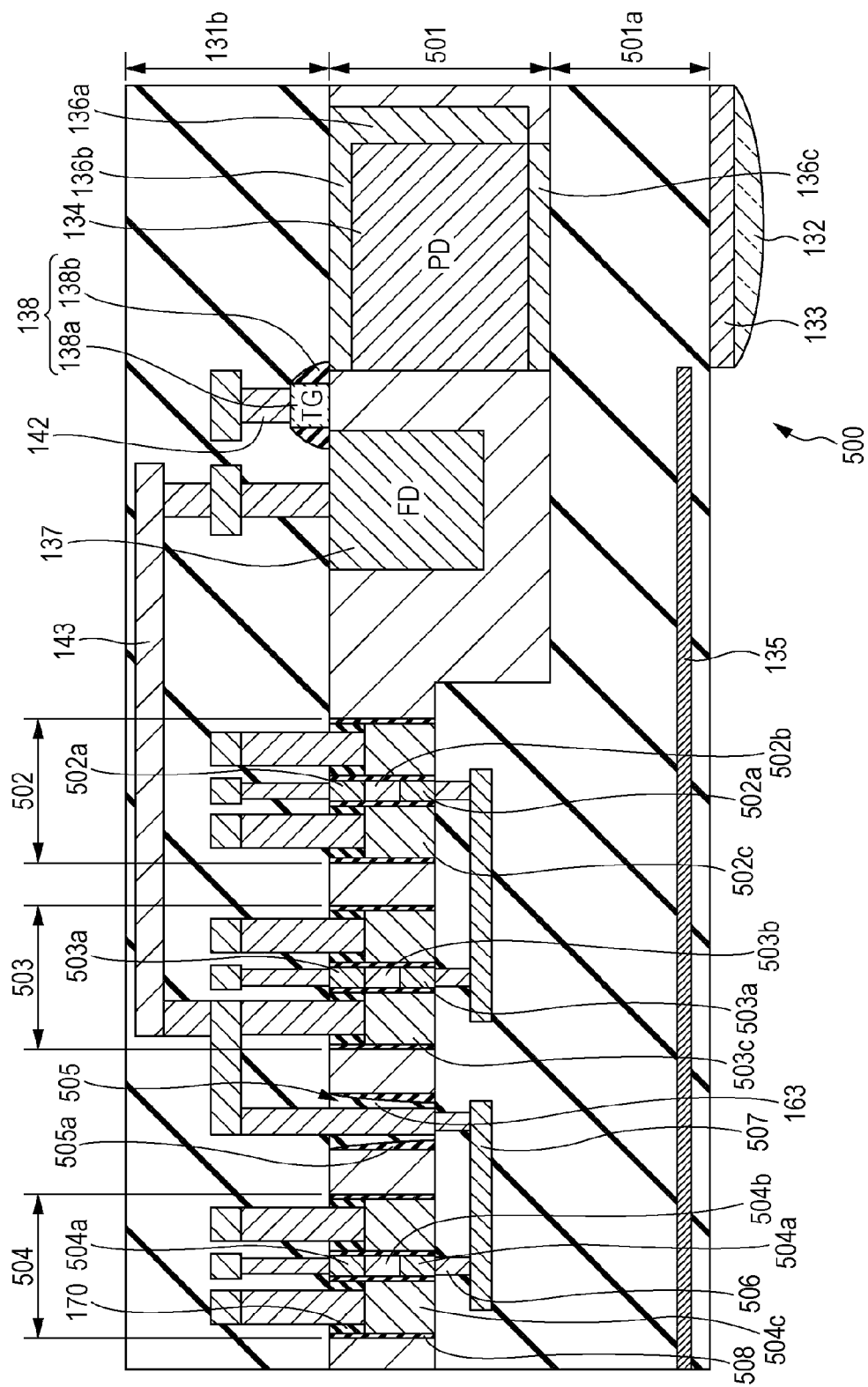
FIG. 59 is a diagram illustrating the method of manufacturing a pixel of FIG. 51.

Then, a SiO$_2$ film is formed on the outer side of the SiO$_2$ film 511 and thus a SiO$_2$ film 501a is formed, as illustrated in FIG. 58. Finally, a light shielding film 135, a color filter 133, and an on-chip lens 132 are formed using a normal method, as illustrated in FIG. 59. The manufacture of the pixel 500 is completed.

Sixth Embodiment

Example of configuration of pixel of solid-state imaging device according to sixth embodiment A configuration of a CMOS image sensor according to a sixth embodiment as the solid-state imaging device to which the present disclosure is applied is the same as that of the CMOS image sensor 100 of FIG. 1 except for a pixel. Therefore, hereinafter, only a configuration of the pixel will be described.

Figure 60:
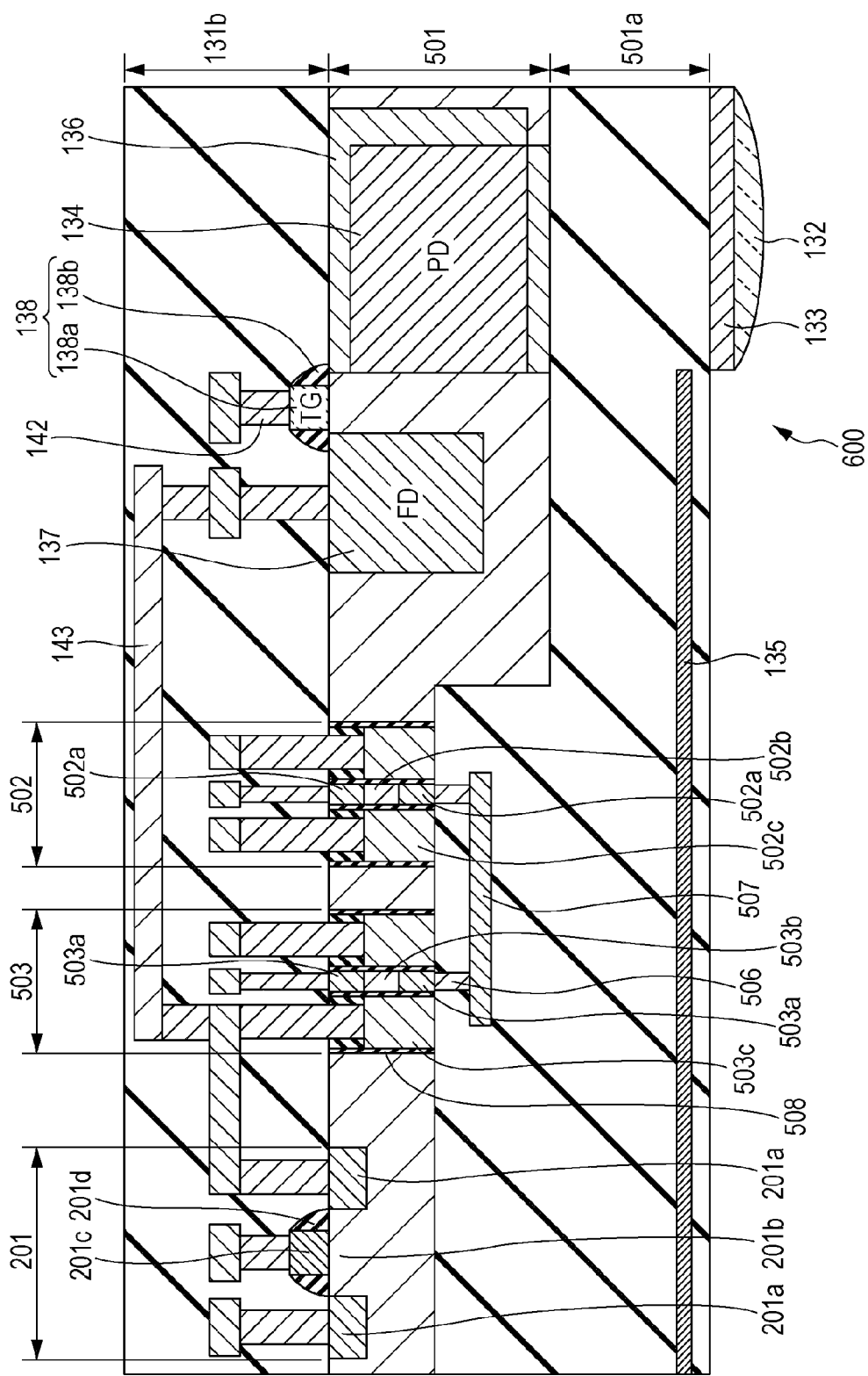
FIG. 60 is a cross-sectional view illustrating an example of a configuration of a pixel of a CMOS image sensor according to a sixth embodiment as the solid-state imaging device to which the present disclosure is applied.

FIG. 60 is a cross-sectional view illustrating an example of a configuration of a pixel of the CMOS image sensor according to the sixth embodiment as the solid-state imaging device to which the present disclosure is applied.

Among configurations illustrated in FIG. 60, the same configurations as those in FIG. 28 or 51 are denoted with the same reference signs. Repeated description is appropriately omitted.

A configuration of the pixel 600 of FIG. 60 differs from that of the pixel 500 of FIG. 51 in that a reset transistor 201 is provided in place of the reset transistor 504 and that the connection portion 505 is not provided. That is, in the pixel 600, channel lengths of a readout transistor and an amplification transistor are shortened, and a reset transistor includes a horizontal MOSFET.

Method of Manufacturing Pixel

FIGS. 61 to 68 are diagrams illustrating a method of manufacturing the pixel 600 of FIG. 60.

Figure 61:
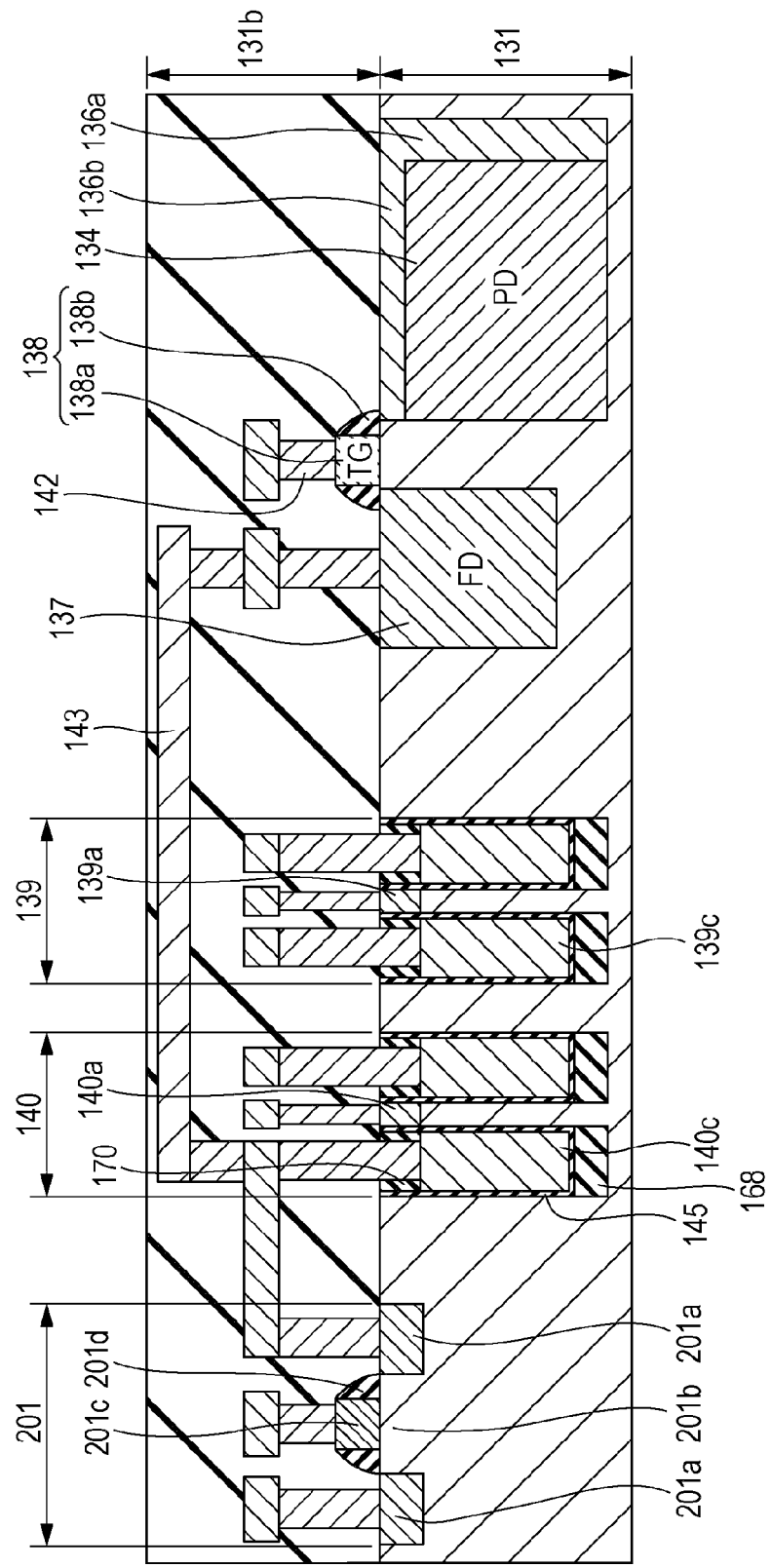
FIG. 61 is a diagram illustrating a method of manufacturing the pixel of FIG. 60.

First, the operation described in FIGS. 29 to 45 is performed on a silicon substrate 131. Then, a back surface side of the silicon substrate 131 is polished similar to the case of FIG. 46, as illustrated in FIG. 61.

Figure 62:
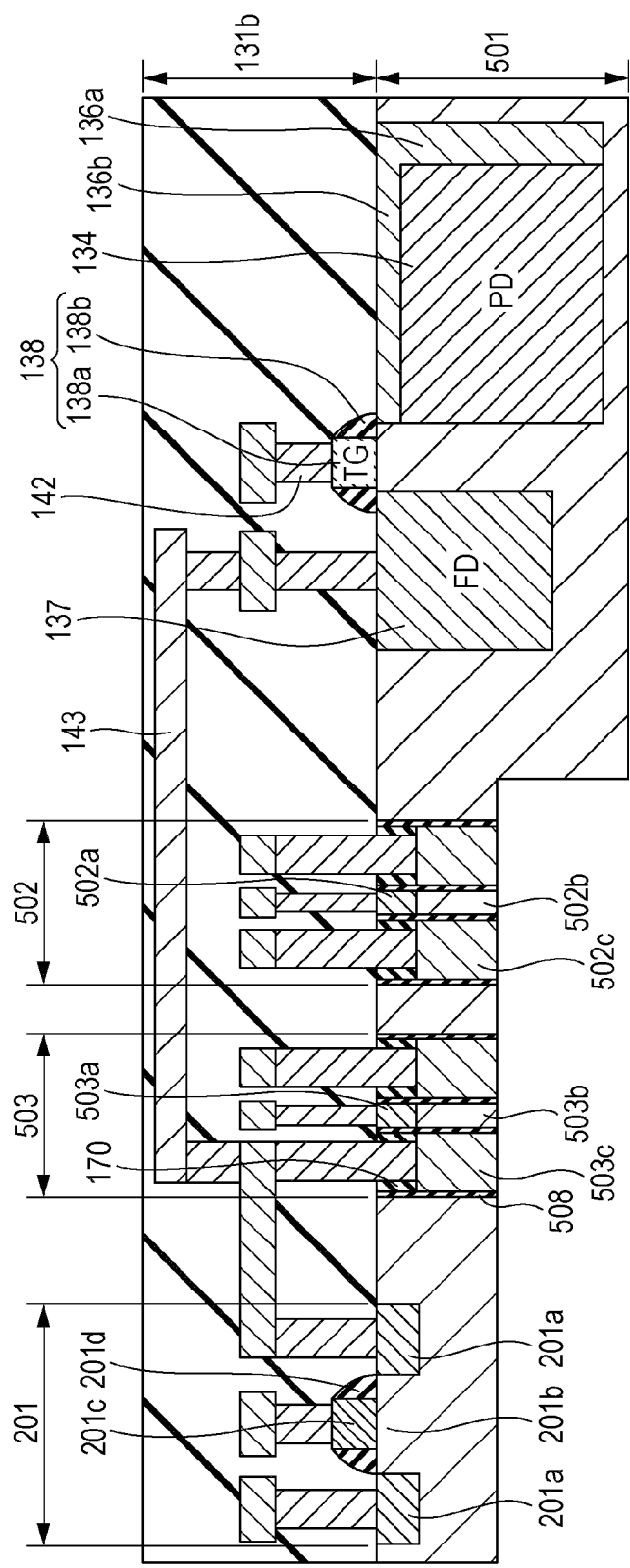
FIG. 62 is a diagram illustrating a method of manufacturing the pixel of FIG. 60.

Also, as illustrated in FIG. 62, regions of the readout transistor 502, the amplification transistor 503 and the reset transistor 201 of the back surface of the silicon substrate 131 are covered with a resist, and etching by lithography is performed.

Accordingly, the silicon substrate 131 is a silicon substrate 501 in which a thickness of the regions of the readout transistor 502, the amplification transistor 503 and the reset transistor 201 is smaller than that of the region in which a photodiode 134, a charge-voltage conversion unit 137, and a transfer transistor 138 are arranged. Further, the gate electrodes 139c and 140c become gate electrodes 502c and 503c, the SiN film 144a becomes a SiN film 505a, and the gate insulating film 145 becomes a gate insulating film 508. The source and drain regions 139a and 140a on the surface side become source and drain regions 502a and 503a.

Figure 63:
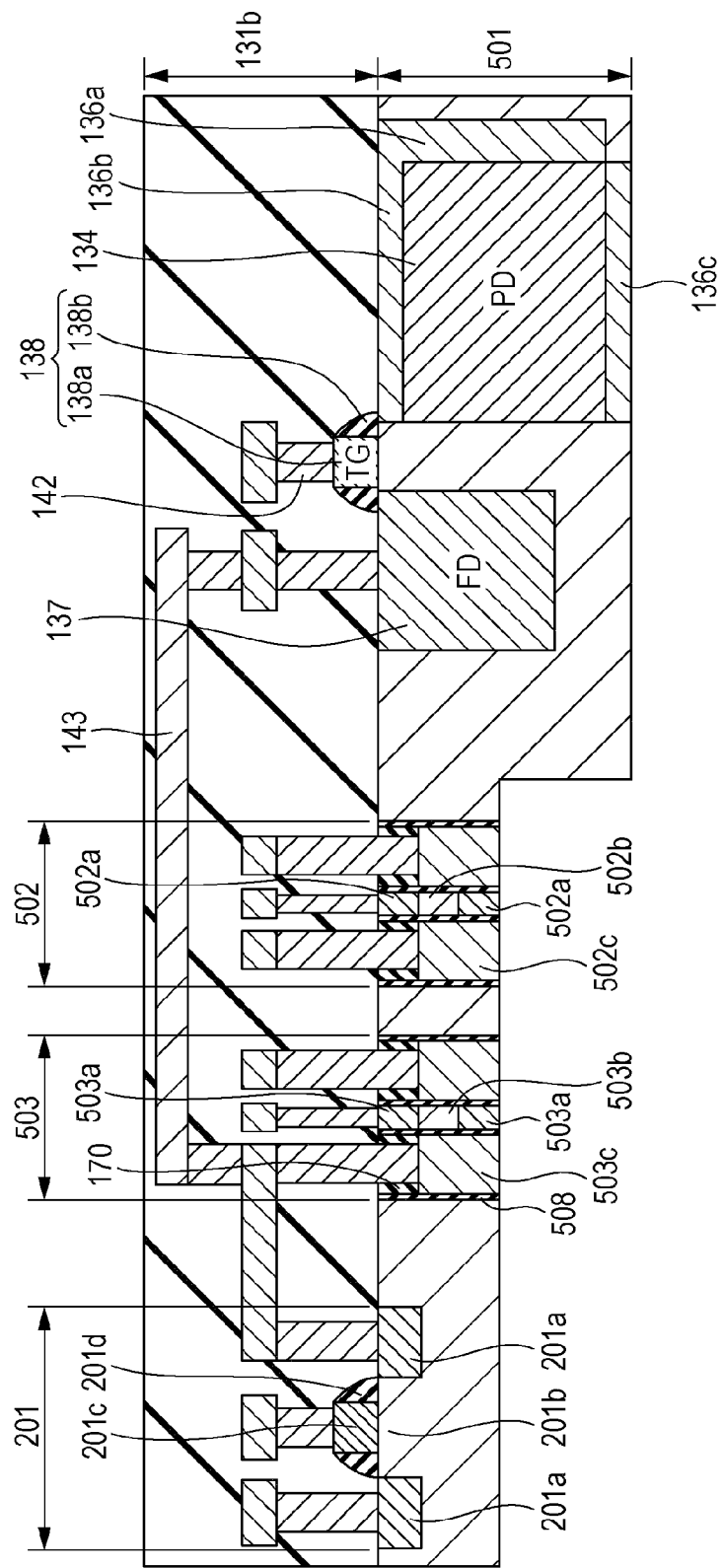
FIG. 63 is a diagram illustrating a method of manufacturing the pixel of FIG. 60.
Figure 64:
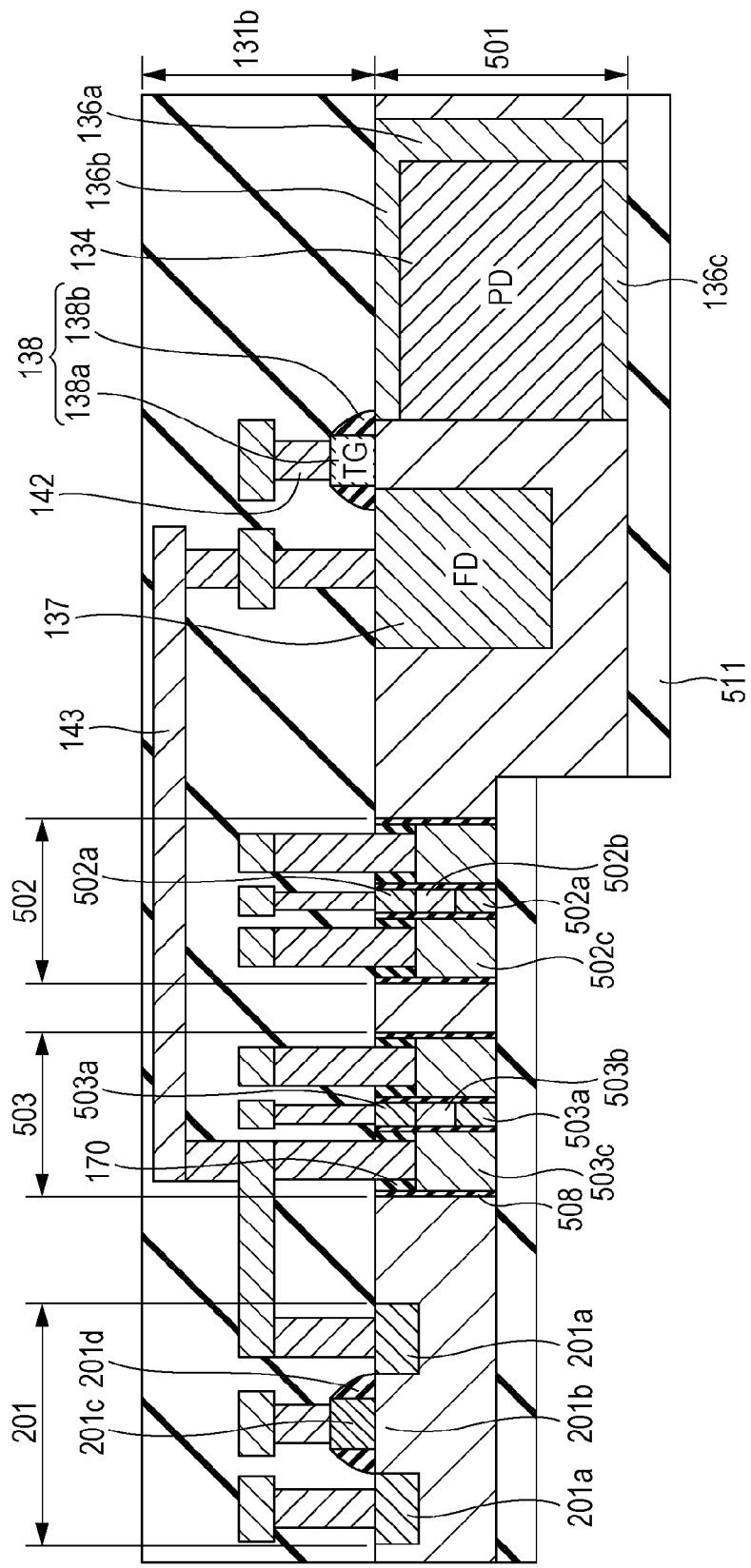
FIG. 64 is a diagram illustrating a method of manufacturing the pixel of FIG. 60.
Figure 65:
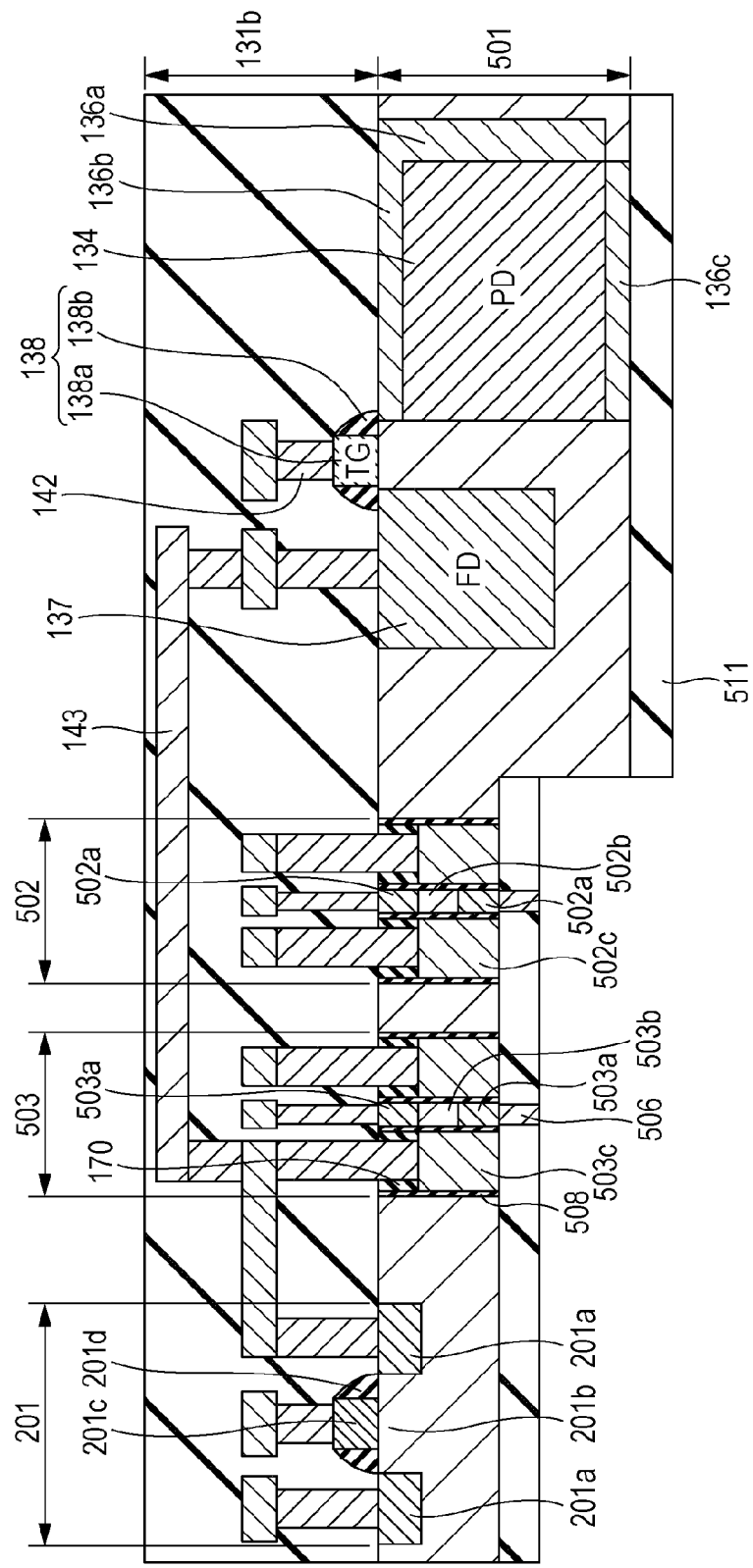
FIG. 65 is a diagram illustrating a method of manufacturing the pixel of FIG. 60.
Figure 66:
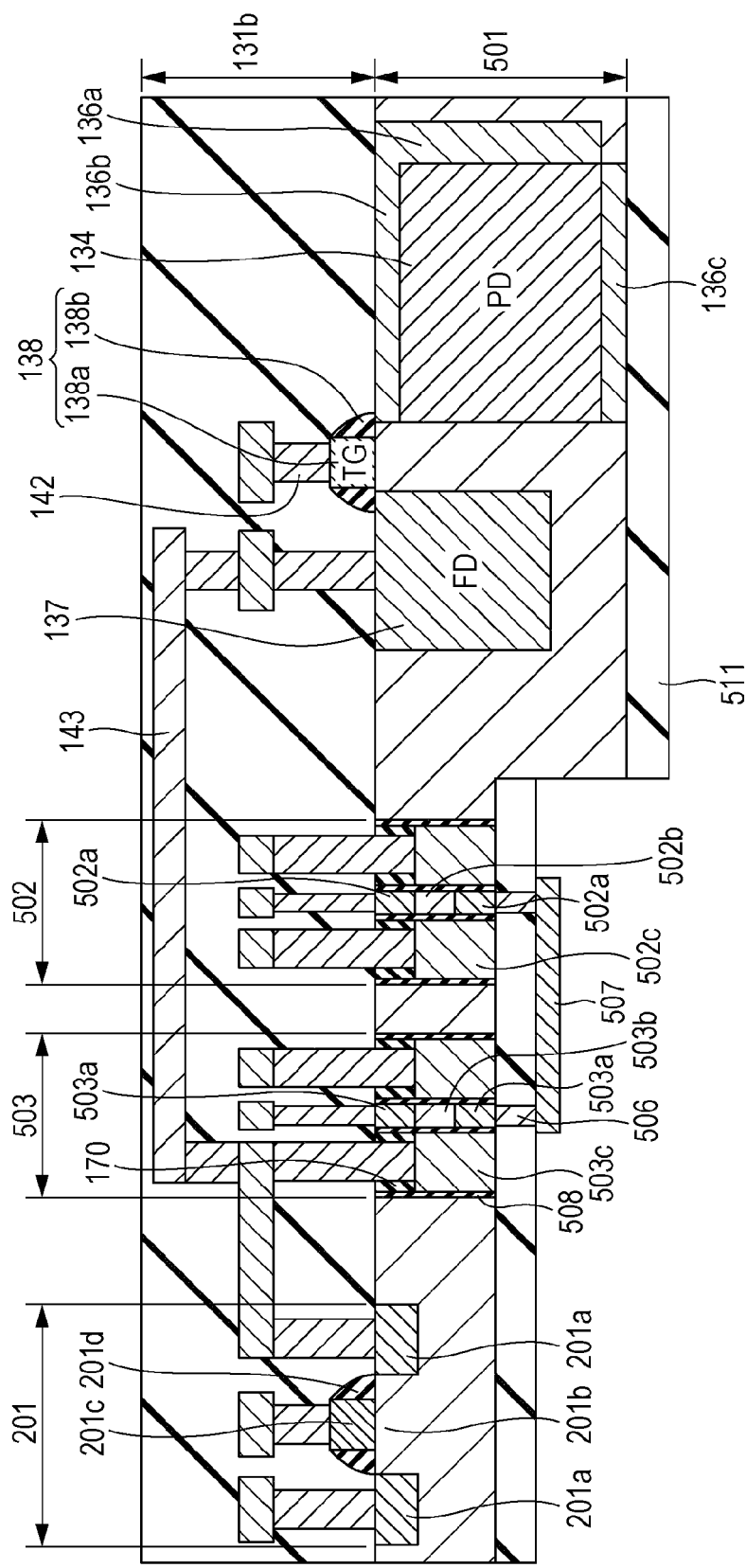
FIG. 66 is a diagram illustrating a method of manufacturing the pixel of FIG. 60.

Then, the source and drain regions 502a and 503a on the back surface side of the silicon substrate 501 are formed similar to the case of FIG. 26, as illustrated in FIG. 63. Further, a HAD 136c is formed similar to FIG. 26. Also, a SiO$_2$ film 511 is formed as an interlayer film on the back surface of the silicon substrate 501, as illustrated in FIG. 64. Then, contact plugs 506 are connected to the source and drain regions 502a and 503a on the back surface side of the silicon substrate 501 as illustrated in FIG. 65, and the contact plugs 506 are connected to each other by a wiring 507, as illustrated in FIG. 66.

Figure 67:
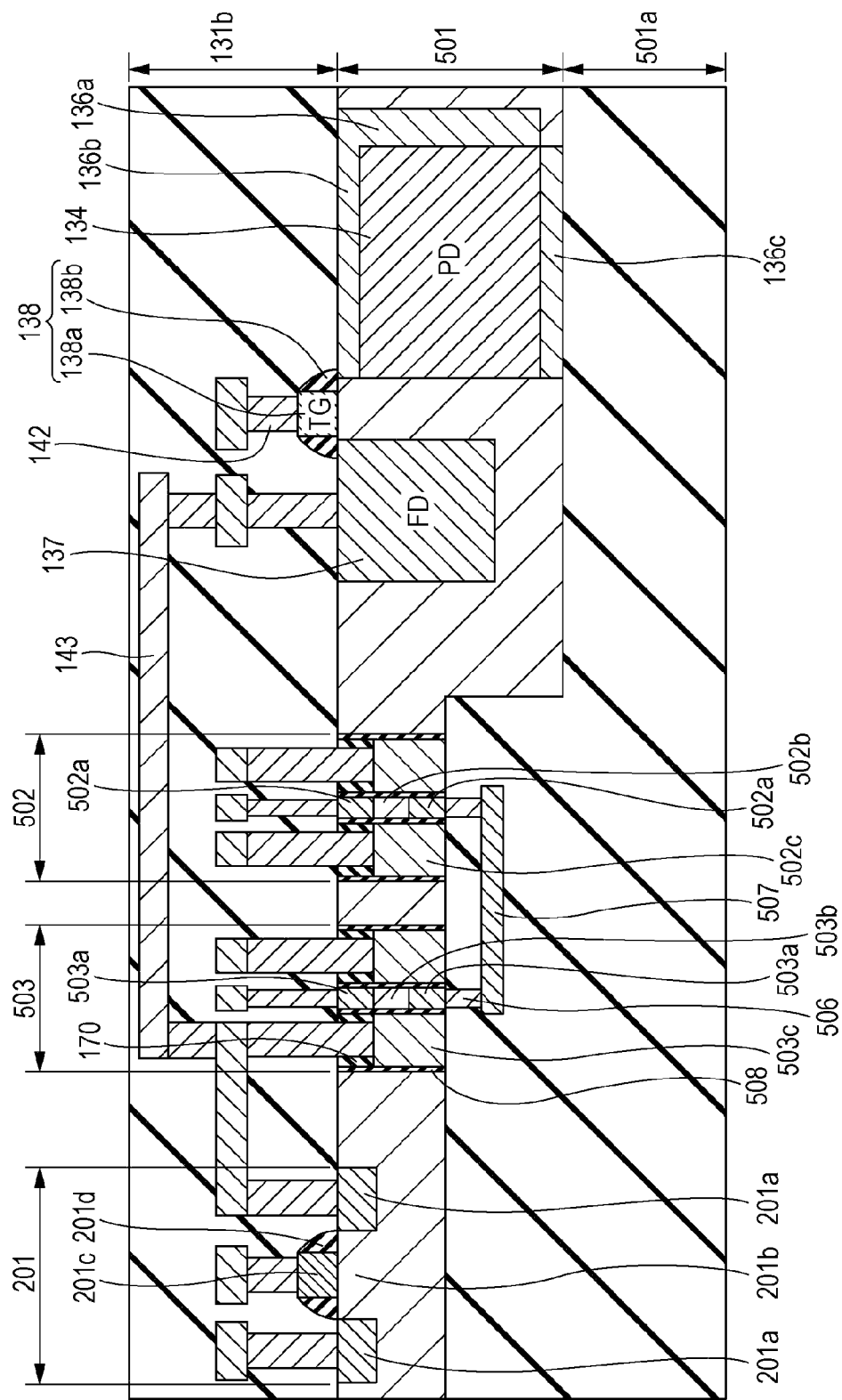
FIG. 67 is a diagram illustrating a method of manufacturing the pixel of FIG. 60.
Figure 68:
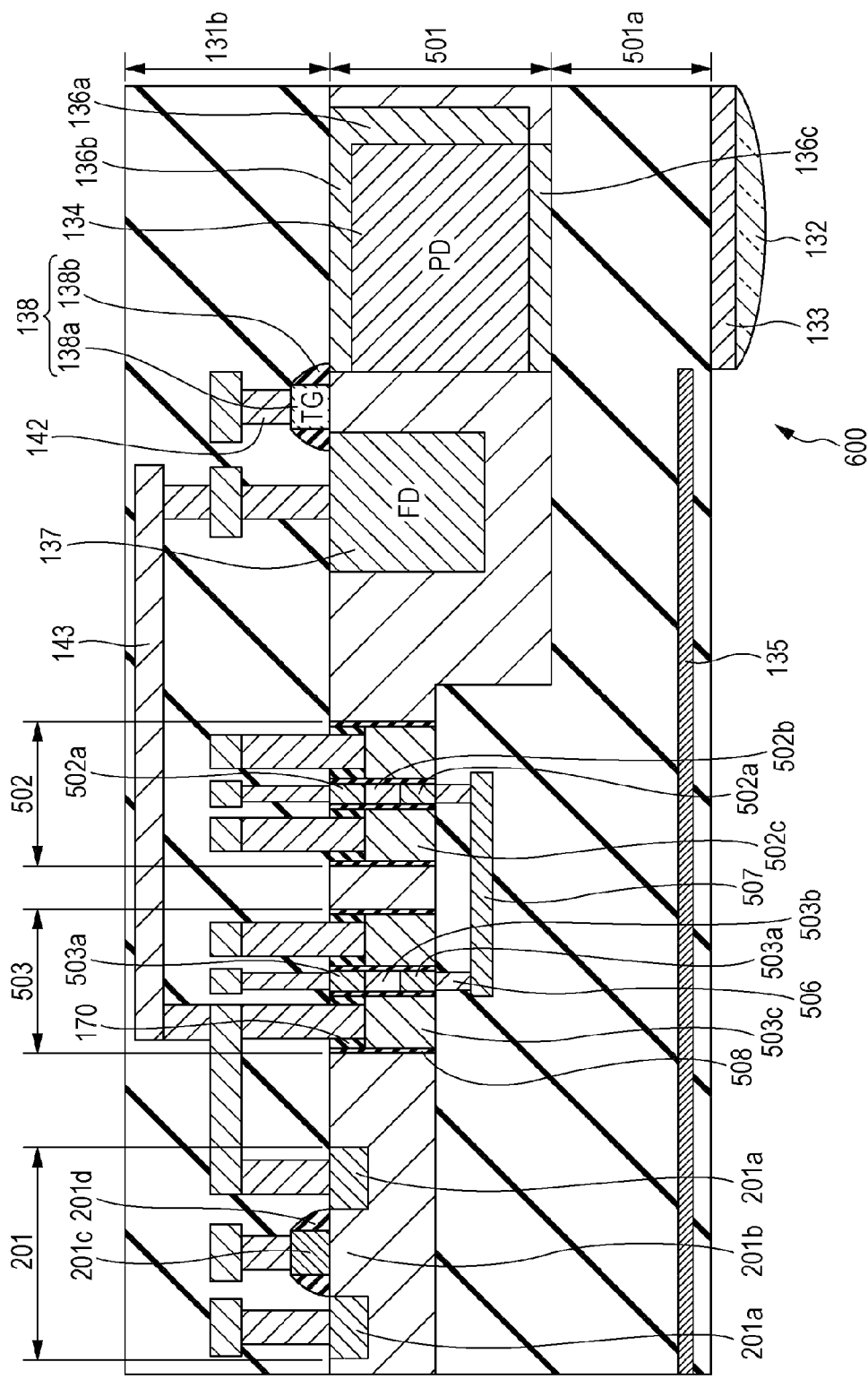
FIG. 68 is a diagram illustrating a method of manufacturing the pixel of FIG. 60.

Then, a SiO$_2$ film is formed on an outer side of the SiO$_2$ film 511 to form a SiO$_2$ film 501a, as illustrated in FIG. 67. Finally, a light shielding film 135, a color filter 133, and an on-chip lens 132 are formed using a normal method, as illustrated in FIG. 68. The manufacture of the pixel 600 is completed.

Seventh Embodiment

Example of configuration of pixel of solid-state imaging device according to seventh embodiment A configuration of a CMOS image sensor according to a seventh embodiment as the solid-state imaging device to which the present disclosure is applied is the same as that of the CMOS image sensor 100 of FIG. 1 except for a pixel. Therefore, hereinafter, only a configuration of the pixel will be described.

Figure 69:
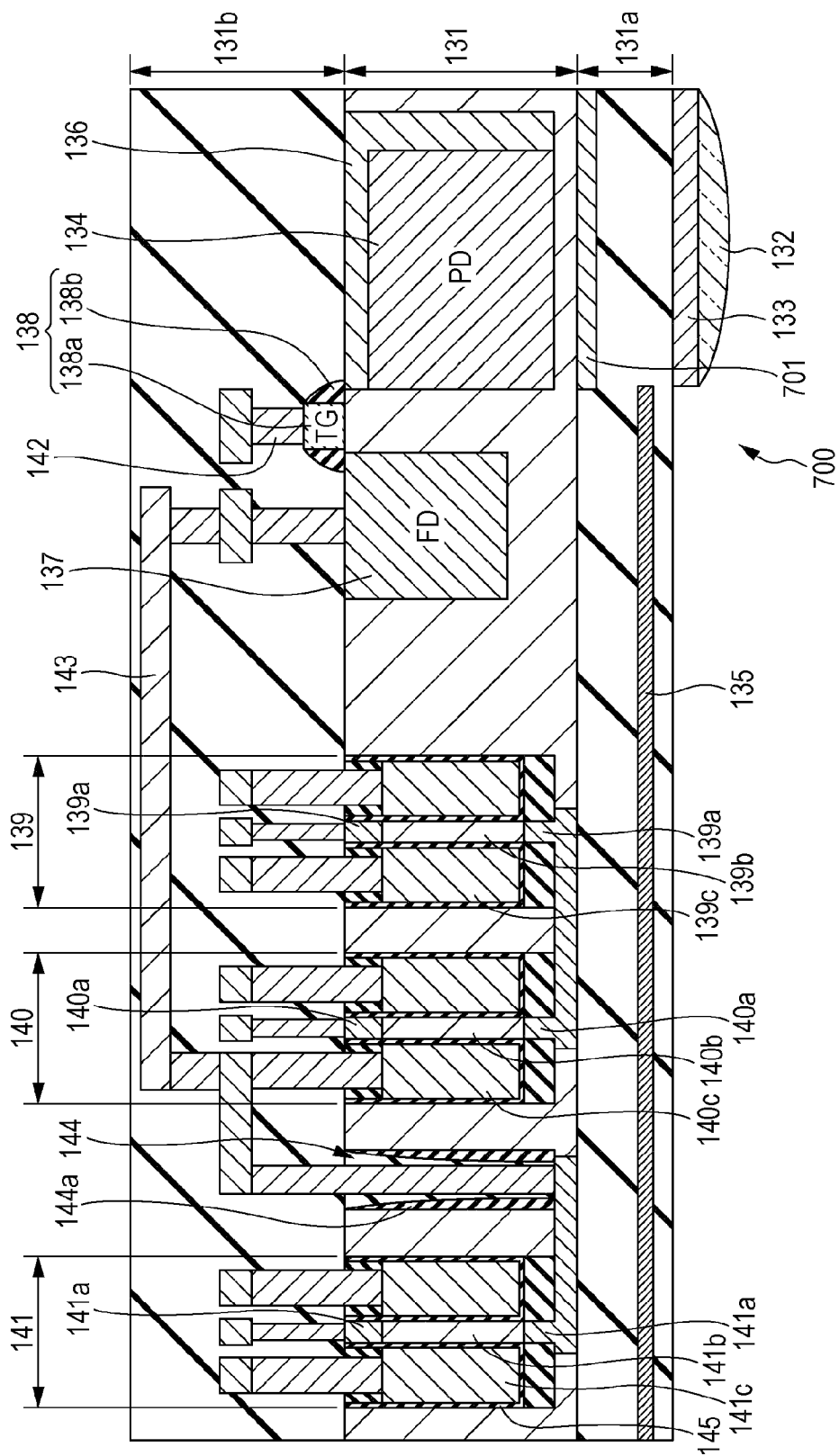
FIG. 69 is a cross-sectional view illustrating an example of a configuration of a pixel of a CMOS image sensor according to a seventh embodiment as the solid-state imaging device to which the present disclosure is applied.

FIG. 69 is a cross-sectional view illustrating an example of a configuration of a pixel of the CMOS image sensor according to the seventh embodiment as the solid-state imaging device to which the present disclosure is applied.

Among configurations illustrated in FIG. 69, the same configurations as those in FIG. 2 are denoted with the same reference signs. Repeated description is appropriately omitted.

A configuration of a pixel 700 of FIG. 69 differs from that of the pixel 130 of FIG. 2 in that a pinning film 701 is provided in place of the HAD 136c.

Eighth Embodiment

Example of Configuration of Pixel of Solid-State Imaging Device According to Eighth Embodiment A configuration of a CMOS image sensor according to an eighth embodiment as the solid-state imaging device to which the present disclosure is applied is the same as that of the CMOS image sensor 100 of FIG. 1 except for a pixel. Therefore, hereinafter, only a configuration of the pixel will be described.

Figure 70:
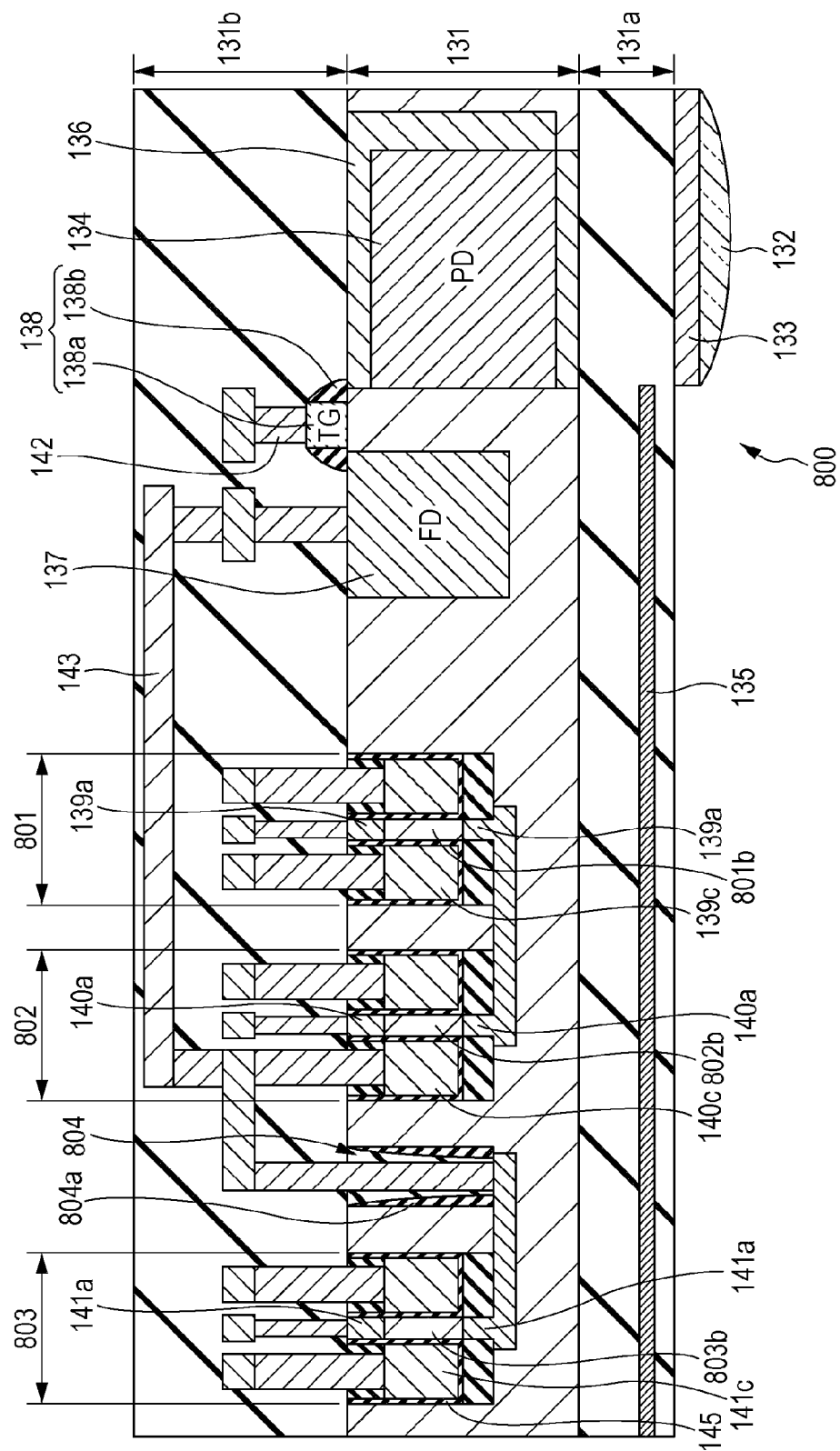
FIG. 70 is a cross-sectional view illustrating an example of a configuration of a pixel of a CMOS image sensor according to an eighth embodiment as the solid-state imaging device to which the present disclosure is applied.

FIG. 70 is a cross-sectional view illustrating an example of a configuration of a pixel of the CMOS image sensor according to the eighth embodiment as the solid-state imaging device to which the present disclosure is applied.

Among configurations illustrated in FIG. 70, the same configurations as those in FIG. 2 are denoted with the same reference signs. Repeated description is appropriately omitted.

A configuration of a pixel 800 of FIG. 70 differs from that of the pixel 130 of FIG. 2 in that a readout transistor 801, an amplification transistor 802, a reset transistor 803, and a connection portion 804 are provided in place of the readout transistor 139, the amplification transistor 140, the reset transistor 141, and the connection portion 144. In the pixel 800, a depth of the readout transistor 801, the amplification transistor 802 and the reset transistor 803 is reduced to shorten a channel length.

Specifically, a length in a direction perpendicular to the silicon substrate 131 of the readout transistor 801 is smaller than that of the readout transistor 139. Accordingly, lengths in the direction perpendicular to the silicon substrate 131 of a gate electrode 801c and a channel region 801b of the readout transistor 801 are smaller than those of the gate electrode 139c and the channel region 139b.

Similarly, lengths in the direction perpendicular to the silicon substrate 131 of a gate electrode 802c and a channel region 802b of the amplification transistor 802 are smaller than those of the gate electrode 140c and the channel region 140b. Lengths in the direction perpendicular to the silicon substrate 131 of a gate electrode 803c and a channel region 803b of the reset transistor 803 are smaller than those of the gate electrode 141c and the channel region 141b.

Further, the length in the direction perpendicular to the silicon substrate 131 of the connection portion 804 is smaller than that of the connection portion 144. A SiN film 804a is formed on a sidewall of the connection portion 804.

Example of Configuration of Ninth Embodiment

Example of Configuration of Electronic Apparatus According to Embodiment

Figure 71:
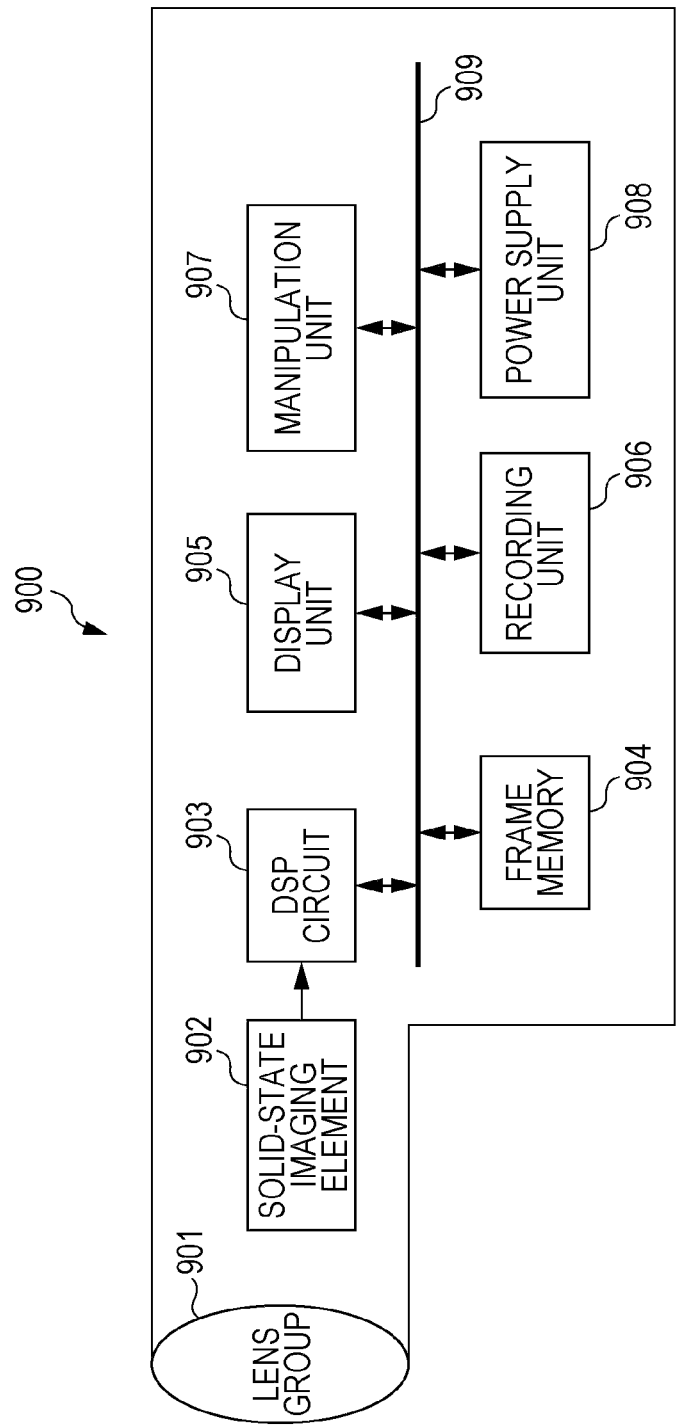
FIG. 71 is a block diagram illustrating an example of a configuration of an imaging device as an electronic apparatus to which the present disclosure is applied.

FIG. 71 is a block diagram illustrating an example of a configuration of an imaging device as an electronic apparatus to which the present disclosure is applied.

An imaging device 900 of FIG. 71 is, for example, a video camera or a digital still camera. The imaging device 900 includes a lens group 901, a solid-state imaging element 902, a DSP circuit 903, a frame memory 904, a display unit 905, a recording unit 906, a manipulation unit 907, and a power supply unit 908. The DSP circuit 903, the frame memory 904, the display unit 905, the recording unit 906, the manipulation unit 907, and the power supply unit 908 are connected to one another via a bus line 909.

The lens group 901 acquires incident light (image light) from a subject and forms an image on an imaging surface of the solid-state imaging element 902. The solid-state imaging element 902 includes the CMOS image sensor of the first to eighth embodiments described above. The solid-state imaging element 902 converts a light amount of incident light of the image formed on the imaging surface by the lens group 901 into an electrical signal by units of pixels, and supplies the electrical signal as a pixel signal to the DSP circuit 903.

The DSP circuit 903 performs predetermined image processing on the pixel signal supplied from the solid-state imaging element 902, and supplies the image signal after the image processing to the frame memory 904 in units of frames to temporarily store the image signal.

The display unit 905 includes, for example, a display device of a panel type such as a liquid crystal panel or an organic electro luminescence (EL) panel, and displays an image based on the pixel signal in units of frames temporarily stored in the frame memory 904.

The recording unit 906 includes, for example, a digital versatile disk (DVD) or a flash memory, and reads and records the pixel signal in units of frames stored temporarily in the frame memory 904.

The manipulation unit 907 issues manipulation instructions for various functions of the imaging device 900 under a manipulation by a user. The power supply unit 908 appropriately supplies a power supply voltage to the DSP circuit 903, the frame memory 904, the display unit 905, the recording unit 906, and the manipulation unit 907.

The electronic apparatus to which the present technology is applied may be an electronic apparatus in which a solid-state imaging device is used in an image acquisition unit (photoelectric conversion unit), and includes, for example, a portable terminal device having an imaging function or a copier in which a solid-state imaging device is used in an image reading unit, as well as the imaging device 900.

Further, the CMOS image sensor may have a form that is formed as a one-chip, and may have a module-shaped form having an imaging function packaged with an optical unit and the like.

Further, embodiments of the present disclosure are not limited to the embodiments described above and various changes can be made without departing from the gist of the present disclosure.

For example, in the second embodiment and the fourth to eighth embodiments, the capacitor 301 may be provided as in the third embodiment. Further, in the second embodiment, the third embodiment, and the fifth to the eighth embodiments, the CMOS circuit 401 may be provided as in the fourth embodiment.

Further, the transfer transistor 138 may include a fully-depleted vertical MOSFET. Further, at least one of the amplification transistor, the readout transistor, and the reset transistor may include a fully-depleted vertical MOSFET.

Further, the present disclosure can take the following configurations.

(1) A solid-state imaging device including two-dimensionally arranged pixels, each pixel including: a photoelectric conversion element configured to generate charges according to a light amount of incident light and accumulate the charges therein; and at least one of an amplification transistor configured to amplify a voltage corresponding to the charges accumulated in the photoelectric conversion element, a readout transistor configured to read a signal of the voltage amplified by the amplification transistor, and a reset transistor configured to reset the charges accumulated in the photoelectric conversion element, a channel region of each transistor being formed in a direction perpendicular to a substrate.

(2) The solid-state imaging device according to (1), wherein the transistor is a fully-depleted metal-oxide-semiconductor field-effect transistor (MOSFET).

(3) The solid-state imaging device according to (1) or (2), wherein the channel region is formed in a cylindrical shape, and a gate electrode of the transistor is formed in a donut-cylindrical shape that covers the channel region.

(4) The solid-state imaging device according to any one of (1) to (3), wherein the photoelectric conversion element is formed in the substrate, and a length of the substrate in which the channel region is formed in a direction perpendicular to the substrate is smaller than that of the substrate in which the photoelectric conversion element is formed in a direction perpendicular to the substrate.

(5) The solid-state imaging device according to any one of (1) to (4), wherein a hole accumulation diode (HAD) is formed on a surface of the photoelectric conversion element.

(6) The solid-state imaging device according to any one of (1) to (5), wherein the incident light is incident from a back surface of the substrate.

(7) The solid-state imaging device according to any one of (1) to (6), wherein the pixel further includes a capacitive element.

(8) The solid-state imaging device according to any one of (1) to (7), further including: a circuit including a transistor of which the channel region is formed in a direction perpendicular to the substrate.

(9) A method of manufacturing a solid-state imaging device, the method including forming two-dimensionally arranged pixels, each pixel including: a photoelectric conversion element configured to generate charges according to a light amount of incident light and accumulate the charges therein; and at least one of an amplification transistor configured to amplify a voltage corresponding to the charges accumulated in the photoelectric conversion element, a readout transistor configured to read a signal of the voltage amplified by the amplification transistor, and a reset transistor configured to reset the charges accumulated in the photoelectric conversion element, a channel region of each transistor being formed in a direction perpendicular to a substrate.

(10) The method of manufacturing a solid-state imaging device according to (9), further including: forming a gate electrode of the transistor by forming a trench in a donut-cylindrical shape in the substrate and burying a metal in the trench; and forming the channel region in a cylindrical shape by forming source and drain regions of the transistor in a surface and a back surface of the cylinder inside the donut cylinder.

(11) The method of manufacturing a solid-state imaging device according to (10), further including: forming the gate electrode by forming a film inside the trench and burying the metal on the film.

(12) An electronic apparatus including two-dimensionally arranged pixels, each pixel includes: a photoelectric conversion element configured to generate charges according to a light amount of incident light and accumulate the charges therein; and at least one of an amplification transistor configured to amplify a voltage corresponding to the charges accumulated in the photoelectric conversion element, a readout transistor configured to read a signal of the voltage amplified by the amplification transistor, and a reset transistor configured to reset the charges accumulated in the photoelectric conversion element, a channel region of each transistor being formed in a direction perpendicular to a substrate.

(13) The electronic apparatus according to (12), wherein the transistor is a fully-depleted metal-oxide-semiconductor field-effect transistor (MOSFET).

(14) The electronic apparatus according to (12) or (13), wherein the channel region is formed in a cylindrical shape, and a gate electrode of the transistor is formed in a donut-cylindrical shape that covers the channel region.

(15) The electronic apparatus according to any one of (12) to (14), wherein the photoelectric conversion element is formed in the substrate, and a length of the substrate in which the channel region is formed in a direction perpendicular to the substrate is smaller than that of the substrate in which the photoelectric conversion element is formed in a direction perpendicular to the substrate.

(16) The electronic apparatus according to any one of (12) to (15), wherein a hole accumulation diode (HAD) is formed on a surface of the photoelectric conversion element.

(17) The electronic apparatus according to any one of (12) to (16), wherein the incident light is incident from a back surface of the substrate.

(18) The electronic apparatus according to any one of (12) to (17), wherein the pixel further includes a capacitive element.

(19) The electronic apparatus according to any one of (12) to (18), further including: a circuit including a transistor of which the channel region is formed in a direction perpendicular to the substrate.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising two-dimensionally arranged pixels, each pixel including:
   a photoelectric conversion element configured to generate charges according to an amount of incident light and accumulate the charges therein; and
   at least one of an amplification transistor configured to amplify a voltage corresponding to the charges accumulated in the photoelectric conversion element, a readout transistor configured to read a signal of the voltage amplified by the amplification transistor, and a reset transistor configured to reset the charges accumulated in the photoelectric conversion element,
   wherein,
      a channel region of each transistor is located between source and drain regions in a direction perpendicular to a substrate such that the source and drain regions form top and bottom surfaces of the channel region,
      side portions of the source region are located between a first film, and
      side portions of the drain region are located between a second film that is different from the first film.

2. The imaging device according to claim 1, wherein at least one of the amplification transistor, readout transistor, or reset transistor is a fully-depleted metal-oxide-semiconductor field-effect transistor (MOSFET).

3. The imaging device according to claim 1, wherein the channel region is formed in a cylindrical shape, and
   a gate electrode of the transistor is formed in a donut-cylindrical shape that covers the channel region.

4. The imaging device according to claim 1, wherein the photoelectric conversion element is formed in the substrate, and
   a length of the substrate in which the channel region is formed in a direction perpendicular to the substrate is smaller than that of the substrate in which the photoelectric conversion element is formed in a direction perpendicular to the substrate.

5. The imaging device according to claim 1, wherein a hole accumulation diode (HAD) is formed on a surface of the photoelectric conversion element.

6. The imaging device according to claim 1, wherein the incident light is incident from a back surface of the substrate.

7. The imaging device according to claim 1, wherein the pixel further includes a capacitive element.

8. The imaging device according to claim 1, further comprising:
   a circuit including a transistor of which the channel region is formed in a direction perpendicular to the substrate.

9. A method of manufacturing a an imaging device, the method comprising forming two-dimensionally arranged pixels, each pixel including:
   a photoelectric conversion element configured to generate charges according to an amount of incident light and accumulate the charges therein; and
   at least one of an amplification transistor configured to amplify a voltage corresponding to the charges accumulated in the photoelectric conversion element, a readout transistor configured to read a signal of the voltage amplified by the amplification transistor, and a reset transistor configured to reset the charges accumulated in the photoelectric conversion element, wherein a channel region of each transistor is formed between source and drain regions in a direction perpendicular to a substrate such that the source and drain regions form top and bottom surfaces of the channel region, wherein side portions of the source region are located between a first film, and wherein side portions of the drain region are located between a second film that is different from the first film.

10. The method of manufacturing the imaging device according to claim 9, further comprising:
    forming a gate electrode of the at least one of the amplification transistor, readout transistor, and reset transistor by forming a trench in a donut-cylindrical shape in the substrate and burying a metal in the trench; and
    forming the channel region in a cylindrical shape by forming source and drain regions of the transistor in a surface and a back surface of the cylinder inside the donut cylinder.

11. The method of manufacturing a solid-state imaging device according to claim 10, further comprising:
    forming the gate electrode by forming a film inside the trench and burying the metal on the film.

12. An electronic apparatus comprising two-dimensionally arranged pixels, each pixel including:
    a photoelectric conversion element configured to generate charges according to an amount of incident light and accumulate the charges therein; and
    at least one of an amplification transistor configured to amplify a voltage corresponding to the charges accumulated in the photoelectric conversion element, a readout transistor configured to read a signal of the voltage amplified by the amplification transistor, and a reset transistor configured to reset the charges accumulated in the photoelectric conversion element, wherein a channel region of each transistor is located between source and drain regions in a direction perpendicular to a substrate such that the source and drain regions form top and bottom surfaces of the channel region, wherein side portions of the source region are located between a first film, and wherein side portions of the drain region are located between a second film that is different from the first film.

13. The electronic apparatus according to claim 12, wherein at least one of the amplification transistor, readout transistor, or reset transistor is a fully-depleted metal-oxide-semiconductor field-effect transistor (MOSFET).

14. The electronic apparatus according to claim 12, wherein the channel region is formed in a cylindrical shape, and a gate electrode of the transistor is formed in a donut-cylindrical shape that covers the channel region.

15. The electronic apparatus according to claim 12, wherein the photoelectric conversion element is formed in the substrate, and a length of the substrate in which the channel region is formed in a direction perpendicular to the substrate is smaller than that of the substrate in which the photoelectric conversion element is formed in a direction perpendicular to the substrate.

16. The electronic apparatus according to claim 12, wherein a hole accumulation diode (HAD) is formed on a surface of the photoelectric conversion element.

17. The electronic apparatus according to claim 12, wherein the incident light is incident from a back surface of the substrate.

18. The electronic apparatus according to claim 12, wherein the pixel further includes a capacitive element.

19. The electronic apparatus according to claim 12, further comprising:

a circuit including a transistor of which the channel region is formed in a direction perpendicular to the substrate.

* * * * *